US008686359B2

(12) United States Patent
Zewail

(10) Patent No.: US 8,686,359 B2
(45) Date of Patent: Apr. 1, 2014

(54) CHARACTERIZATION OF NANOSCALE STRUCTURES USING AN ULTRAFAST ELECTRON MICROSCOPE

(71) Applicant: California Institute of Technology, Pasadena, CA (US)

(72) Inventor: Ahmed H. Zewail, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/864,113

(22) Filed: Apr. 16, 2013

(65) Prior Publication Data
US 2013/0234023 A1 Sep. 12, 2013

Related U.S. Application Data

(63) Continuation of application No. 13/565,678, filed on Aug. 2, 2012, now Pat. No. 8,440,970, which is a continuation of application No. 12/575,312, filed on Oct. 7, 2009, now Pat. No. 8,247,769.

(60) Provisional application No. 61/195,639, filed on Oct. 9, 2008, provisional application No. 61/236,745, filed on Aug. 25, 2009, provisional application No. 61/240,946, filed on Sep. 9, 2009.

(51) Int. Cl.
G01N 23/00 (2006.01)
G21K 7/00 (2006.01)
(52) U.S. Cl.
USPC ........... 250/307; 250/306; 250/309; 250/310; 250/311
(58) Field of Classification Search
USPC .................. 250/306, 307, 309–311
See application file for complete search history.

(56) References Cited

U.S. PATENT DOCUMENTS

| 7,154,091 | B2 | 12/2006 | Zewail et al. | |
| 8,203,120 | B2* | 6/2012 | Zewail | 250/310 |
| 8,247,769 | B2* | 8/2012 | Zewail | 250/311 |
| 8,440,970 | B2* | 5/2013 | Zewail | 250/307 |
| 2008/0017796 | A1 | 1/2008 | Zewail et al. | |
| 2009/0236521 | A1 | 9/2009 | Zewail et al. | |
| 2010/0108882 | A1 | 5/2010 | Zewail | |
| 2010/0108883 | A1* | 5/2010 | Zewail | 250/307 |

FOREIGN PATENT DOCUMENTS

JP 2000/180391 A 6/2000

OTHER PUBLICATIONS

International Search Report and Written Opinion of PCT/US2009/059855, mailed May 24, 2010, 11 pages total.
Barwick, et al., "4D imaging of transient structures and morphologies in ultrafast electron microscopy," Science, Nov. 21, 2008; 322(5905): pp. 1227-1231.

(Continued)

Primary Examiner — Jack Berman
Assistant Examiner — Meenakshi Sahu
(74) Attorney, Agent, or Firm — Kilpatrick Townsend & Stockton LLP

(57) ABSTRACT

The present invention relates to methods and systems for 4D ultrafast electron microscopy (UEM)—in situ imaging with ultrafast time resolution in TEM. Single electron imaging is used as a component of the 4D UEM technique to provide high spatial and temporal resolution unavailable using conventional techniques. Other embodiments of the present invention relate to methods and systems for convergent beam UEM, focusing the electron beams onto the specimen to measure structural characteristics in three dimensions as a function of time. Additionally, embodiments provide not only 4D imaging of specimens, but characterization of electron energy, performing time resolved electron energy loss spectroscopy (EELS).

9 Claims, 47 Drawing Sheets

(56) References Cited

OTHER PUBLICATIONS

Baum, et al, "Femtosecond diffraction with chirped electron pulses," Chemical Physics Letters, Jul. 2008; 462 (1-3): pp. 14-17.

Baum, et al., "Attosecond electron pulses for 4D diffraction and microscopy," PNAS, Nov. 20, 2007; 104(47):18409-18414; retrieved from the Internet: <<http://www.pnas.org/content/104/47/18409.full.pdf+html>>.

Carbone, et al., "Dynamics of chemical bonding mapped by energy-resolved 4D electron microscopy," Science, Jul. 10, 2009; 325(5937): pp. 181-184.

Carbone, et al., "EELS femtosecond resolved in 4D ultrafast electron microscopy," Chemical Physics Letters, 2009; 468 (4-6): pp. 107-111.

Flannigan, et al., "Nanomechanical motions of cantilevers: direct imaging in real space and time with 4D electron microscopy," Nano Lett., Jan. 9, 2009; 7(9): pp. 2545-2551.

Hilbert, et al., "Temporal lenses for attosecond and femtosecond electron pulses," Jun. 16, 2009; 106: pp. 10558-10563.

Kwon, et al., "Nanoscale mechanical drumming visualized by 4D electron microscopy," Nano Lett., Nov. 2008; 8(11): pp. 3557-3562.

Park, et al., "Atomic-scale imaging in real and energy space developed in ultrafast electron microscopy," Nano Lett., Sep. 2007; 7(9): pp. 2545-2551.

* cited by examiner

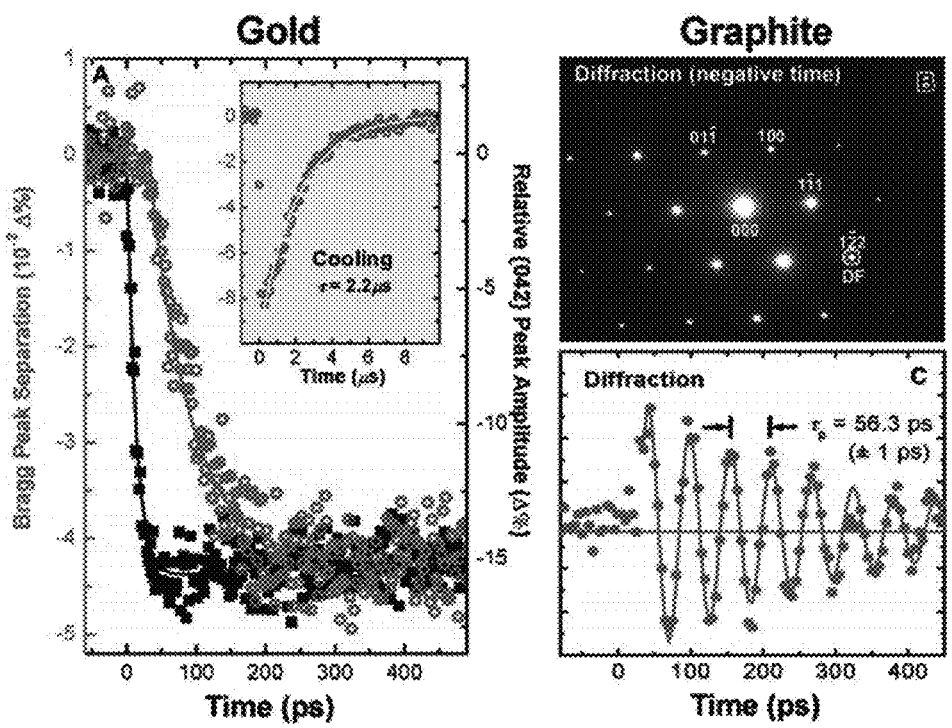
FIG. 6A  FIGS. 6B/6C
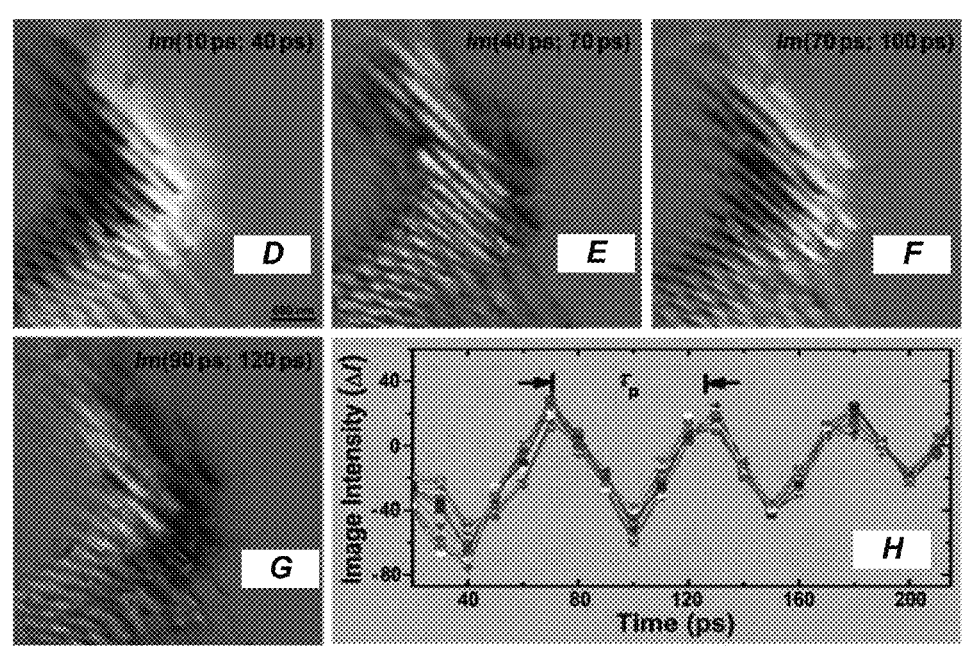
FIGS. 6D-6H

CHARACTERIZATION OF NANOSCALE STRUCTURES USING AN ULTRAFAST ELECTRON MICROSCOPE

CROSS-REFERENCES TO RELATED APPLICATIONS

This application is a continuation of U.S. patent application Ser. No. 13/565,678, filed Aug. 2, 2012, which claims the benefit of U.S. patent application Ser. No. 12/575,312, filed Oct. 7, 2009, now U.S. Pat. No. 8,247,769, which claims the benefit of U.S. Provisional Patent Application No. 61/195,639, filed Oct. 9, 2008, U.S. Provisional Patent Application No. 61/236,745, filed Aug. 25, 2009, and U.S. Provisional Patent Application No. 61/240,946, filed Sep. 9, 2009, which are commonly assigned, the disclosures of which are hereby incorporated by reference in their entirety.

U.S. patent application Ser. No. 12/575,285, now U.S. Pat. No. 8,203,120 was filed concurrently with U.S. patent application Ser. No. 12/575,312 and the entire disclosure of U.S. patent application Ser. No. 12/575,285 is hereby incorporated by reference into this application for all purposes.

STATEMENT AS TO RIGHTS TO INVENTIONS MADE UNDER FEDERALLY SPONSORED RESEARCH OR DEVELOPMENT

The U.S. Government has certain rights in this invention pursuant to Grant No. GM081520 awarded by the National Institutes of Health, Grant No. FA9550-07-1-0484 awarded by the Air Force (AFOSR) and Grant No(s). CHE0549936 & DMR0504854 awarded by the National Science Foundation.

BACKGROUND OF THE INVENTION

Electrons, because of their wave-particle duality, can be accelerated to have picometer wavelength and focused to image in real space. With the impressive advances made in transmission electron microscopy (TEM), STEM, and aberration-corrected TEM, it is now possible to image with high resolution, reaching the sub-Angstrom scale. Together with the progress made in electron crystallography, tomography, and single-particle imaging, today the electron microscope has become a central tool in many fields, from materials science to biology. For many microscopes, the electrons are generated either thermally by heating the cathode or by field emission, and as such the electron beam is made of random electron bursts with no control over the temporal behavior. In these microscopes, time resolution of milliseconds or longer, being limited by the video rate of the detector, can be achieved, while maintaining the high spatial resolution.

Despite the advances made in TEM techniques, there is a need in the art for improved methods and novel systems for ultrafast electron microscopy.

SUMMARY OF THE INVENTION

According to embodiments of the present invention, methods and systems for 4D ultrafast electron microscopy (UEM) are provided—in situ imaging with ultrafast time resolution in TEM. Thus, 4D microscopy provides imaging for the three dimensions of space as well as the dimension of time. In some embodiments, single electron imaging is introduced as a component of the 4D UEM technique. Utilizing one electron packets, resolution issues related to repulsion between electrons (the so-called space-charge problem) are addressed, providing resolution unavailable using conventional techniques. Moreover, other embodiments of the present invention provide methods and systems for convergent beam UEM, focusing the electron beams onto the specimen to measure structural characteristics in three dimensions as a function of time. Additionally, embodiments provide not only 4D imaging of specimens, but characterization of electron energy, performing time resolved electron energy loss spectroscopy (EELS).

The potential applications for 4D UEM are demonstrated using examples including gold and graphite, which exhibit very different structural and morphological changes with time. For gold, following thermally induced stress, the atomic structural expansion, the nonthermal lattice temperature, and the ultrafast transients of warping/bulging were determined. In contrast, in graphite, striking coherent transients of the structure were observed in the selected-area image dynamics, and also in diffraction, directly measuring the resonance period of Young's elastic modulus. Measurement of the Young's elastic modulus for the nano-scale dimension, the frequency is found to be as high as 30 gigahertz, hitherto unobserved, with the atomic motions being along the c-axis. Both materials undergo fully reversible dynamical changes, retracing the same evolution after each initiating impulsive stress. Thus, embodiments of the present invention provide methods and systems for performing imaging studies of dynamics using UEM.

Other embodiments of the present invention extend four-dimensional (4D) electron imaging to the attosecond time domain. Specifically, embodiments of the present invention are used to generate attosecond electron pulses and in situ probing with electron diffraction. The free electron pulses have a de Broglie wavelength on the order of picometers and a high degree of monochromaticity ($\Delta E/E_0 \approx 10^{-4}$); attosecond optical pulses have typically a wavelength of 20 nm and $\Delta E/E_0 \approx 0.5$, where $E_0$ is the central energy and $\Delta E$ is the energy bandwidth. Diffraction, and tilting of the electron pulses/specimen, permit the direct investigation of electron density changes in molecules and condensed matter. This 4D imaging on the attosecond time scale is a pump-probe approach in free space and with free electrons.

As described more fully throughout the present specification, some embodiments of the present invention utilize single electron packets in UEM, referred to as single electron imaging. Conventionally, it was believed that the greater number of electrons per pulse, the better the image produced by the microscope. In other words, as the signal is increased, imaging improves. However, the inventor has determined that by using single electron packets and repeating the imaging process a number of times, images can be achieved without repulsion between electrons. Unlike photons, electrons are charged and repel each other. Thus, as the number of electrons per pulse increases, the divergence of the trajectories increases and resolution decreases. Using single electron imaging techniques, atomic scale resolution of motion is provided once the space-charge problem is addressed.

According to an embodiment of the present invention, a four-dimensional electron microscope for imaging a sample is provided. The four-dimensional electron microscope includes a stage assembly configured to support the sample, a first laser source capable of emitting a first optical pulse of less than 1 ps in duration, and a second laser source capable of emitting a second optical pulse of less than 1 ns in duration. The four-dimensional electron microscope also includes a cathode coupled to the first laser source and the second laser source. The cathode is capable of emitting a first electron pulse less than 1 ps in duration in response to the first optical pulse and a second electron pulse of less than 1 ns in response to the second optical pulse. The four-dimensional electron microscope further includes an electron lens assembly configured to focus the electron pulse onto the sample and a detector configured to capture one or more electrons passing through the sample. The detector is configured to provide a data signal associated with the one or more electrons passing through the sample. The four-dimensional electron microscope additionally includes a processor coupled to the detector. The processor is configured to process the data signal associated with the one or more electrons passing through the sample to output information associated with an image of the sample. Moreover, the four-dimensional electron microscope includes an output device coupled to the processor. The output device is configured to output the information associated with the image of the sample.

According to another embodiment of the present invention, a convergent beam 4D electron microscope is provided. The convergent beam 4D electron microscope includes a laser system operable to provide a series of optical pulses, a first optical system operable to split the series of optical pulses into a first set of optical pulses and a second set of optical pulses and a first frequency conversion unit operable to frequency double the first set of optical pulses. The convergent beam 4D electron microscope also includes a second optical system operable to direct the frequency doubled first set of optical pulses to impinge on a sample and a second frequency conversion unit operable to frequency triple the second set of optical pulses. The convergent beam 4D electron microscope further includes a third optical system operable to direct the frequency tripled second set of optical pulses to impinge on a cathode, thereby generating a train of electron packets. Moreover, the convergent beam 4D electron microscope includes an accelerator operable to accelerate the train of electron packets, a first electron lens operable to de-magnify the train of electron packets, and a second electron lens operable to focus the train of electron packets onto the sample.

According to a specific embodiment of the present invention, a system for generating attosecond electron pulses is provided. The system includes a first laser source operable to provide a laser pulse and a cathode optically coupled to the first laser source and operable to provide an electron pulse at a velocity v0 directed along an electron path. The system also includes a second laser source operable to provide a first optical wave at a first wavelength. The first optical wave propagates in a first direction offset from the electron path by a first angle. The system further includes a third laser source operable to provide a second optical wave at a second wavelength. The second optical wave propagates in a second direction offset from the electron path by a second angle and the interaction between the first optical wave and the second optical wave produce a standing wave copropagating with the electron pulse.

According to another specific embodiment of the present invention, a method for generating a series of tilted attosecond pulses is provided. The method includes providing a femtosecond electron packet propagating along an electron path. The femtosecond electron packet has a packet duration and a direction of propagation. The method also includes providing an optical standing wave disposed along the electron path. The optical standing wave is characterized by a peak to peak wavelength measured in a direction tilted at a predetermined angle with respect to the direction of propagation. The method further includes generating the series of tilted attosecond pulses after interaction between the femtosecond electron packet and the optical standing wave.

According to a particular embodiment of the present invention, a method of operating an electron energy loss spectroscopy (EELS) system is provided. The method includes providing a train of optical pulses using a pulsed laser source, directing the train of optical pulses along an optical path, frequency doubling a portion of the train of optical pulses to provide a frequency doubled train of optical pulses, and frequency tripling a portion of the frequency doubled train of optical pulses to provide a frequency tripled train of optical pulses. The method also includes optically delaying the frequency doubled train of optical pulses using a variable delay line, impinging the frequency doubled train of optical pulses on a sample, impinging the frequency tripled train of optical pulses on a photocathode, and generating a train of electron pulses along an electron path. The method further includes passing the train of electron pulses through the sample, passing the train of electron pulses through a magnetic lens, and detecting the train of electron pulses at a camera.

According to an embodiment of the present invention, a method of imaging a sample is provided. The method includes providing a stage assembly configured to support the sample, generating a train of optical pulses from a laser source, and directing the train of optical pulses along an optical path to impinge on a cathode. The method also includes generating a train of electron pulses in response to the train of optical pulses impinging on the cathode. Each of the electron pulses consists of a single electron. The method further includes directing the train of electron pulses along an imaging path to impinge on the sample, detecting a plurality of the electron pulses after passing through the sample, processing the plurality of electron pulses to form an image of the sample, and outputting the image of the sample to an output device.

According to another embodiment of the present invention, a method of capturing a series of time-framed images of a moving nanoscale object is provided. The method includes a) initiating motion of the nanoscale object using an optical clocking pulse, b) directing an optical trigger pulse to impinge on a cathode, and c) generating an electron pulse. The method also includes d) directing the electron pulse to impinge on the sample with a predetermined time delay between the optical clocking pulse and the electron pulse, e) detecting the electron pulse, f) processing the detected electron pulse to form an image, and g) increasing the predetermined time delay between the optical clocking pulse and the electron pulse. The method further includes repeating steps a) through g) to capture the series of time-framed images of the moving nanoscale object.

According to a specific embodiment of the present invention, a method of characterizing a sample is provided. The method includes providing a laser wave characterized by an optical wavelength ($\lambda_0$) and a direction of propagation and directing the laser wave along an optical path to impinge on a test surface of the sample. The test surface of the sample is tilted with respect to the direction of propagation of the laser by a first angle ($\alpha$). The method also includes providing a train of electron pulses characterized by a propagation velocity ($v_{el}$), a spacing between pulses $$\left(\lambda_0 \frac{v_{el}}{c}\right),$$

and a direction of propagation tilted with respect to the direction of propagation of the laser by a second angle ($\beta$). The method further includes directing the train of electron pulses along an electron path to impinge on the test surface of the sample. The first angle, the second angle, and the propagation velocity are related by $$\frac{\sin(\alpha)}{\sin(\alpha-\beta)} = \frac{c}{v_{e1}}.$$

According to another specific embodiment of the present invention, a method of imaging chemical bonding dynamics is provided. The method includes positioning a sample in a reduced atmosphere environment, providing a first train of laser pulses, and directing the first train of laser pulses along a first optical path to impinge on a sample. The method also includes providing a second train of laser pulses, directing the second train of laser pulses along a second optical path to impinge on a photocathode, and generating a train of electron pulses. One or more of the electron pulses consist of a single electron. The method further includes accelerating the train of electron pulses and transmitting a portion of the train of electron pulses through the sample.

Numerous benefits are achieved by way of the present invention over conventional techniques. For example, the present systems provide temporal resolution over a wide range of time scales. Additionally, unlike spectroscopic methods, embodiments of the present invention can determine a structure in 3-D space. Such capabilities allow for the investigation of phase transformation in matter, determination of elastic and mechanical properties of materials on the nanoscale, and the time evolution of processes involved in materials and biological function.

Depending upon the embodiment, one or more of these benefits may be achieved. These and other benefits will be described in more detail throughout the present specification and more particularly below.

These and other objects and features of the present invention and the manner of obtaining them will become apparent to those skilled in the art, and the invention itself will be best understood by reference to the following detailed description read in conjunction with the accompanying drawings.

BRIEF DESCRIPTION OF THE DRAWINGS

FIGS. 6A-H illustrate structural dynamics for gold and graphite samples, time-resolved images for a graphite sample, and a plot of intensity difference for the graphite sample according to an embodiment of the present invention;

DETAILED DESCRIPTION OF SPECIFIC EMBODIMENTS

Ultrafast imaging, using pulsed photoelectron packets, provides opportunities for studying, in real space, the elementary processes of structural and morphological changes. In electron diffraction, ultrashort time resolution is possible but the data is recorded in reciprocal space. With space-charge-limited nanosecond (sub-micron) image resolutions ultrashort processes are not possible to observe. In order to achieve the ultrafast resolution in microscopy, the concept of single-electron pulse imaging was realized as a key to the elimination of the Coulomb repulsion between electrons while maintaining the high temporal and spatial resolutions. As long as the number of electrons in each pulse is much below the space-charge limit, the packet can have a few or tens of electrons and the temporal resolution is still determined by the femtosecond (fs) optical pulse duration and the energy uncertainty, on the order of 100 fs, and the spatial resolution is atomic-scale. However, the goal of full-scale dynamic imaging can be attained only when in the microscope the problems of in situ high spatiotemporal resolution for selected image areas, together with heat dissipation, are overcome.

Figure 1:
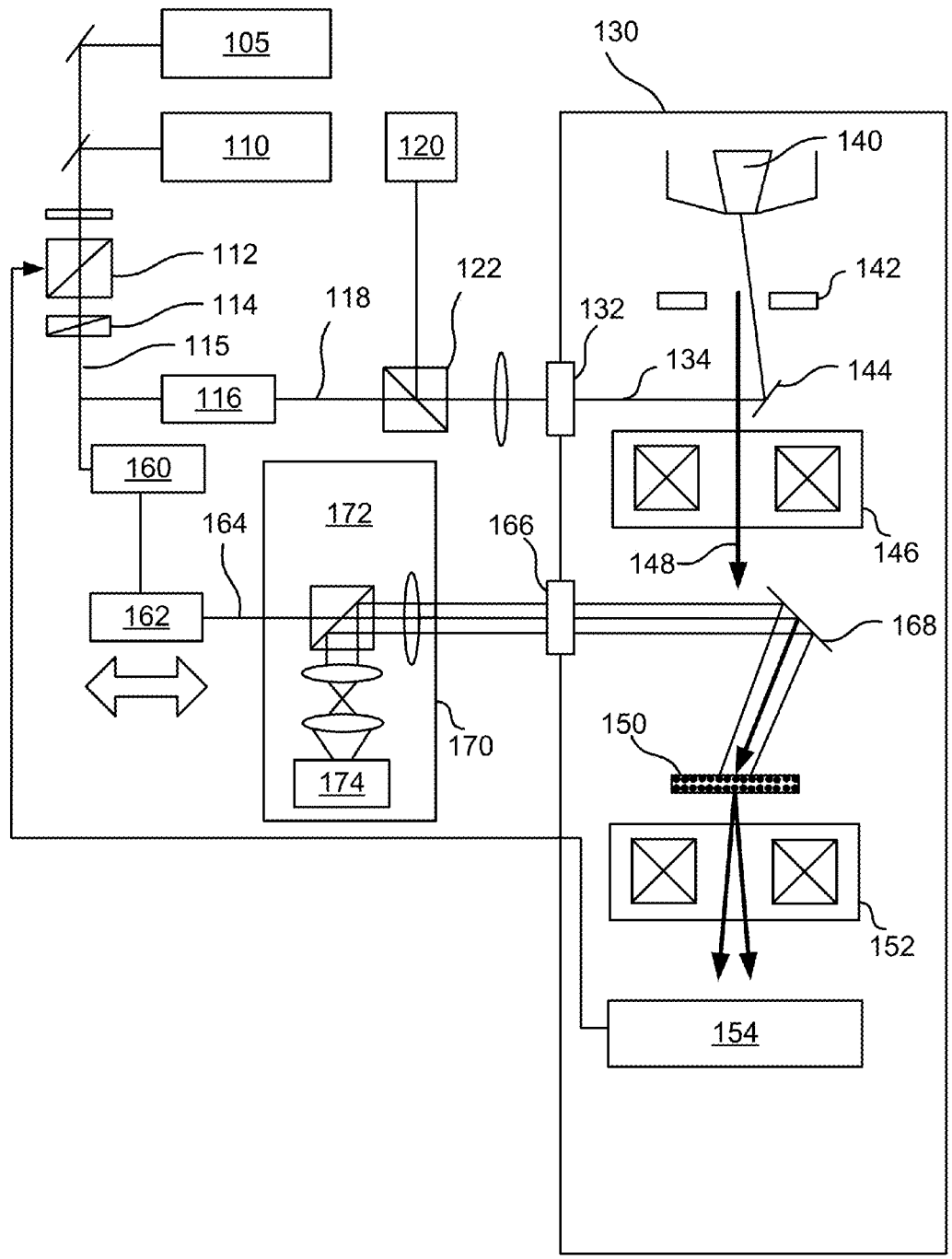
FIG. 1 is a simplified diagram of a 4D electron microscope system according to an embodiment of the present invention.

FIG. 1 is a simplified diagram of a 4D electron microscope system according to an embodiment of the present invention. This diagram is merely an example, which should not unduly limit the scope of the claims herein. One of ordinary skill in the art would recognize many variations, modifications, and alternatives. As illustrated in FIG. 1, a femtosecond laser 110 or a nanosecond laser 105 is directed through a Pockels cell 112, which acts as a controllable shutter. A Glan polarizer 114 is used in some embodiments, to select the laser power propagating in optical path 115. A beam splitter (not shown) is used to provide several laser beams to various portions of the system. Although the system illustrated in FIG. 1 is described with respect to imaging applications, this is not generally required by the present invention. One of skill in the art will appreciate that embodiments of the present invention provide systems and methods for imaging, diffraction, crystallography, electron spectroscopy, and related fields. Particularly, the experimental results discussed below yield insight into the varied applications available using embodiments of the present invention.

The femtosecond laser 110 is generally capable of generating a train of optical pulses with predetermined pulse width. One example of such a laser system is a diode-pumped mode-locked titanium sapphire (Ti:Sapphire) laser oscillator operating at 800 nm and generating 100 fs pulses at a repetition rate of 80 MHz and an average power of 1 Watt, resulting in a period between pulses of 12.5 ns. In an embodiment, the spectral bandwidth of the laser pulses is 2.35 nm FWHM. An example of one such laser is a Mai Tai One Box Femtosecond Ti:Sapphire Laser, available from Spectra-Physics Lasers, of Mountain View, Calif. In alternative embodiments, other laser sources generating optical pulses at different wavelengths, with different pulse widths, and at different repetition rates are utilized. One of ordinary skill in the art would recognize many variations, modifications, and alternatives.

The nanosecond laser 105 is also generally capable of generating a train of optical pulses with a predetermined pulse width greater than that provided by the femtosecond laser. The use of these two laser systems enables system miniaturization since the size of the nanosecond laser is typically small in comparison to some other laser systems. By moving one or more mirrors, either laser beam is selected for use in the system. The ability to select either laser enables scanning over a broad time scale—from femtoseconds all the way to milliseconds. For short time scale measurement, the femtosecond laser is used and the delay stage (described below) is scanned at corresponding small time scales. For measurement of phenomena over longer time scales, the nanosecond laser is used and the delay stage is scanned at corresponding longer time scales.

A first portion of the output of the femtosecond laser 110 is coupled to a second harmonic generation (SHG) device 116, for example a barium borate ($BaB_2O_4$) crystal, typically referred to as a BBO crystal and available from a variety of doubling crystal manufacturers. The SHG device frequency doubles the train of optical pulses to generate a train of 400 nm, 100 fs optical pulses at an 80 MHz repetition rate. SHG devices generally utilize a nonlinear crystal to frequency double the input pulse while preserving the pulse width. In some embodiments, the SHG is a frequency tripling device, thereby generating an optical pulse at UV wavelengths. Of course, the desired output wavelength for the optical pulse will depend on the particular application. The doubled optical pulse produced by the SHG device propagates along electron generating path 118.

A cw diode laser 120 is combined with the frequency doubled optical pulse using beam splitter 122. The light produce by the cw diode laser, now collinear with the optical pulse produced by the SHG device, serves as an alignment marker beam and is used to track the position of the optical pulse train in the electron generating path. The collinear laser beams enter chamber 130 through entrance window 132. In the embodiment illustrated in FIG. 1, the entrance window is fabricated from materials with high transparency at 400 nm and sufficient thickness to provide mechanical rigidity. For example, BK-7 glass about 6 mm thick with anti-reflection coatings, e.g. $MgF_2$ or sapphire are used in various embodiments. One of ordinary skill in the art would recognize many variations, modifications, and alternatives.

An optical system, partly provided outside chamber 130 and partly provided inside chamber 130 is used to direct the frequency doubled optical pulse train along the electron-generating path 134 inside the chamber 130 so that the optical pulses impinge on cathode 140. As illustrated, the optical system includes mirror 144, which serves as a turning mirror inside chamber 130. In embodiments of the present invention, polished metal mirrors are utilized inside the chamber 130 since electron irradiation may damage mirror coatings used on some optical mirrors. In a specific embodiment, mirror 144 is fabricated from an aluminum substrate that is diamond turned to produce a mirror surface. In some embodiments, the aluminum mirror is not coated. In other embodiments, other metal mirrors, such as a mirror fabricated from platinum is used as mirror 144.

In an embodiment, the area of interaction on the cathode was selected to be a flat 300 μm in diameter. Moreover, in the embodiment illustrated, the frequency doubled optical pulse was shaped to provide a beam with a beam waist of a predetermined diameter at the surface of the cathode. In a specific embodiment, the beam waist was about 50 μm. In alternative embodiments, the beam waist ranged from about 30 μm to about 200 μm. Of course, the particular dimensions will depend on the particular applications. The frequency doubled optical pulse train was steered inside the chamber using a computer controlled mirror in a specific embodiment.

In a specific embodiment, the optical pulse train is directed toward a front-illuminated photocathode where the irradiation of the cathode by the laser results in the generation of electron pulses via the photoelectric effect. Irradiation of a cathode with light having an energy above the work function of the cathode leads to the ejection of photoelectrons. That is, a pulse of electromagnetic energy above the work function of the cathode ejects a pulse of electrons according to a preferred embodiment. Generally, the cathode is maintained at a temperature of 1000 K, well below the thermal emission threshold temperature of about 1500 K, but this is not required by the present invention. In alternative embodiments, the cathode is maintained at room temperature. In some embodiments, the cathode is adapted to provide an electron pulse of predetermined pulse width. The trajectory of the electrons after emission follows the lens design of the TEM, namely the condenser, the objective, and the projector lenses. Depending upon the embodiment, there may also be other configurations.

In the embodiment illustrated, the cathode is a Mini-Vogel mount single crystal lanthanum hexaboride ($LaB_6$) cathode shaped as a truncated cone with a flat of 300 μm at the apex and a cone angle of 90°, available from Applied Physics Technologies, Inc., of McMinnville, Oreg. As is often known, $LaB_6$ cathodes are regularly used in transmission and scanning electron microscopes. The quantum efficiency of $LaB_6$ cathodes is about $10^{-3}$ and these cathodes are capable of producing electron pulses with temporal pulse widths on the order of $10^{-13}$ seconds. In some embodiments, the brightness of electron pulses produced by the cathode is on the order of $10^9$ $A/cm^2/rad^2$ and the energy spread of the electron pulses is on the order of 0.1 eV. In other embodiments, the pulse energy of the laser pulse is reduced to about 500 pJ per pulse, resulting in approximately one electron/pulse Generally, the image quality acquired using a TEM is proportional to the number of electrons passing through the sample. That is, as the number of electrons passing through the sample is increased, the image quality increases. Some pulsed lasers, such as some Q-switched lasers, reduce the pulse count to produce a smaller number of pulses characterized by higher peak power per pulse. Thus, some laser amplifiers operate at a 1 kHz repetition rate, producing pulses with energies ranging from about 1 μJ to about 2 mJ per pulse. However, when such high peak power lasers are used to generate electron pulses using the photoelectric effect, among other issues, both spatial and temporal broadening of the electron pulses adversely impact the pulse width of the electron pulse or packet produced. In some embodiments of the present invention, the laser is operated to produce low power pulses at higher repetition rates, for example, 80 MHz. In this mode of operation, benefits available using lower power per pulse are provided, as described below. Additionally, because of the high repetition rate, sufficient numbers of electrons are available to acquire high quality images.

In some embodiments of the present invention, the laser power is maintained at a level of less than 500 pJ per pulse to prevent damage to the photocathode. As a benefit, the robustness of the photoemitter is enhanced. Additionally, laser pulses at these power levels prevent space-charge broadening of the electron pulse width during the flight time from the cathode to the sample, thus preserving the desired femtosecond temporal resolution. Additionally, the low electron count per pulse provided by some embodiments of the present invention reduces the effects of space charge repulsion in the electron pulse, thereby enhancing the focusing properties of the system. As one of skill in the art will appreciated, a low electron count per pulse, coupled with a high repetition rate of up to 80 MHz provided by the femtosecond laser, provides a total dose as high as one electron/$Å^2$ as generally utilized in imaging applications.

In alternative embodiments, other suitable cathodes capable of providing a ultrafast pulse of electrons in response to an ultrafast optical pulse of appropriate wavelength are utilized. In embodiments of the present invention, the cathode is selected to provide a work function correlated with the wavelength of the optical pulses provided by the SHG device. The wavelength of radiation is related to the energy of the photon by the familiar relation $\lambda(\mu m) \approx 1.24 \div v$ (eV), where $\lambda$ is the wavelength in microns and v is the energy in eV. For example, a $LaB_6$ cathode with a work function of 2.7 eV is matched to optical pulses with a wavelength of 400 nm (v=3.1 eV) in an embodiment of the present invention. As illustrated, the cathode is enclosed in a vacuum chamber 130, for example, a housing for a transmission electron microscope (TEM). In general, the vacuum in the chamber 130 is maintained at a level of less than $1\times10^{-6}$ torr. In alternative embodiments, the vacuum level varies from about $1\times10^{-6}$ torr to about $1\times10^{-10}$ torr. The particular vacuum level will be a function of the varied applications.

In embodiments of the present invention, the short duration of the photon pulse leads to ejection of photoelectrons before an appreciable amount of the deposited energy is transferred to the lattice of the cathode. In general, the characteristic time for thermalization of the deposited energy in metals is below a few picoseconds, thus no heating of the cathode takes place using embodiments of the present invention.

Electrons produced by the cathode 140 are accelerated past the anode 142 and are collimated and focused by electron lens assembly 146 and directed along electron imaging path 148 toward the sample 150. The electron lens assembly generally contains a number of electromagnetic lenses, apertures, and other elements as will be appreciated by one of skill in the art. Electron lens assemblies suitable for embodiments of the present invention are often used in TEMs. The electron pulse propagating along electron imaging path 148 is controlled in embodiments of the present invention by a controller (not shown, but described in more detail with reference to certain Figures below) to provide an electron beam of predetermined dimensions, the electron beam comprising a train of ultrafast electron pulses.

The relationship between the electron wavelength ($\lambda_{deBroglie}$) and the accelerating voltage (U) in an electron microscope is given by the relationship $\lambda_{deBroglie}=h/(2m_0eU)^{1/2}$, where h, $m_0$, e are Planck's constant, the electron mass, and an elementary charge. As an example, the de Broglie wavelength of an electron pulse at 120 kV corresponds to 0.0335 Å, and can be varied depending on the particular application. The bandwidth or energy spread of an electron packet is a function of the photoelectric process and bandwidth of the optical pulse used to generate the electron packet or pulse.

Electrons passing through the sample or specimen 150 are focused by electron lens assembly 152 onto a detector 154. Although FIG. 1 illustrates two electron lens assemblies 146 and 152, the present invention is not limited to this arrangement and can have other lens assemblies or lens assembly configurations. In alternative embodiments, additional electromagnets, apertures, other elements, and the like are utilized to focus the electron beam either prior to or after interaction with the sample, or both.

Detection of electrons passing through the sample, including single-electron detection, is achieved in one particular embodiment through the use of an ultrahigh sensitivity (UHS) phosphor scintillator detector 154 especially suitable for low-dose applications in conjunction with a digital CCD camera. In a specific embodiment, the CCD camera was an UltraScan™ 1000 UHS camera, manufactured by Gatan, Inc., of Pleasanton, Calif. The UltraScan™ 1000 CCD camera is a 4 mega-pixel (2048×2048) camera with a pixel size of 14 μm×14 μm, 16-bit digitization, and a readout speed of 4 Mpixels/sec. In the embodiment illustrated, the digital CCD camera is mounted under the microscope in an on-axis, below the chamber position. In order to reduce the noise and picture artifacts, in some embodiments, the CCD camera chip is thermoelectrically cooled using a Peltier cooler to a temperature of about −25° C. The images from the CCD camera were obtained with DigitalMicrograph™ software embedded in the Tecnai™ user interface, also available from Gatan, Inc. Of course, there can be other variations to the CCD camera, cooler, and computer software, depending upon the embodiment.

Figure 2:
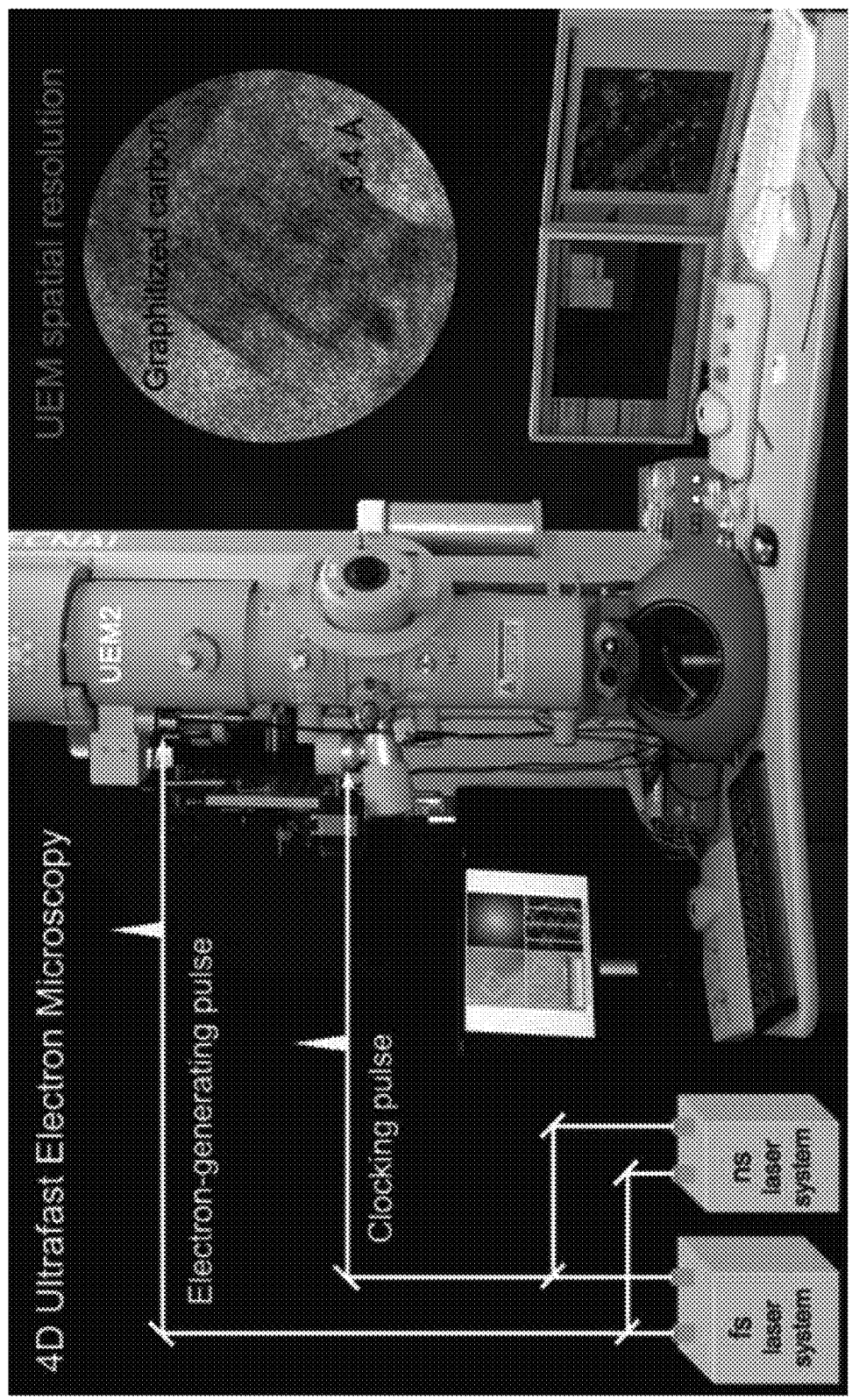
FIG. 2 is a simplified perspective diagram of a 4D electron microscope system according to an embodiment of the present invention.

FIG. 2 is a simplified perspective diagram of a 4D electron microscope system according to an embodiment of the present invention. The system illustrated in FIG. 2 is also referred to as an ultrafast electron microscope (UEM2) and was built at the present assignee. The integration of two laser systems with a modified electron microscope is illustrated, together with a representative image showing a resolution of 3.4 Å obtained in UEM2 without the field-emission-gun (FEG) arrangement of a conventional TEM. In one embodiment of the system illustrated in FIG. 2, the femtosecond laser system (fs laser system) is used to generate the single-electron packets and the nanosecond laser system (ns laser system) was used both for single-shot and stroboscopic recordings. In the single-electron mode of operation, the coherence volume is well defined and appropriate for image formation in repetitive events. The dynamics are fully reversible, retracing the identical evolution after each initiating laser pulse; each image is constructed stroboscopically, in seconds, from typically $10^6$ pulses and all time-frames are processed to make a movie. The time separation between pulses can be varied to allow complete heat dissipation in the specimen. Without limiting embodiments of the present invention, it is believed that the electrons in the single electron packets have a transverse coherence length that is comparable to the size of the object that is being imaged. Since the subsequent electrons have a coherence length on the order of the size of the object, the electrons "see" the whole object at once.

To follow the area-specific changes in the hundreds of images collected for each time scan, we obtained selected-area-image dynamics (SAID) and selected-area-diffraction dynamics (SADD); for the former, in real space, from contrast change and for the latter, in Fourier space, from changes of the Bragg peak separations, amplitudes, and widths. It is the advantage of microscopy that allows us to perform this parallel-imaging dynamics with pixel resolution, when compared with diffraction. As shown below, it would not have been possible to observe the selected temporal changes if the total image were to be averaged over all pixels, in this case 4 μmillions.

As illustrated in FIG. 2, a TEM is modified to provide a train of electron pulses used for imaging in addition to the thermionic emission source used for imaging of samples. Merely by way of example, an FEI Tecnai™ $G^2$ 12 TWIN, available from FEI Company in Hillsboro, Oreg., may be modified according to embodiments of the present invention. The Tecnai™ $G^2$ 12 TWIN is an all-in-one 120 kV ($\lambda_{deBroglie}$≈0.0335 Å) high-resolution TEM optimized for 2D and 3D imaging at both room and liquid-nitrogen temperatures. Embodiments of the present invention leverage capabilities provided by commercial TEMs such as automation software, detectors, data transfer technology, and tomography.

In particular, in some embodiments of the present invention, a five-axis, motor-driven, precision goniometer is used with computer software to provide automated specimen tilt combined with automated acquisition of images as part of a computerized tomography (CT) imaging system. In these embodiments, a series of 2D images are captured at various specimen positions and combined using computer software to generate a reconstructed 3D image of the specimen. In some embodiments, the CT software is integrated with other TEM software and in other embodiments, the CT software is provided off-line. One of ordinary skill in the art would recognize many variations, modifications, and alternatives.

In certain embodiments in which low-electron content electron pulses are used to image the sample, the radiation damage is limited to the transit of the electrons in the electron pulses through the sample. Typically, samples are on the order of 100 nm thick, although other thicknesses would work as long as certain electrons may traverse through the sample. Thus, the impact of radiation damage on these low-electron content electron pulse images is limited to the damage occurring during this transit time. Radiation induced structural damage occurring on longer time scales than the transit time will not impact the collected image, as these damage events will occur after the structural information is collected.

Utilizing the apparatus described thus far, embodiments of the present invention provide systems and methods for imaging material and biological specimens both spatially and temporally with atomic-scale spatial resolution on the order of 1 nm and temporal resolution on the order of 100 fs. At these time scales, energy randomization is limited and the atoms are nearly frozen in place, thus methods according to the present invention open the door to time-resolved studies of structural dynamics at the atomic scale in both space and time. Details of the present computer system according to an embodiment of the present invention may be explained according to the description below.

Referring to FIG. 2, a photograph of a UEM2 in accordance with embodiments of the present invention is illustrated, together with a high-resolution image of graphitized carbon. As illustrated, two laser systems (fs and ns) are utilized to provide a wide range of temporal scales used in 4D electron imaging. A 200-kV TEM is provided with at least two ports for optical access to the microscope housing. Using one or more mirrors (e.g., two mirrors), it is possible to switch between the laser systems to cover both the fs and ns experiments. The optical pulses are directed to the photocathode to generate electron packets, as well as to the specimen to initiate (clock) the change in images with a well-defined delay time Δt. The time axis is defined by variable delay between the electron generating and clocking pulses using the delay stage 170 illustrated in FIG. 1.

Details of development of ultrafast electron microscopy with atomic-scale real-, energy-, and Fourier-space resolutions is now provided. The second generation UEM2 described in FIG. 2 provides images, diffraction patterns, and electron-energy spectra, and has application for nanostructured materials and organometallic crystals. The separation between atoms in direct images, and the Bragg spots/Debye-Scherrer rings in diffraction, are clearly resolved, and the electronic structure and elemental energies in the electron-energy-loss spectra (EELS) and energy-filtered-transmission-electron microscopy (EFTEM) are obtained.

The development of 4D ultrafast electron microscopy and diffraction have made possible the study of structural dynamics with atomic-scale spatial resolution, so far in diffraction, and ultrashort time resolution. The scope of applications is wide-ranging with studies spanning diffraction of isolated structures in reactions (gas phase), nanostructures of surfaces and interfaces (crystallography), and imaging of biological cells and materials undergoing first-order phase transitions. Typically, for microscopy the electron was accelerated to 120 keV and for diffraction to 30 keV, respectively, and issues of group velocity mismatch, in situ clocking (time zero) of the change, and frame referencing were addressed. One powerful concept implemented is that of "tilted pulses," which allow for the optimum resolution to be reached at the specimen.

For ultrafast electron microscopy, the concept of "single-electron" imaging is fundamental to some embodiments. The electron packets, which have a well-defined picometer-scale de Broglie wave length, are generated in the microscope by femtosecond optical pulses (photoelectric effect) and synchronized with other optical pulses to initiate the change in a temperature-jump or electronic excitation. Because the number of electrons in each packet is one or a few, the Coulomb repulsion (space charge) between electrons is reduced or eliminated and the temporal resolution can reach the ultimate, that of the optical pulse. The excess energy above the work function determines the electron energy spread and this, in principle, can be minimized by tuning the pulse energy. The spatial resolution is then only dependent on the total number of electrons because for each packet the electron "interferes with itself" and a coherent buildup of the image is achievable.

The coherence volume, given by:

$$V_c = \lambda_{deBroglie}^2 (R/a)^2 v_e (h/\Delta E)$$

establishes that the degeneracy factor is much less than one and that each Fermionic electron is independent, without the need of the statistics commonly used for Bosonic photons. The volume is determined by the values of longitudinal and transverse coherences; $V_c$ is on the order of $10^6$ nm$^3$ for typical values of R (distance to the source), a (source dimension), $v_e$ (electron velocity), and $\Delta E$ (energy spread). Unlike the situation in transmission electron microscopy (TEM), coherence and image resolution in UEM are thus determined by properties of the optical field, the ability to focus electrons on the ultrashort time scale, and the operational current density. For both "single electron" and "single pulse" modes of UEM, these are important considerations for achieving the ultimate spatio-temporal resolutions for studies of materials and biological systems.

Atomic-scale resolution in real-space imaging can be achieved utilizing the second generation ultrafast electron microscopy system (UEM2) of FIG. 2. With UEM2, which operates at 200 keV ($\lambda_{deBroglie}$=2.507 μm), energy-space (electron-energy-loss spectroscopy, EELS) and Fourier-space (diffraction) patterns of nanostructured materials are possible. The apparatus can operate in the scanning transmission electron microscope (STEM) mode, and is designed to explore the vast parameter space bridging the gap between the two ideal operating modes of single-electron and single-pulse imaging. With these features, UEM2 studies provide new limits of resolution, image mapping, and elemental analysis. Here, demonstrated are the potential by studying gold particles and islands, boron nitride crystallites, and organometallic phthalocyanine crystals.

Figure 2A:
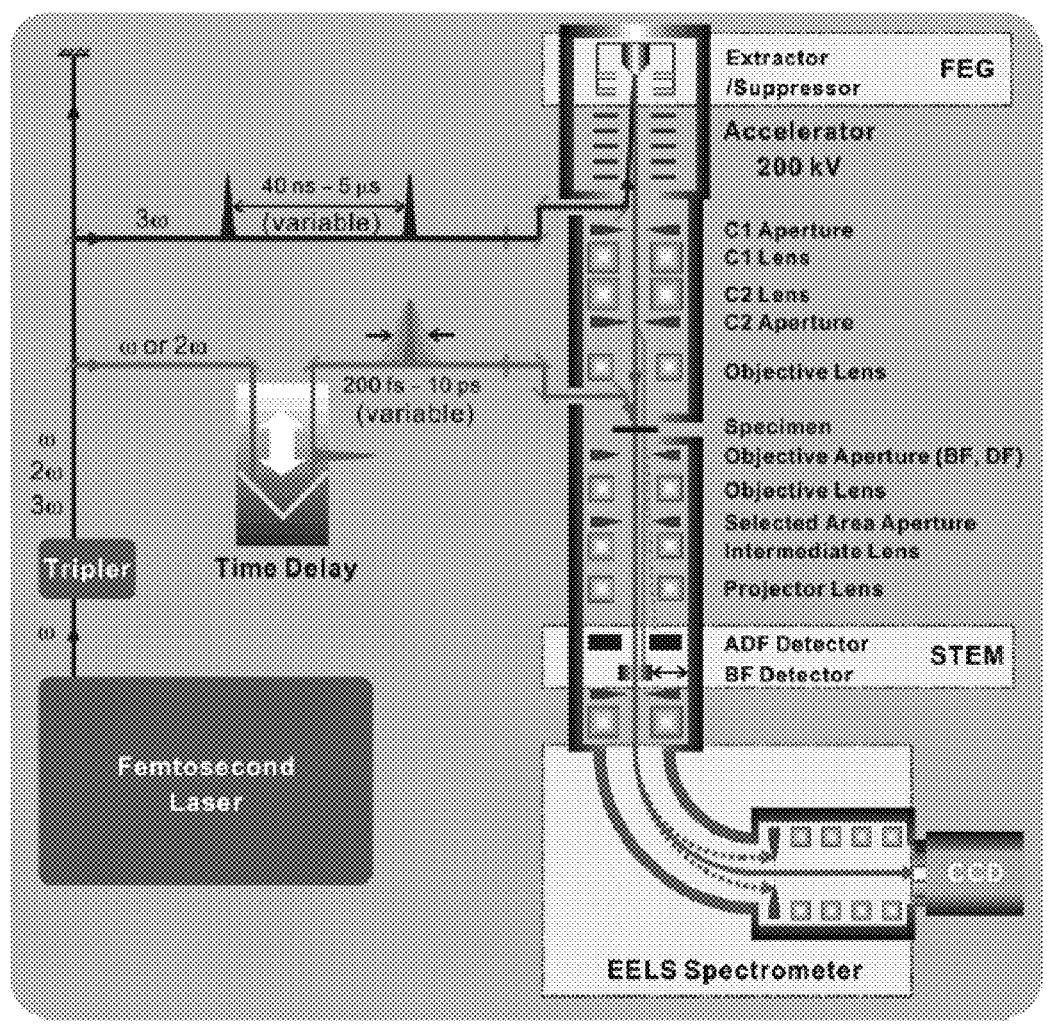
FIG. 2A shows a conceptual design of the system of FIG. 2.

FIG. 2A displays the conceptual design of UEM2, which, as with the first generation (UEM1—described generally in FIG. 1), comprises a femtosecond laser system and an electron microscope modified for pulsed operation with femtosecond electron packets. A schematic representation of optical, electric, and magnetic components are shown. The optical pulse train generated from the laser, in this case having a variable pulse width of 200 fs to 10 ps and a variable repetition rate of 200 kHz to 25 MHz, is divided into two parts, after harmonic generation, and guided toward the entries of the design hybrid electron microscope. The frequency-tripled optical pulses are converted to the corresponding probe electron pulses at the photocathode in the hybrid FEG, whereas the other optical pump beam excites (T-jump or electronic excitation) in the specimen with a well-defined time delay with respect to the probe electron beam. The probe electron beam through the specimen can be recorded as an image (normal or filtered, EFTEM), a diffraction pattern, or an EEL spectrum. The STEM bright-field detector is retractable when it is not in use.

The laser in an embodiment is a diode-pumped Yb-doped fiber oscillator/amplifier (Clark-MXR; in development), which produces ultrashort pulses of up to 10 μJ at 1030 nm with variable pulse width (200 fs-10 ps) and repetition rate (200 kHz-25 MHz). The output pulses pass through two successive nonlinear crystals to be frequency doubled (515 nm) and tripled (343 nm). The harmonics are separated from the residual infrared radiation (IR) beam by dichroic mirrors, and the frequency-tripled pulses are introduced to the photocathode of the microscope for generating the electron pulse train. The residual IR fundamental and frequency-doubled beams remain available to heat or excite samples and clock the time through a computer-controlled optical delay line for time-resolved applications.

The electron microscope column is that of a designed hybrid 200-kV TEM (Tecnai 20, FEI) integrated with two ports for optical access, one leading to the photocathode and the other to the specimen. The field emission gun (FEG) in the electron-generation assembly adapts a lanthanum hexaboride ($LaB_6$) filament as the cathode, terminating in a conical electron source truncated to leave a flat tip area with a diameter of 16 µm. The tip is located in a field environment controlled by suppressor and extractor electrodes. The gun can be operated as either a thermal emission or a photoemission source.

The optical pulses are guided to the photocathode as well as to the specimen by a computer-controlled, fine-steering mirror in an externally-mounted and x-ray-shielded periscope assembly. Each laser beam can be focused to a spot size of <30 µm full width at half maximum (FWHM) at its respective target when the beam is expanded to utilize the available acceptance angle of the optical path. Various pulse-energy, pulse-length, and focusing regimes have been used in the measurements reported here. For UEM measurements, the cathode was heated to a level below that needed to produce detectable thermal emission, as detailed below, and images were obtained using both the TEM and the UEM2 µmode of operation.

For applications involving EELS and energy-filtered-transmission-electron microscopy (EFTEM), the Gatan Imaging Filter (GIF) Tridiem, of the so-called post-column type, was attached below the camera chamber. The GIF accepts electrons passing through an entrance aperture in the center of the projection chamber. The electron beam passes through a 90° sector magnet as shown in FIG. 2A, which bends the primary beam through a 10 cm bending radius and thereby separates the electrons according to their energy into an energy spectrum. An energy resolution of 0.87 eV was measured for the EELS zero-loss peak in thermal mode operation of the TEM. A retractable slit is located after the magnet followed by a series of lenses. The lenses restore the image or diffraction pattern at the entrance aperture and finally it can be recorded on a charge-coupled device (CCD) camera (UltraScan 1000 FT) at the end of the GIF with the Digital Micrograph software. The digital camera uses a 2,048×2,048 pixel CCD chip with 14 µm square pixels. Readout of the CCD is done as four independent quadrants via four separate digitizing signal chains. This 4-port readout camera combines single-electron sensitivity and 16-bit pixel depth with high-speed sensor readout (4 Mpix/s).

Additionally, for scanning-transmission-electron microscopy (STEM), the UEM2 is equipped with a bright-field (BF) detector with a diameter of 7 mm and an annular dark-field (ADF) detector with an inner diameter of 7 mm and an outer diameter of 20 mm. Both detectors are located in the near-axis position underneath the projection chamber. The BF detector usually collects the same signal as the TEM BF image, i.e., the transmitted electrons, while the ADF detector collects an annulus at higher angle where only scattered electrons are detected. The STEM images are recorded with the Tecnai Imaging & Analysis (TIA) software.

To observe the diffraction pattern, i.e., the back focal plane of the objective lens, we inserted a selected area aperture into the image plane of the objective lens, thus creating a virtual aperture in the plane of the specimen. The result is a selected area diffraction (SAD) pattern of the region of interest only. Adjustment of the intermediate and projector lens determines the camera length. Diffraction patterns are processed and analyzed for crystal structure determination.

Several features of the UEM2 system are worthy of note. First, the high repetition rate amplified laser source allows us to illuminate the cathode with 343 nm pulses of energies above 500 nJ, compared with typical values of 3 nJ near 380 nm for UEM1. Thus, a level of average optical power for electron generation comparable to that of UEM1 operating at 80 MHz, but at much lower repetition rates, was able to be delivered. The pulse energy available in the visible and IR beams is also at least two orders of magnitude greater than for UEM1, allowing for exploration of a much greater range in the choice of sample excitation conditions.

Second, the hybrid 200-kV FEG, incorporating an extractor/suppressor assembly providing an extractor potential of up to 4 kV, allows higher resolving power and greater flexibility and control of the conditions of electron generation. Third, with simple variation of optical pulse width, the temporal and spatial resolution can be controlled, depending on the requirements of each experiment. Fourth, with variation of spacing between optical pulses without loss of pulse energy, a wide range of samples can be explored allowing them to fully relax their energy after each excitation pulse and rewind the clock precisely; with enough electrons, below the space-charge limit, single-pulse recording is possible. Finally, by the integration of the EELS spectrometer, the system is empowered with energy resolution in addition to the ultrafast time resolution and atomic-scale space resolution.

Figure 2B:
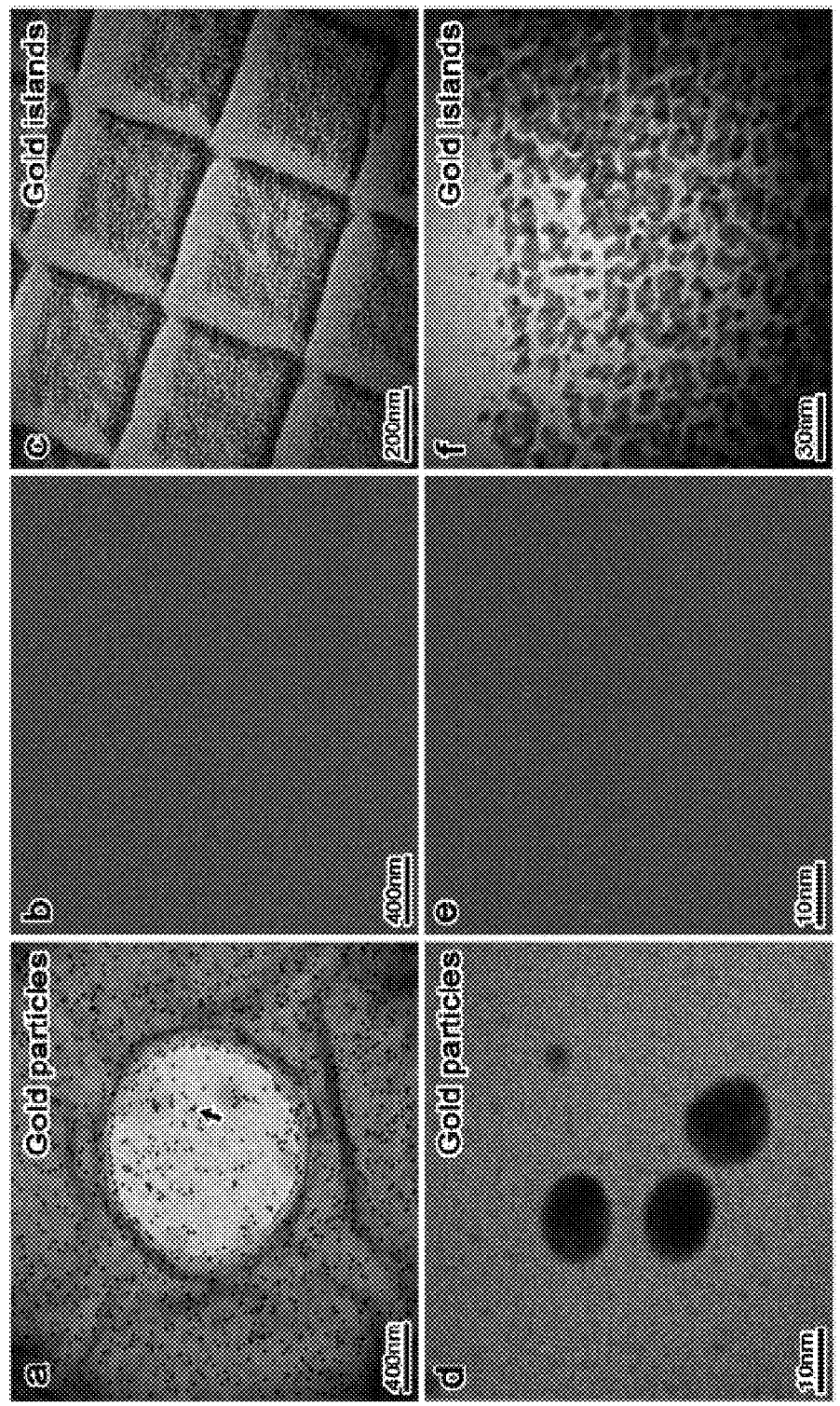
FIG. 2B shows images obtained with ultrafast electron pulses.

The following results demonstrate the capabilities of UEM2 in three areas: real-space imaging, diffraction, and electron energy resolution. Applications of the present invention are not limited to these particular examples. First discussed are the images recorded in the UEM mode, of gold particles and gold islands on carbon films. FIGS. 2Ba-f are UEM2 images obtained with ultrafast electron pulses. Shown are gold particles (a, d) and gold islands (c, f) on carbon films. UEM2 background images (b, e) obtained by blocking the photoelectron-extracting femtosecond laser pulses. For the UEM2 images of gold particles, we used the objective (contrast) aperture of 40 µm to eliminate diffracted beams, while no objective aperture was used for the gold-island images.

FIGS. 2Ba and 2Bd show gold particles of uniform size dispersed on a carbon film. From the higher magnification image of FIG. 2Bd, corresponding to the area indicated by the black arrow in FIG. 2Ba, it is found that the gold particles have a size of 15 nm, and the minimum particle separation seen in the image is 3 nm.

It should be noted that FIGS. 2Bb and 2Be were recorded under identical conditions to FIGS. 2Ba and 2Bd, respectively, but without cathode irradiation by the femtosecond laser pulses. No images were observed, demonstrating that non-optically generated electrons from our warm cathode were negligible. Similar background images with the light pulses blocked were routinely recorded and checked for all cathode conditions used in this study.

The waffle (cross line) spacing of the cross grating replica (gold islands) seen in FIG. 2Bc is known to be 463 nm. The gold islands are observed in FIG. 2Bf, where the bright regions correspond to the amorphous carbon support film and the dark regions to the nanocrystalline gold islands. It is found that the islands may be interconnected or isolated, depending on the volume fraction of the nanocrystalline phases.

To test the high-resolution capability of UEM utilizing phase contrast imaging, an organometallic compound, chlorinated copper phthalocyanine (hexadecachlorophthalocyanine, $C_{32}Cl_{16}CuN_8$), was investigated. The major spacings of lattice fringes of copper of this molecule in projection along the c-axis are known to be 0.88, 1.30, and 1.46 nm, with atomic spacings of 1.57 and 1.76 nm.

Figure 2C:
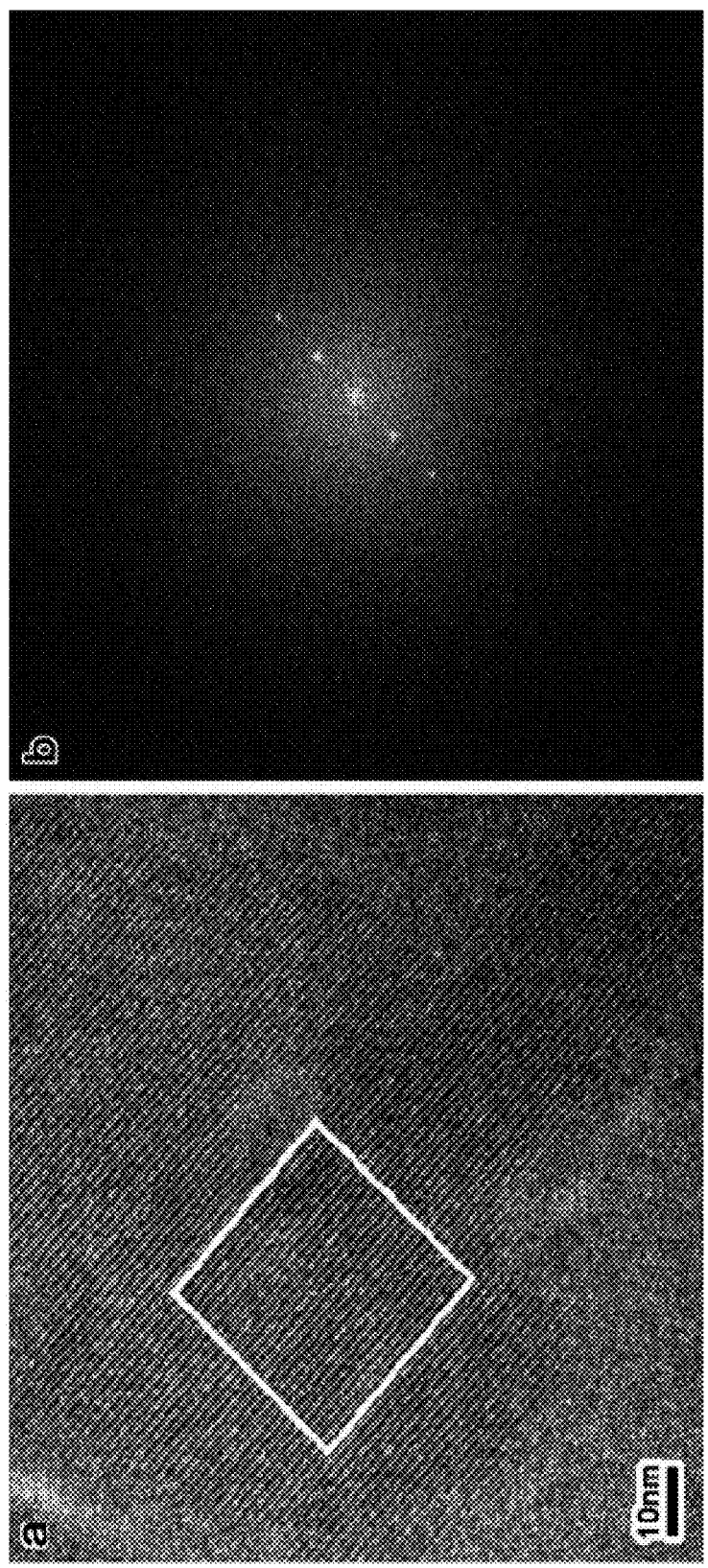
FIG. 2C shows high-resolution, phase-contrast images taken with the system of FIG. 2.

FIGS. 2Ca-b are high-resolution, phase-contrast UEM images. Shown are an image in FIG. 2Ca and digital diffractogram in FIG. 2Cb of an organometallic crystal of chlorinated copper phthalocyanine. The diffractogram was obtained by the Fourier transform of the image in FIG. 2Ca. The high-resolution image was taken near the Scherzer focus for optimum contrast, which was calculated to be 90.36 nm for a spherical aberration coefficient Cs of the objective lens of 2.26 mm. The objective aperture was not used.

Figure 2D:
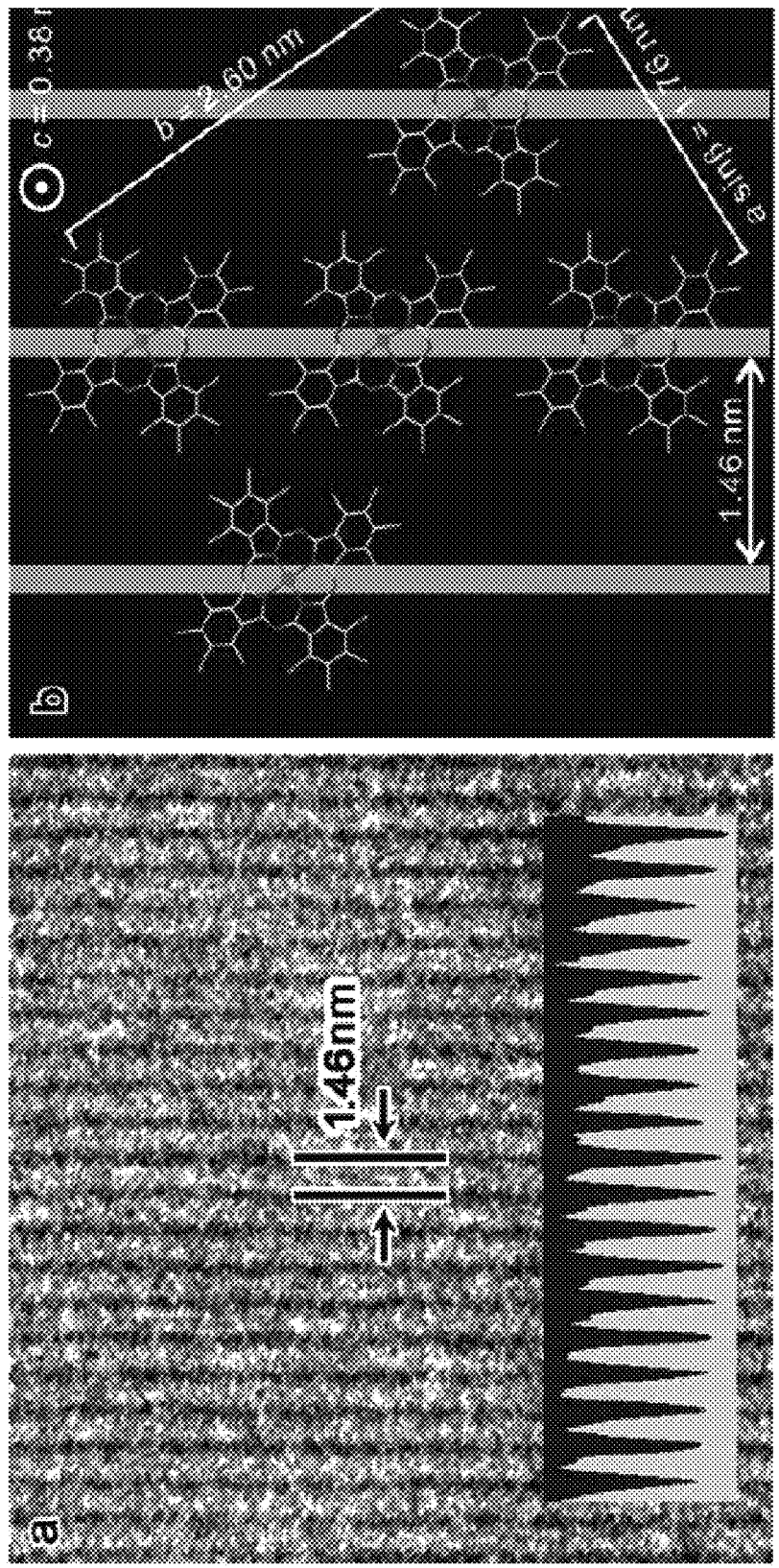
FIG. 2D shows high-resolution, phase contrast images of chlorinated copper pthalocyanine.

FIG. 2Da exhibits the lattice fringes observed by UEM, where the black lines correspond to copper layers parallel to the c-axis. The Fourier transform of FIG. 2Da is shown in FIG. 2Db, discussed below, and the clear reciprocity (without satellite peaks in the F.T.) indicates the high degree of order in crystal structure.

FIG. 2D shows high-resolution, phase-contrast UEM image and structure of chlorinated copper phthalocyanine. The high-resolution image shown in FIG. 2Da is a magnified view of the outlined area in FIG. 2Ca. The representation of the crystal structure shown in FIG. 2Db is shown in projection along the c axis, and the assignment of the copper planes observed in FIG. 2Da is indicated by the gray lines. The spheres are the copper atoms.

FIG. 2Da is an enlargement of the area outlined in FIG. 2Ca, clearly showing the lattice fringe spacing of 1.46 nm, corresponding to the copper planes highlighted in gray in FIG. 2Db, in which a unit cell is shown in projection along the c-axis. Regions without lattice fringes are considered to correspond to crystals with unfavorable orientation, or amorphous phases of phthalocyanine, or the carbon substrate. It is known that in high resolution images, the lattice fringes produced by the interference of two waves passing through the back focal plane, i.e., the transmitted and diffracted beams, are observed only in crystals where the lattice spacing is larger than the resolution of the TEM. In the profile inset of FIG. 2Da, it should be noted that the FWHM was measured to be approximately 7 Å, directly indicating that our UEM has the capability of sub-nanometer resolution.

The digital diffractogram obtained by the Fourier transform of the observed high-resolution image of FIG. 2Ca is shown in FIG. 2Cb. In the digital diffractogram, the peaks represent the fundamental spatial frequency of the copper layers (0.69 nm$^{-1}$), and higher harmonics thereof. A more powerful means of obtaining reciprocal-space information such as this is the direct recording of electron diffraction, also available in UEM.

Figure 2E:
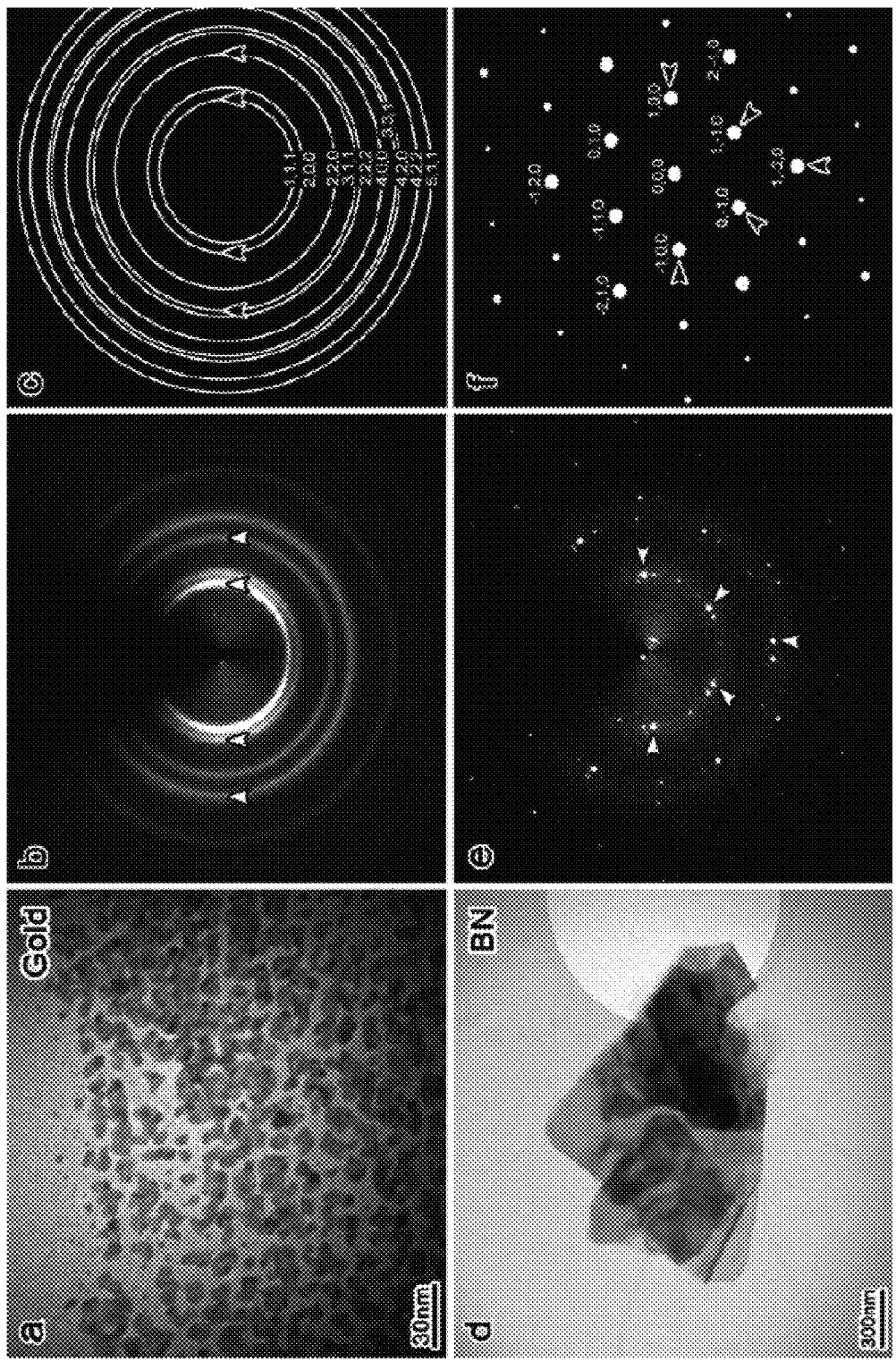
FIG. 2E shows images and electron diffraction patterns taken with the system of FIG. 2.

FIGS. 2Ea-f show measured and calculated electron diffraction patterns of gold islands and boron nitride (BN) on carbon films, along with the corresponding real-space images of each specimen, all recorded by UEM. Shown are images and measured and calculated electron diffraction patterns of gold islands (a,b,c) and boron nitride (BN) (d,e,f) on carbon films. The incident electron beam is parallel to the [001] direction of the BN. All diffraction patterns were obtained by using the selected-area diffraction (SAD) aperture, which selected an area 6 μm in diameter on the specimen. Representative diffraction spots were indexed as indicated by the arrowheads.

In FIG. 2Eb, the electron diffraction patterns exhibit Debye-Scherrer rings formed by numerous diffraction spots from a large number of face-centered gold nanocrystals with random orientations. The rings can be indexed as indicated by the white arrowheads. The diffraction pattern of BN in FIG. 2Ee is indexed by the hexagonal structure projected along the [001] axis as shown in FIG. 2Ef. It can be seen that there are several BN crystals with different crystal orientations, besides that responsible for the main diffraction spots indicated by the white arrowheads.

Figure 2F:
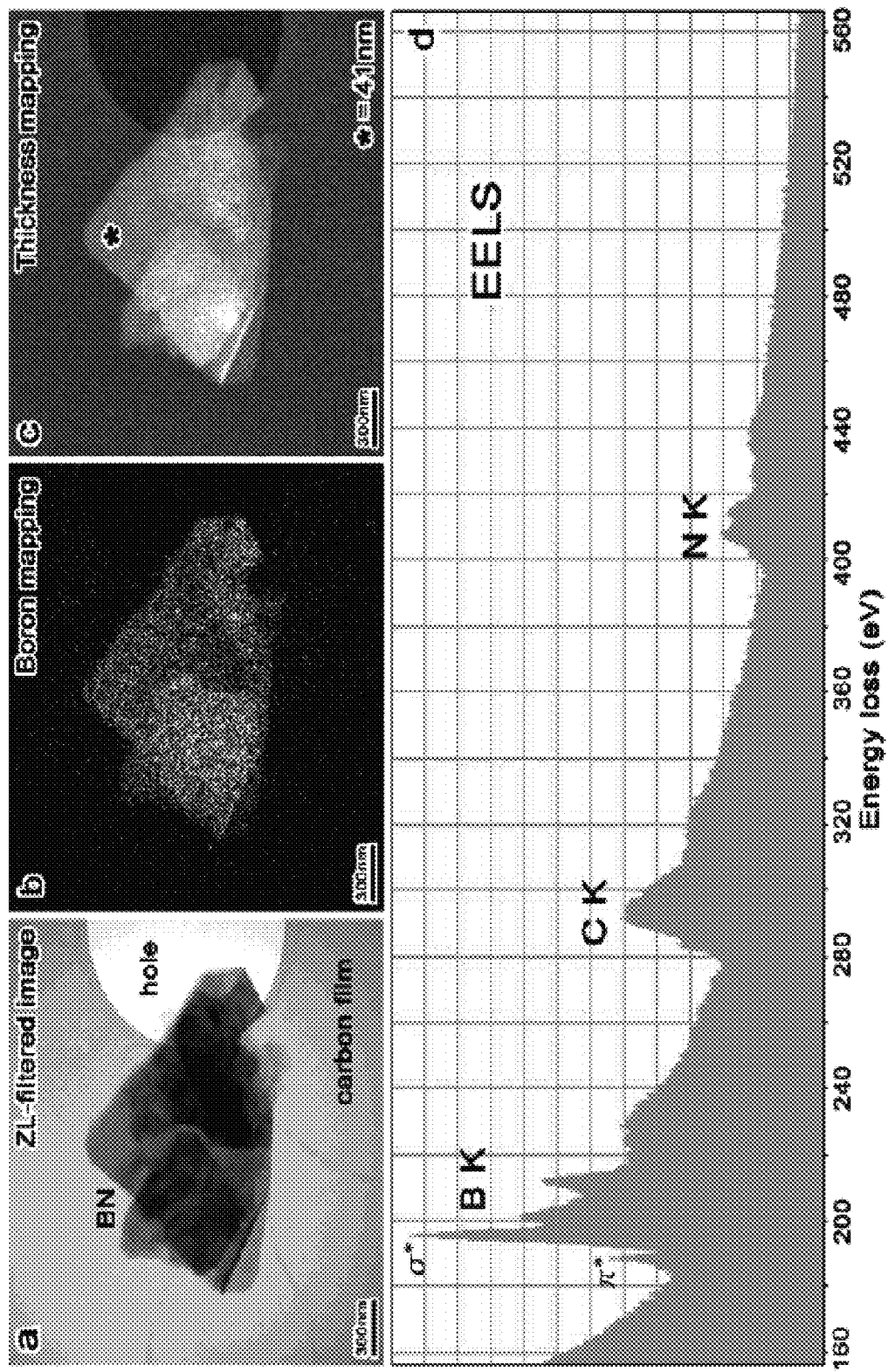
FIG. 2F shows energy-filtered UEM images and spectrum.

In order to explore the energy resolution of UEM, we investigated the BN specimen in detail by EELS and EFTEM. FIG. 2F shows energy-filtered UEM images and spectrum. FIG. 2F shows a zero-loss filtered image (FIG. 2Fa), boron K-edge mapping image (FIG. 2Fb), thickness mapping image (FIG. 2Fc), and corresponding electron-energy-loss (EEL) spectrum (FIG. 2Fd) of the boron nitride (BN) sample. The 5.0- and 1.0-mm entrance aperture were used for mapping images and EEL spectrum, respectively. The thickness at the point indicated by the asterisk in FIG. 2Fc is estimated to be 41 nm. ZL stands for zero-loss.

The boron map was obtained by the so-called three-window method. In the boron map of FIG. 2Fb, image intensity is directly related to areal density of boron. In the thickness map of FIG. 2Fc, the brightness increases with increasing thickness: d (thickness)=$\lambda(\beta)\ln(I_t/I_0)$, where $\lambda$ is the mean free path for inelastic scattering under a given collection angle $\beta$, $I_0$ is the zero-loss (ZL) peak intensity, and $I_t$ is the total intensity. The thickness in the region indicated by the asterisk in FIG. 2Fc was estimated to be 41 nm. In the EEL spectrum of FIG. 2Fd, the boron K-edge, carbon K-edge, and nitrogen K-edge are observed at the energy of 188, 284, and 401 eV, respectively. In the boron K-edge spectrum, sharp $\pi^*$ and $\sigma^*$ peaks are visible. The carbon K-edge spectrum is considered to result from the amorphous carbon film due to the existence of small and broad peaks at the position $\pi^*$ and $\sigma^*$, being quite different from spectra of diamond and graphite.

With the capabilities of the UEM2 system described herein, structural dynamics can be studied, as with UEM1, but with the new energy and spatial resolution are achieved here. Specimens will be excited in a T-jump or electronic excitation by the femtosecond laser pulses (FIG. 2A) scanned in time with respect to the electron packets which will probe the changes induced in material properties through diffraction, imaging, or electron energy loss in different regions, including that of Compton scattering. Also planned to be explored is the STEM feature in UEM, particularly the annular dark-field imaging, in which compositional changes are evident in the contrast (Z contrast). Such images are known to offer advantages over high-resolution TEM (relative insensitivity to focusing errors and ease of interpretation). Electron fluxes will be optimized either through changes of the impinging pulse fluence or by designing new photocathode materials. In this regard, with higher brightness the sub-angstrom limit should be able to be reached. The potential for applications in materials and biological research is rich.

Figure 3:
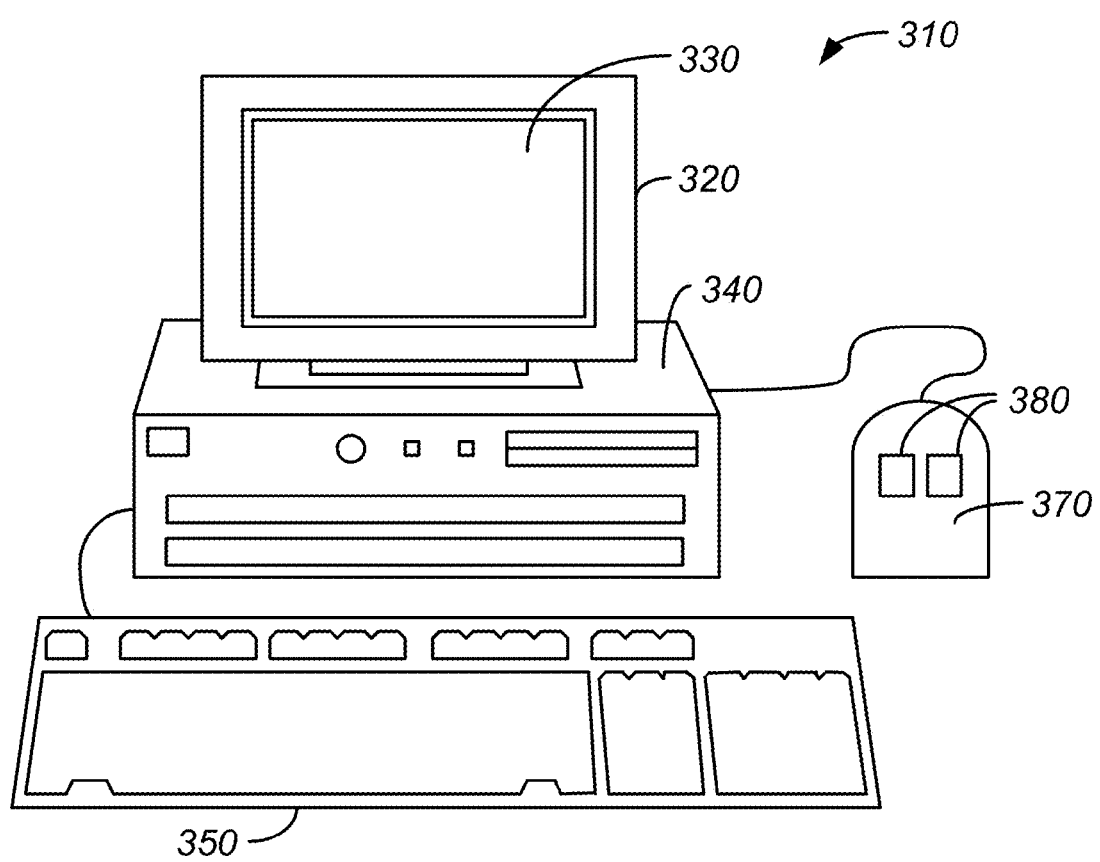
FIG. 3 is a simplified diagram of a computer system for controlling the 4D electron microscope system according to an embodiment of the present invention.

FIG. 3 is a simplified diagram of a computer system 310 that is used to oversee the system of FIGS. 1 and 2 according to an embodiment of the present invention. This diagram is merely an example, which should not unduly limit the scope of the claims herein. One of ordinary skill in the art would recognize many other modifications, alternatives, and variations. As shown, the computer system 310 includes display device 320, display screen 330, cabinet 340, keyboard 350, and mouse 370. Mouse 370 and keyboard 350 are representative "user input devices." Mouse 370 includes buttons 380 for selection of buttons on a graphical user interface device. Other examples of user input devices are a touch screen, light pen, track ball, data glove, microphone, and so forth.

The system is merely representative of but one type of system for embodying the present invention. It will be readily apparent to one of ordinary skill in the art that many system types and configurations are suitable for use in conjunction with the present invention. In a preferred embodiment, computer system 310 includes a Pentium™ class based computer, running Windows™ NT, XP, or Vista operating system by Microsoft Corporation. However, the system is easily adapted to other operating systems such as any open source system and architectures by those of ordinary skill in the art without departing from the scope of the present invention. As noted, mouse 370 can have one or more buttons such as buttons 380. Cabinet 340 houses familiar computer components such as disk drives, a processor, storage device, etc. Storage devices include, but are not limited to, disk drives, magnetic tape, solid-state memory, bubble memory, etc. Cabinet 340 can include additional hardware such as input/output (I/O) interface cards for connecting computer system 310 to external devices external storage, other computers or additional peripherals, which are further described below.

Figure 4:
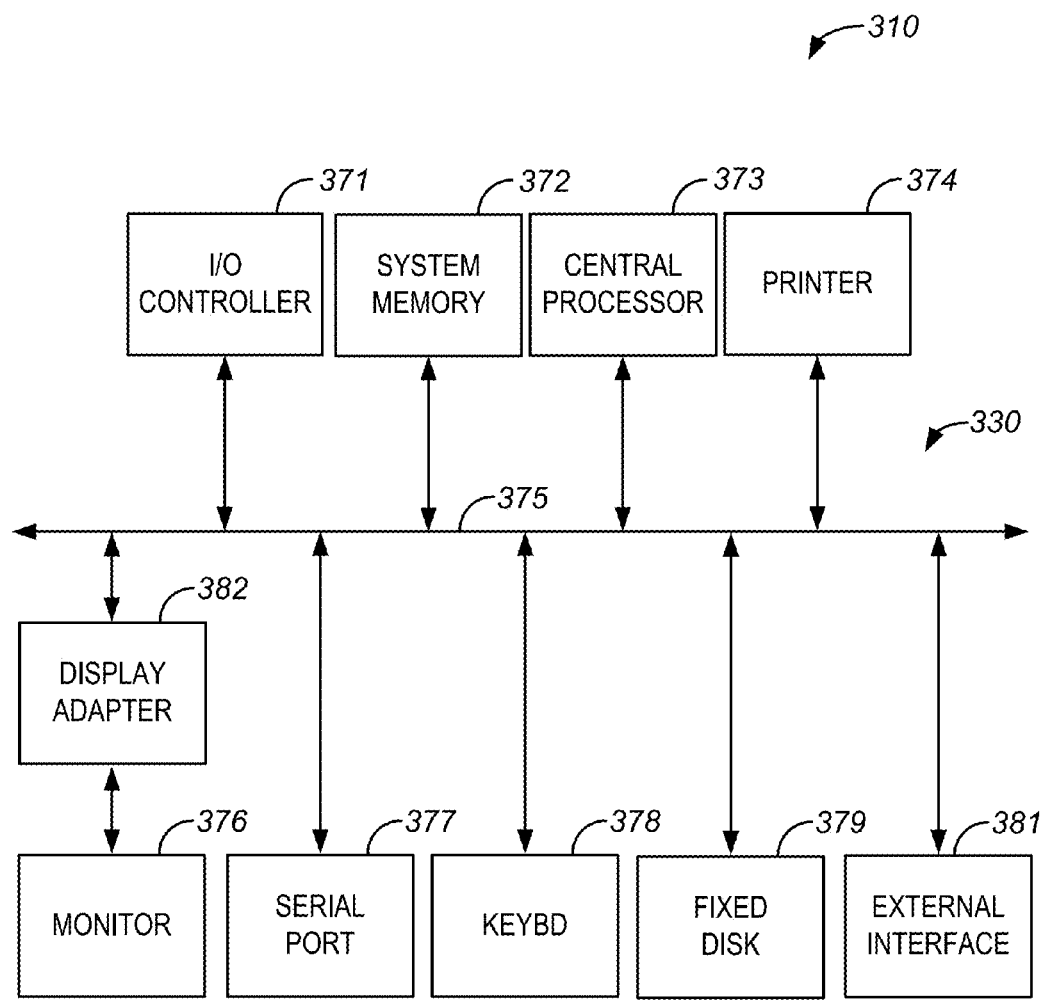
FIG. 4 is a simplified block diagram of computer hardware for controlling the 4D electron microscope system according to an embodiment of the present invention.

FIG. 4 is a more detailed diagram of hardware elements in the computer system of FIG. 3 according to an embodiment of the present invention. This diagram is merely an example, which should not unduly limit the scope of the claims herein. One of ordinary skill in the art would recognize many other modifications, alternatives, and variations. As shown, basic subsystems are included in computer system 310. In specific embodiments, the subsystems are interconnected via a system bus 375. Additional subsystems such as a printer 374, keyboard 378, fixed disk 379, monitor 376, which is coupled to display adapter 382, and others are shown. Peripherals and input/output (I/O) devices, which couple to I/O controller 371, can be connected to the computer system by any number of means known in the art, such as serial port 377. For example, serial port 377 can be used to connect the computer system to a modem 381, which in turn connects to a wide area network such as the Internet, a mouse input device, or a scanner. The interconnection via system bus allows central processor 373 to communicate with each subsystem and to control the execution of instructions from system memory 372 or the fixed disk 379, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Although the above has been illustrated in terms of specific hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Further details of the functionality, which may be carried out using a combination of hardware and/or software elements, of the present invention can be outlined below according to the figures.

Embodiments of the present invention enable ultrafast imaging with applications in studies of structural and morphological changes in single-crystal gold and graphite films, which exhibit entirely different dynamics, as discussed below. For both, the changes were initiated by in situ femtosecond impulsive heating, while image frames and diffraction patterns were recorded in the microscope at well-defined times following the temperature-jump. The time axis in the microscope is independent of the response time of the detector, and it is established using a variable delay-line arrangement; a 1-μm change in optical path of the initiating (clocking) pulse corresponds to a time step of 3.3 fs.

Figure 5:
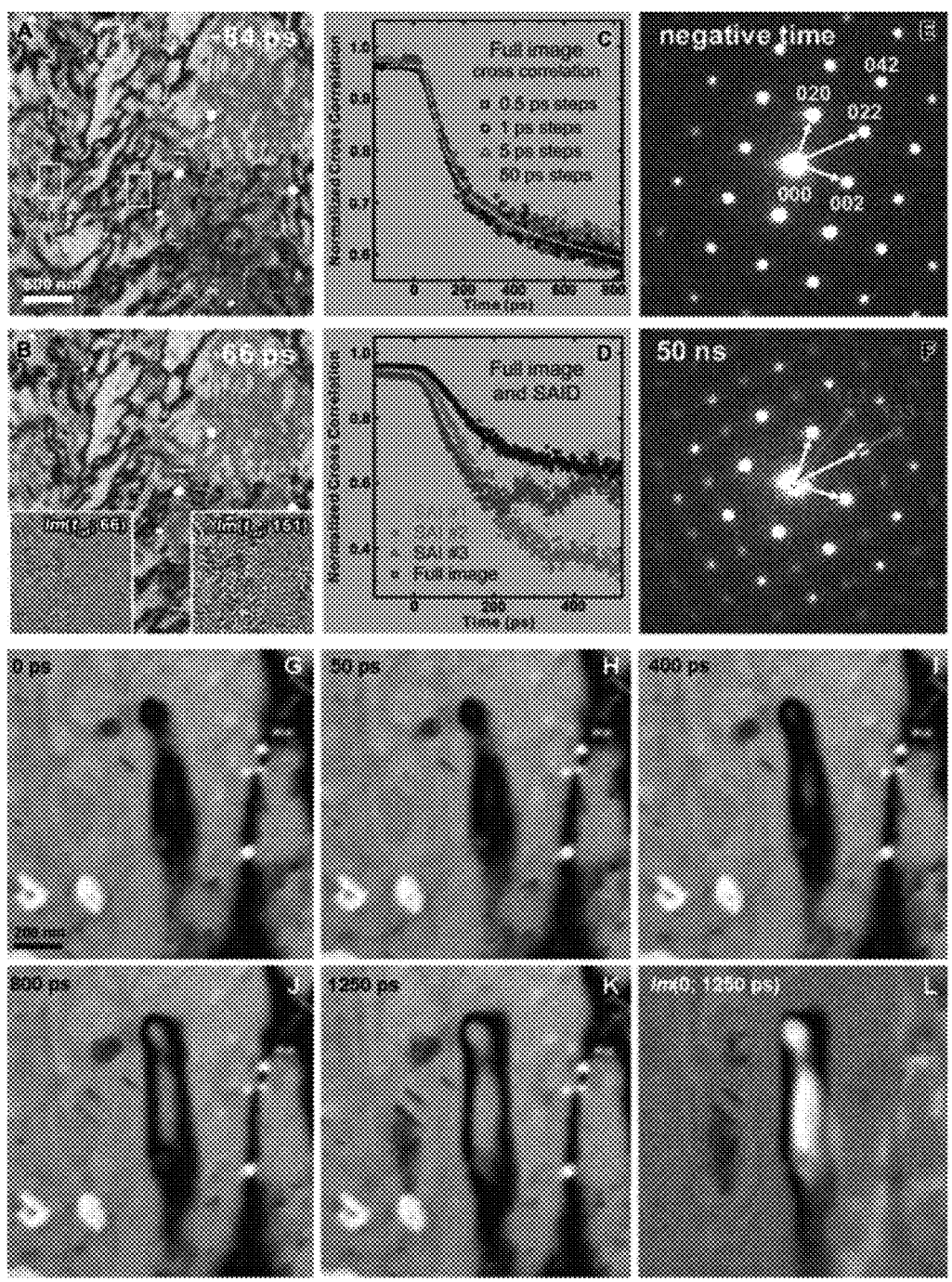
FIG. 5 illustrates time-resolved images, image cross-correlations, and diffraction for a gold specimen according to an embodiment of the present invention.

FIG. 5 illustrates both time-resolved images and diffraction. In this example, the images in FIGS. 5A and 5B were obtained stroboscopically at several time delays after heating with the fs pulse (fluence of 1.7 mJ/cm$^2$). The specimen is a gold single crystal film mounted on a standard 3-mm 400-mesh grid. Shown are the bend contours (dark bands), {111}twins (sharp straight white lines) and holes in the sample (bright white circles). The insets in FIG. 5B are image-difference frames Im($t_{ref}$; t) with respect to the image taken at −84 ps. The gold thickness was determined to be 8 nm by electron energy loss spectroscopy (EELS).

FIG. 5C illustrates the time dependence of image cross-correlations of the full image from four independent scans taken with different time steps. A fit to biexponential rise of the 1 ps step scan is drawn, yielding time constants of 90 ps and 1 ns. FIG. 5D illustrates the time dependence of image cross-correlations at 1 ps time steps for the full image and for selected regions of interest SAI #1, #2, and #3, as shown in FIG. 5A. FIGS. 5E and 5F are diffraction patterns obtained using a single pulse of 6×10$^6$ electrons at high peak fluence (40 mJ/cm$^2$) and selected-area aperture of 25 μm diameter. Two frames are given to indicate the change. Diffraction spots were indexed and representative indices are shown as discussed below.

FIGS. 5A and 5B illustrate representative time-framed images of the gold nanocrystal using the fs excitation pulses at a repetition rate of 200 kHz and peak excitation fluence of ~1.7 mJ/cm$^2$. In FIG. 5A, taken at −84 ps, before the clocking pulse (t=0), typical characteristic features of the single crystal gold in the image are observed: twins and bend contours. Bend contours, which appear as broad fuzzy dark lines in the image, are diffraction contrast effects occurring in warped or buckled samples of constant thickness. In the dark regions, the zone axis (the crystal [100]) is well aligned with the incident electron beam and electrons are scattered efficiently, whereas in the lighter regions the alignment of the zone axis deviates more and the scattering efficiency is lower. Because bend contours generally move when deformation causes tilting of the local crystal lattice, they provide in images a sensitive visual indicator of the occurrence of such deformations.

At positive times, following t=0, visual dynamical changes are observed in the bend contours with time steps from 0.5 ps to 50 ps. A series of such image frames with equal time steps provide a movie of the morphological dynamics. To more clearly display the temporal evolution, image-difference frames were constructed. Depicted as insets in the images of FIG. 5B, are those obtained when referencing to the −84 ps frame; for t=+66 ps and +151 ps. In the difference images, the regions of white or black directly indicate locations of surface morphology change (bend contour movement), while gray regions are areas where the contrast is unchanged from that of the reference frame. It is noted that the white and black features in the difference images are nm-scale dynamical change, indicating the size of the induced deformations. Care was taken to insure the absence of long-term specimen drifts as they can cause apparent contrast change.

To quantify the changes in the image the following method of cross-correlation was used. The normalized cross correlation of an image at time t with respect to that at time t' is expressed as:

$$\gamma(t) = \frac{\sum_{x,y} C_{x,y}(t) C_{x,y}(t')}{\sqrt{\sum_{x,y} C_{x,y}(t)^2 \sum_{x,y} C_{x,y}(t')^2}}$$

where the contrast $C_{x,y}(t)=[I_{x,y}(t)-\bar{I}(t)]/\bar{I}(t)$; $I_{x,y}(t)$ and $I_{x,y}(t')$ are the intensities of pixels at the position of (x,y) at times t and t', and Ī(t) and Ī(t') are the means of $I_{x,y}(t)$ and $I_{x,y}(t')$, respectively. This correlation coefficient γ(t) is a measure of the temporal change in "relief pattern" between the two images being compared, which can be used as a guide to image dynamics as a function of time. Two types of cross-correlation plots were made, those referenced to a fixed image frame before t=0 and others that show correlation between adjacent time points. (Another quantity that shows time dependence qualitatively similar to that of the image cross-correlation is the standard deviation of pixel intensity in difference images).

FIGS. 5C and 5D show the cross-correlation values between the image at each measured time point and a reference image recorded before the arrival of the clocking pulse. The experiments were repeated, for different time-delay steps (500 fs, 1 ps, 5 ps, and 50 ps), and similar results were obtained, showing that morphology changes are completely reversible and reproducible over each 5 μs inter-pulse interval. The adjacent-time cross-correlations reveal the timescales for intrinsic changes in the images, which disappear for time steps below 5 ps, consistent with full-image rise in time. Over all pixels, the time scale for image change covers the full range of time delay, from ps to ns, indicating the collective averaging over sites of the specimen; as shown in FIG. 5C the overall response can be fit to two time constants of 90 ps and 1 ns.

The power of selected area image dynamics (SAID) is illustrated when the dynamics of the bend contours are followed in different selected areas of the image, noted in the micrographs as SAI #1, 2, and 3. The corresponding image cross-correlations (FIG. 5D) have different shape and amplitude from each other and from the full image correlation. The large differences observed here and for other data sets, including onsets delayed in time and sign reversals, indicate the variation in local deformation dynamics. In FIGS. 5G-L, a time-resolved SAI at higher magnification is depicted. A broad and black "penguin-like" contour is observed as the dominant feature of this area. As shown in the frames, a colossal response to the fs heating is noted. The gray region inside the black contour appears and broadens with time. Also, a new black contour above the large central white hole begins to be evident at 1200 ps, and gains substantial intensity over the following 50 ps. All frames taken can be used to construct a movie of SAID.

The observed SAID changes correspond to diffraction contrast (bright-field) effects in bend contours, as mentioned above. It is known that the shape of bend contours can be easily altered by sample tilting or heating inside the microscope. However, here in the ultrafast electron microscope (UEM) measurements, the changes in local tilt are transient in nature, reflecting the temporal changes of morphology and structure. Indeed, when the experiments were repeated in the TEM mode of operation, i.e., for the same heating laser pulse and same scanning time but with continuous electron probe beam, no image change was observed. This is further supported by the change in diffraction observed at high fluences and shown in FIGS. 5E and 5F for two frames, at negative time and at +50 ns; in the latter, additional Bragg spots are visible, a direct evidence of the transient structural change due to bulging at longer times.

Whereas real-space imaging shows the time-dependent morphology, the selected area diffraction dynamics (SADD) patterns provide structural changes on the ultrashort timescale. Because the surface normal of the film is parallel to the [100] zone axis, the diffraction pattern of the sample was properly indexed by the face-centered-cubic (fcc) structure projected along the [100] zone axis at zero tilt angle (see FIG. 5E). From the positions of the spots in FIG. 5F, which are reflections from the {113} and {133}planes, forbidden in the [100] zone-axis viewing, we measured the interplanar spacings to be 1.248 and 0.951 Å, respectively. With selected area diffraction, Bragg peak separations, amplitudes, and widths were obtained as a function of time. The results indicate different timescales from those of image dynamics.

FIG. 6A illustrates structural dynamics and heat dissipation in gold and FIG. 6B illustrates coherent resonance of graphite. Referring to FIG. 6A, SADD for fs excitation at 1.7 mJ/cm² peak fluence (519 nm) is illustrated. The Bragg separation for all peaks and the amplitude of the {042}peaks are shown in the main panel; the inset gives the 2.2 μs recovery (by cooling) of the structure obtained by stroboscopic ns excitation at 7 mJ/cm². The peak amplitude has been normalized to the transmitted beam amplitude, and the time dependence of amplitude and separation is fit as an exponential rise, and a delay with rise, respectively. Referring to FIG. 6B, resonance oscillations are observed for the Bragg (1 2̄2) peak in the diffraction pattern of graphite; the amplitudes are similar in magnitude to those in FIG. 6A. The sample was tilted at 21° angle to the microscope axis and the diffraction pattern was obtained by using the SAD aperture of 6 μm diameter on the specimen. The graphite thickness is 69 nm as determined by EELS; the oscillation period ($\tau_p$) is measured to be 56.3 ps. For a thickness of 45 nm, the period is found to be $\tau_p$=35.4 ps.

FIGS. 6D-G illustrate, for selected areas, time dependence of intensity difference (dark-field) for graphite. The image change displays the oscillatory behavior with the same $\tau_p$ as that of diffraction. The dark-field (DF) images were obtained by selecting the Bragg (1 2̄2) peak. In FIG. 6H, each line corresponds to the difference in image intensities, Im(t−30 ps; t), for selected areas of 1×100-pixel slices parallel to contrast fringes in the DF image.

The average amplitude of {042}diffraction peaks drop significantly; the rise time is 12.9 ps, whereas the change in separations of all planes is delayed by 31 ps and rises in 60 ps. The delay in the onset of separation change with respect to amplitude change is similar to the timescale for the amplitude to reach its plateau value of 15% reduction in the case of the {042}amplitude shown. In order to determine the recovery time of the structure, we carried out stroboscopic (and also single-pulse) experiments over the timescale of microseconds. The recovery transient in the inset of FIG. 6A (at 7 mJ/cm²) gives a time constant of 2.2 μs; we made calculations of 2D lateral heat transport with thermal conductivity (λ=3.17 W/(cm K) at 300 K) and reproduced the observed timescale. For this fluence, the maximum lattice spacing change of 0.08% gives the temperature increase ΔT to be 60 K, knowing the thermal expansion coefficient of gold (α=14.2×10⁻⁶ K⁻¹).

The atomic-scale motions, which lead to structural and morphological changes, can now be elucidated. Because the specimen is nanoscale in thickness, the initial temperature induced is essentially uniform across the atomic layers and heat can only dissipate laterally. It is known that for metals the lattice temperature is acquired following the large increase in electron temperature. The results in FIG. 6A give the temperature rise to be 13 ps; from the known electron and lattice heat-capacity constants [$C_1$=70 J/(m³ K²) and $C_2$=2.5×10⁶ J/(m³ K), respectively] and the electron-phonon coupling [g=2×10¹⁶ W/(m³ K)] we obtained the initial heating time to be ~10 ps for electron temperature $T_1$=2500 K, in good agreement with the observed rise. Reflectivity measurements do not provide structural information, but they give the temperature rise. For bulk material, the timescale for heating (~1 ps) is shorter than that of the nano-scale specimen (~10 ps), due to confinement in the latter, which limits the ballistic motion of electrons in the specimen, and this is evident in the UEM studies. Because the plane separation is 0.4078 nm, the change of the average peak separation (0.043%), at the fluence of 1.7 mJ/cm², gives a lattice constant change of 0.17 pm.

Up to 30 ps the lattice is hot but, because of macroscopic lattice constraint, the atomic stress cannot lead to changes in lateral separations, which are the only separations visible for the [100] zone-axis probing. However, the morphology warping change is correlated with atomic (lateral) displacements in the structure as it relieves the structural constraint. Indeed the time scale of the initial image change is similar to that of plane separations in diffraction (60-90 ps). This initial warping, which changes image contrast, is followed by longer time (ns) minimization of surface energy and bulging, as shown in FIG. 5D. Given the picometer-scale structural change (0.17 pm), the stress over the 8-nanometer specimen gives the total expansion to be 3.4 pm over the whole thickness. Considering the influence of lateral expansion, the maximum bulge reaches 1 to 10 nm depending on the lateral scale. Finally, the calculated Debye-Waller factor for structural changes gives a temperature of 420 K ($\Delta T$=125 K), in excellent agreement with lattice temperature derived under similar conditions, noting that for the nanoscale material the temperature is higher than in the bulk.

Graphite was another study in the application of the UEM methodology. In contrast to the dynamics of gold, in graphite, because of its unique 2D structure and physical properties, we observed coherent resonance modulations in the image and also in diffraction. The damped resonance of very high frequency, as shown below, has its origin in the nanoscale dimension of the specimen and its elasticity. The initial fs pulse induces an impulsive stress in the film and the ultrafast electron tracks the change of the transient structure, both in SAID and SADD. In FIG. 6B, the results obtained by measuring changes of the diffraction spot ($1\bar{2}2$) are displayed and in FIGS. 6D-G those obtained by dark-field (DF) imaging with the same diffraction spot being selected by the objective aperture and the specimen tilted, as discussed below.

For both the image and diffraction, a strong oscillatory behavior is evident, with a well defined period and decaying envelope. When the transients were fitted to a damped resonance function [(cos $2\pi/\tau_p$)exp($-t/\tau_{decay}$)], we obtained $\tau_p$=56.3±1 ps for the period. The decay of the envelope for this particular resonance is significantly longer, $T_{decay}$=280 ps. This coherent transient decay, when Fourier transformed, indicates that the length distribution of the film is only ±2 nm as discussed in relation to the equation below. The thickness of the film was determined (L=69 nm) using electron energy loss spectra (EELS).

In order to test the validity of this resonance behavior we repeated the experiments for another thickness, L=45 nm. The period indeed scaled with L, giving $\tau_p$=35.4 ps. These, hitherto unobserved, very high frequency resonances (30 gigahertz range) are unique to the nanoscale length of graphite. They also reflect the (harmonic) motions due to strain along the c-axis direction, because they were not observed when we repeated the experiment for the electron to be along the [001] zone axis. The fact that the period in the image is the same as that of the diffraction indicates the direct correlation between local atomic structure and macroscopic elastic behavior.

Following a fs pulse of stress on a freely vibrating nanofilm, the observed oscillations, because of their well-defined periods, are related to the velocity (C) of acoustic waves between specimen boundaries, which in turn can be related to Young's modulus (Y) of the elastic stress-strain profile:

$$\frac{1}{\tau_p} = \frac{nC}{2L} = \frac{n}{2L}\left(\frac{Y}{\rho}\right)^{1/2},$$

where n is a positive integer, with n=1 being the fundamental resonance frequency (higher n are for overtones). Knowing the measured r, and L, we obtained C=2.5×10⁵ cm/s. For graphite with the density $\rho$=2.26 g/cm³, Y=14.6 gigapascal for the c-axis strain in the natural specimen examined. Pyrolytic graphite has Y values that range from about 10 to 1000 gigapascal depending on the orientation, reaching the lowest value in bulk graphite and the highest one for graphene. The real-time measurements reported here can now be extended to different length scales, specimens of different density of dislocations, and orientations, exploring their influence at the nanoscale on C, Y, and other properties. We note that selected-area imaging was critical as different regions have temporally different amplitudes and phases across the image.

Uniting the power of spatial resolution of EM with the ultrafast electron timing in UEM provides an enormous advantage when seeking to unravel the elementary dynamics of structural and morphological changes. With total dissipation of specimen heat between pulses, selected-area dynamics make it possible to study the changes in seconds of recording and for selected pixels of the image. In the applications given here, for both gold and graphite, the difference in timescales for the nonequilibrium temperature (reaching $10^{13}$ K/s), the structural (pm scale) and morphological (nm scale) changes, and the ultrafast coherent (resonance) behavior (tens of gigahertz frequency) of materials structure illustrate the potential for other applications, especially when incorporating the different and valuable variants of electron microscopy as we have in our UEM.

Embodiments of the present invention extend ultrafast 4D diffraction and microscopy to the attosecond regime. As described herein, embodiments use attosecond electron diffraction to observe attosecond electron motion. Pulses are freely generated, compressed, and tilted. The approach can be implemented to extend previous techniques including, for example phase transformations, chemical reactions, nanomechanical processes, and surface dynamics, and possibly to other studies of melting processes, coherent phonons, gold particles, and molecular alignment.

As described herein, the generation of attosecond resolution pulses and in situ probing through imaging with free electrons. Attosecond diffraction uses near mono-energetic attosecond electron pulses for keV-range of energies in free space and thus space charge effects are considered. Additionally, spatiotemporal synchronization of the electron pulses to the pump pulses is made along the entire sample area and with attosecond precision. Diffraction orders are shown to be sensitive to the effect of electron displacement and conclusive of the four-dimensional dynamics.

A component of reaching attosecond resolution with electron diffraction is the generation of attosecond electron pulses in "free space," so that diffraction from freely chosen samples of interest can take place independent of the mechanisms of pulse generation. Electrons with energies of 30-300 keV are ideal for imaging and diffraction, because of their high scattering cross sections, convenient diffraction angles, and the appropriate de Broglie wavelength (0.02 to 0.07 Å) to resolve atomic-scale changes. Moreover, they have a high degree of monochromaticity. For example, electrons accelerated to $E_0$=30-300 keV with pulse duration of 20 attoseconds (bandwidth of $\Delta E \approx 30$ eV) have $\Delta E/E_0 \approx 10^{-3}$-$10^{-4}$, making diffraction and imaging possible without a spread in angle and resolution. Optical attosecond pulses have typically $\Delta E/E_0 \approx 0.5$ and because of this reach of $\Delta E$ to $E_0$, their duration is Fourier-limited to ~100 attoseconds. Free electron pulses of keV central energy can, in principle, have much shorter duration, down to sub-attoseconds, while still consisting of many wave cycles.

Figure 7A:
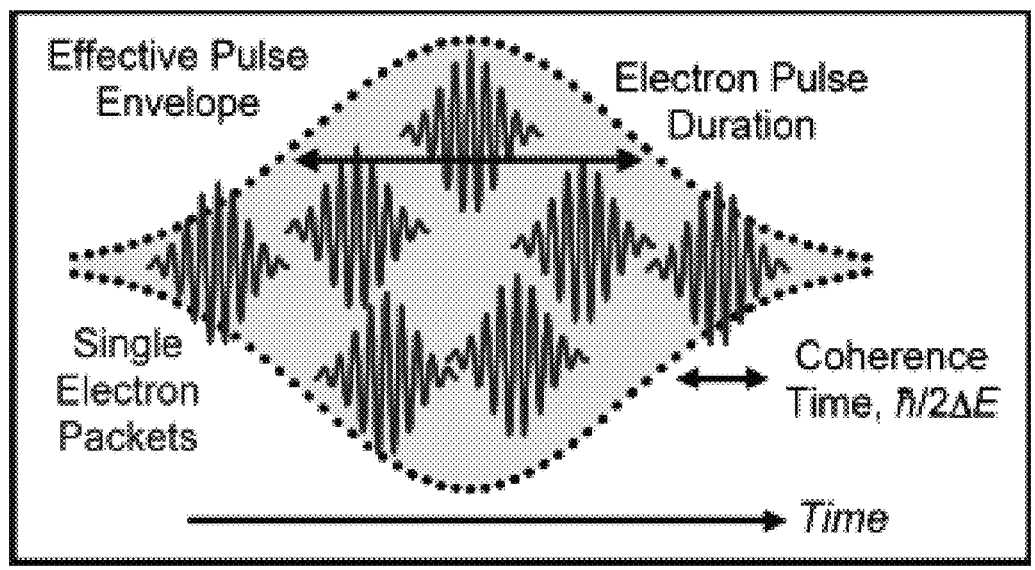
FIG. 7A illustrates single-electron packets and an electron pulse according to an embodiment of the present invention.

Pulses with a large number of electrons suffer from the effect of space charge, which determines both the spatial and the temporal resolutions. This can be avoided by using packets of single, or only a few, electrons in a high repetition rate, as demonstrated in 4D microscopy imaging. FIG. 7A depicts the relation of single electron packets to the effective envelope due to statistics. Each single electron (blue) is a coherent packet consisting of many cycles of the de Broglie wave and has different timing due to the statistics of generation. On average, multiple single electron packets form an effective electron pulse (dotted envelope). It will be appreciated that there is high dispersion for electrons of nonrelativistic energy. The small but unavoidable bandwidth of an attosecond electron pulse causes the pulse to disperse during propagation in free space, even when no space charge forces are present. For example, a 20-attosecond pulse with $\Delta E/E_0 = 10^{-3}$ would stretch to picoseconds after just a few centimeters of propagation.

Embodiments of the present invention provide methods and systems for the suppression of dispersion and the generation of free attosecond electron pulses based on the initial preparation of negatively-chirped electron packets. As described herein, femtosecond electron pulses are generated by photoemission and accelerated to keV energies in a static electric field. Preceding the experimental interaction region, optical fields are used to generate electron packets with a velocity distribution, such that the higher-energy parts are located behind the lower-energy ones. With a proper adjustment of this chirp, the pulse then self-compresses to extremely short durations while propagating towards the point of diffraction. To achieve attosecond pulses, the chirp must be imprinted to the electron pulse on a nanometer length scale. Optical waves provide such fields. However, non-relativistic electrons move significantly slower than the speed of light (e.g. ~0.3 c for 30 keV). The direct interaction with an optical field will, therefore, cancel out over time and can not be used to accelerate and decelerate electrons for compression. In order to overcome this limitation, we make use of the ponderomotive force, which is proportional to the gradient of the optical intensity to accelerate electrons out of regions with high intensity. By optical wave synthesis, intensity profiles can be made that propagate with less than the speed of light and, therefore, allow for co-propagation with the electrons.

Figure 7B:
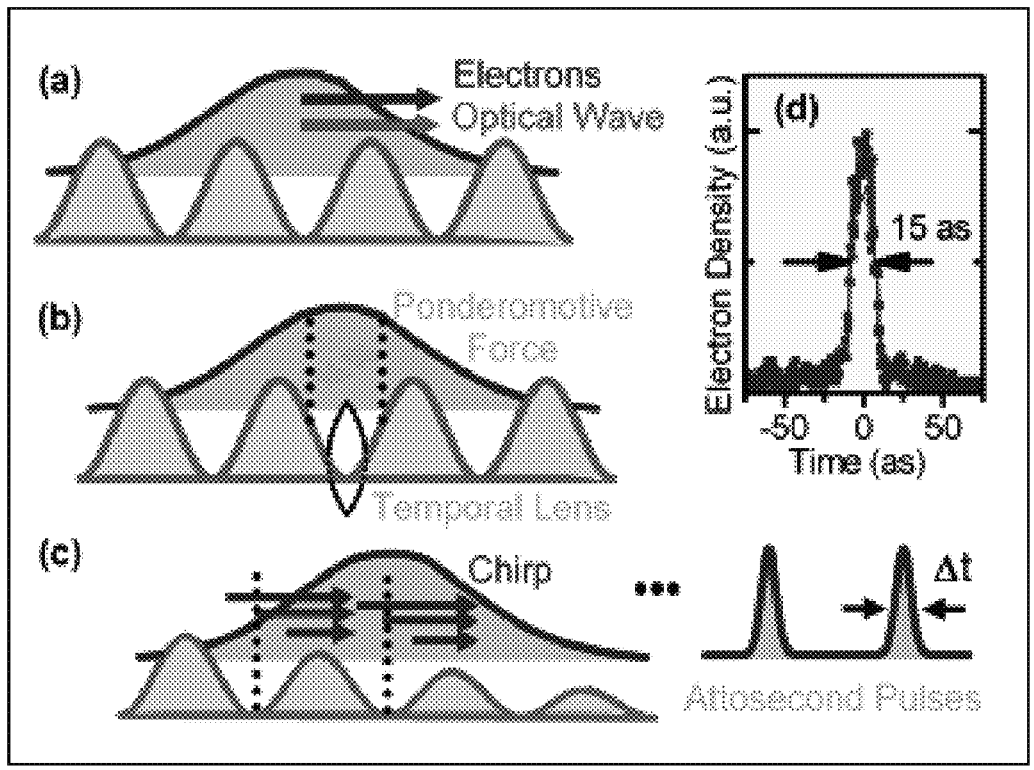
FIG. 7B illustrates temporal optical gratings for the generation of free attosecond electron pulses according to an embodiment of the present invention.

FIG. 7B illustrates a schematic of attosecond pulse generation according to an embodiment of the present invention. A synthesized optical field of two counter-propagating waves of different wavelengths results in an effective intensity grating, similar to a standing wave, which moves with a speed slower than the speed of light. Electrons can, therefore, co-propagate with a matched speed and are accelerated or decelerated by the ponderomotive force according to their position within the wave. After the optical fields have faded away, this velocity distribution results in self-compression; the attosecond pulses are formed in free space. Depending on the optical pulse intensity, the electron pulse duration can be made as short as 15 attoseconds, and, in principle, shorter durations are achievable. If the longitudinal spatial width of the initial electron pulse is longer than the wavelength of the intensity grating, multiple attosecond pulses emerge that are located with well-defined spacing at the optical minima. This concept of compression can be rigorously described analytically as a "temporal lens effect." The temporal version of the Kapitza-Dirac effect has an interesting analogy.

Some of our initial work was based on an effective ponderomotive force in a collinear geometry. In order to extend the approach to more complex arrangements, here we generalize the approach and consider the full spatiotemporal (electric and magnetic) fields of two colliding laser waves with an arbitrary angle and polarization. The transversal and longitudinal fields of a Gaussian focus were applied. We simulated electron trajectories by applying the Lorentz force with a fourth-order Runge-Kutta algorithm using steps of 100 attoseconds. Space charge effects were taken into account by calculating the Coulomb interactions between all single electrons for each time step (N-body simulations).

FIG. 7B illustrates temporal optical gratings for the generation of free attosecond electron pulses for use in diffraction. (a) A femtosecond electron packet (blue) is made to co-propagate with a moving optical intensity grating (red). (b) The ponderomotive force pushes electron towards the minima and thus creates a temporal lens. (c) The induced electron chirp leads to compression to attosecond duration at later time. (d) The electron pulse duration from $10^5$ trajectories reaches into the domain of few attoseconds.

Figure 7C:
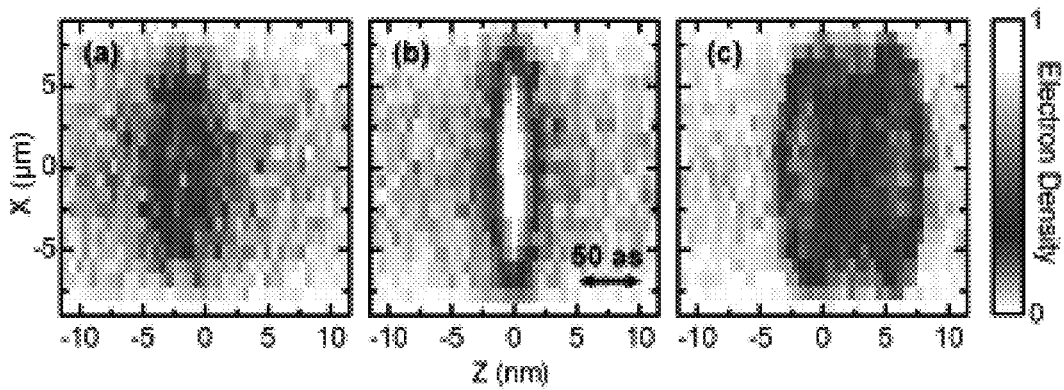
FIG. 7C illustrates spatiotemporal compression dynamics of attosecond electron pulses embodiment of the present invention.

FIG. 7C depicts the compression of single electron packets in the combined field of two counter-propagating laser pulses with durations of 300 fs at wavelengths of 1040 nm and 520 nm. The pulse is shown just before, at, and after the time of best compression; the center along Z is shifted for clarity. The plotted pulse shape is a statistical average over $10^5$ packets of single electrons. The beam diameter of the initial electron packet was 10 μm and the beam diameters of the laser pulses were 60 μm; the resulting compression dynamics is depicted before, just at, and some time after the time of best compression to a duration of 15 attoseconds (see FIG. 7C(b)). These results show that an optical wave with a beam diameter of only several times larger than that of the electron packet is sufficient to result in almost homogeneous compression along the entire electron beam. The characteristic longitudinal spread after the point of best compression, as depicted in FIG. 7C is the result of an "M"-shaped energy spectrum of the electrons after interactions with the sinusoidal intensity grating.

Coulomb forces prevent concentration of a large number of electrons in a limited volume, and a compromise between electron flux and laser repetition rate must be found to achieve sufficiently intense diffraction. The laser pulses for compression have energies on the order of 5 μJ and can, therefore, be generated at MHz repetition rates with the resulting flux of $10^6$ electrons/s, which is sufficient for conclusive diffraction. Nevertheless, having more than one electron per attosecond pulse is beneficial for improving the total flux.

Figure 8:
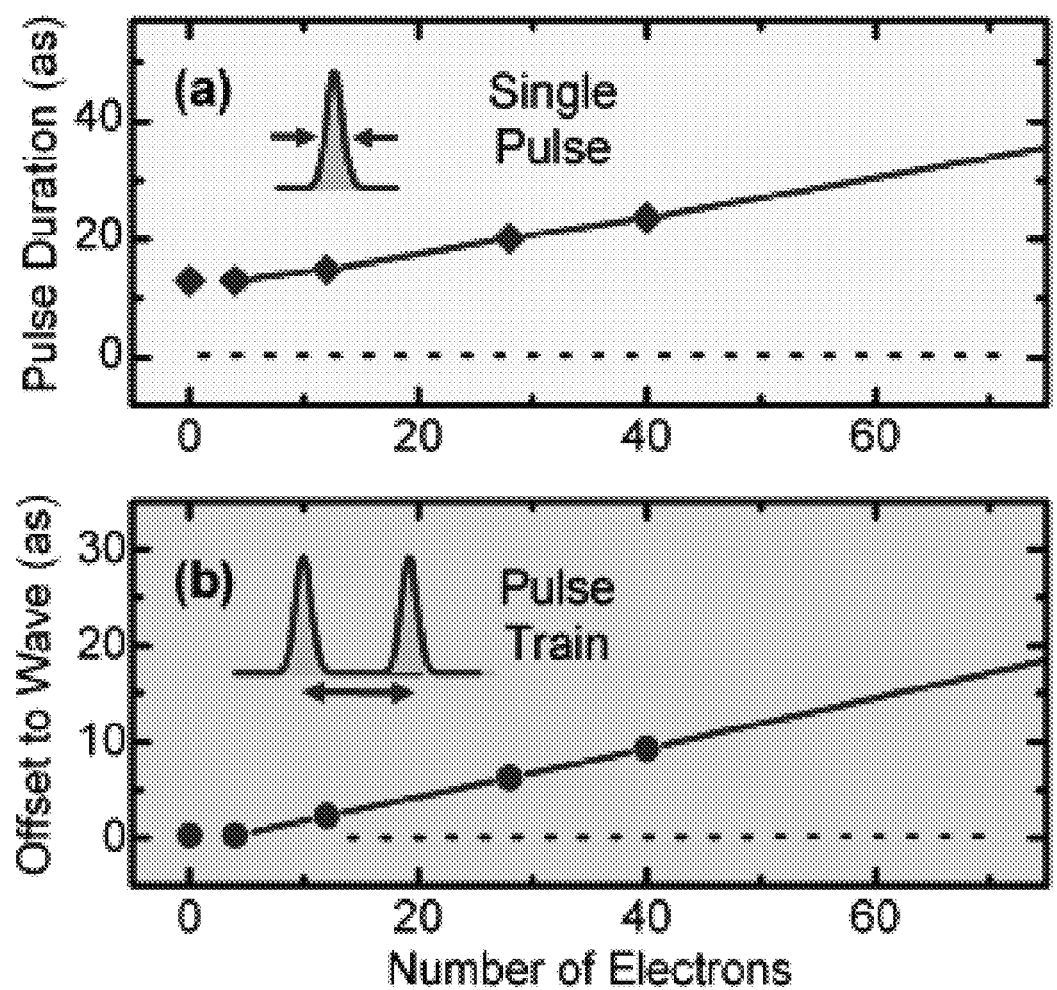
FIG. 8 illustrates space charge effects on pulse width and synchronization according to an embodiment of the present invention.

In order to investigate the influence of space charge on the performance in our attosecond compression scheme, we considered electron packets of increasing electron density and evaluated the resulting pulse durations and effective electron density per attosecond pulse. Two findings are relevant with the results shown in FIG. 8. First, the duration of individual attosecond electron pulses increases relatively insignificantly with the number of electrons contained within. Even for 40 electrons in a single pulse, the duration increases only from 15 to 25 attoseconds (see FIG. 8(a)). The reasons for this are the highly oblate shape of the electron pulses, and the approximate linearity of space charge forces in the longitudinal direction, which are compensated for by somewhat longer interaction in the ponderomotive forces of the optical waves.

Secondly, for a train of pulses, there is an effect on synchronization. When the initial femtosecond electron packet covers several optical cycles of the compression wave, a train of attosecond pulses results as shown in FIG. 7B. Perfect synchronization to the optical wave is provided, because all attosecond pulses are located at the same optical phase of the fundamental laser wave. This phase matching relation, which permits attosecond resolution, despite the presence of multiple pulses, is altered under space charge conditions. The attosecond pulses repel each other and a temporal spreading of the comb-like train results. For a train of near 10 attosecond pulses, FIG. 8(b) displays the difference in timing for an adjacent attosecond pulse in relation to the central one, which is always locked to the optical phase because the space charge forces cancel out. The total timing mismatch is the product of the plotted value with the number of attosecond pulses in the entire electron packet (near 10 for this example). In order to keep the total mismatch to the optical wave below 20 attoseconds, 10 electrons per attosecond electron pulse represent an optimum value. The total pulse train then consists of 200 electrons for that group of pulses; of course the total flux of electrons is determined by the repetition rate. Note that mismatch to the compression pulses, which are generated when the initial uncompressed electron packet is shorter than a few femtoseconds, or with optical fields of longer wavelength.

Numerous imaging experiments have been successful with single electron packets. In state-of-the-art electron crystallography experiments, typically 500 electrons per pulse were used at a repetition rate of kHz to produce the needed diffraction. This is equivalent to having 5 electrons per attosecond pulse at 100 kHz, which is a convenient repetition rate for optical wave synthesis, and provides enough time for letting the material under investigation to cool back to the initial state. Laser systems with MHz repetition rates will provide even higher fluxes.

Applications of attosecond electron pulses for diffraction and microscopy use synchronization of events in the pump-probe arrangement with an accuracy that is equal or better than the individual pulse durations. In contrast to recompression concepts that are based on time-dependent microwave fields, the application of laser waves for attosecond electron pulse generation provides exact temporal synchronization when the pump pulses are derived by phase-locking from the same laser system. Many common optical techniques, such as nonlinear frequency conversion, continuum generation in solids, or high-harmonic generation, all provide a phase lock in the sense that the outcome has the same relative phase and timing in relation to the incoming optical wave for each single pulse of the laser.

A second requirement for reaching into the temporal resolution of attoseconds is the realization of spatial delay matching along extended areas of the diffraction. The use of large samples, for example with up to millimeters in size in some electron diffraction experiments, provides enhanced diffraction efficiency and offers the possibility to use electron beams with large diameter, in order to maximize the coherence and flux. In this case, the time resolution is limited by differences in the arrival times of pump and probe pulses at different points within the involved beam diameters (group velocity mismatch).

Figure 9:
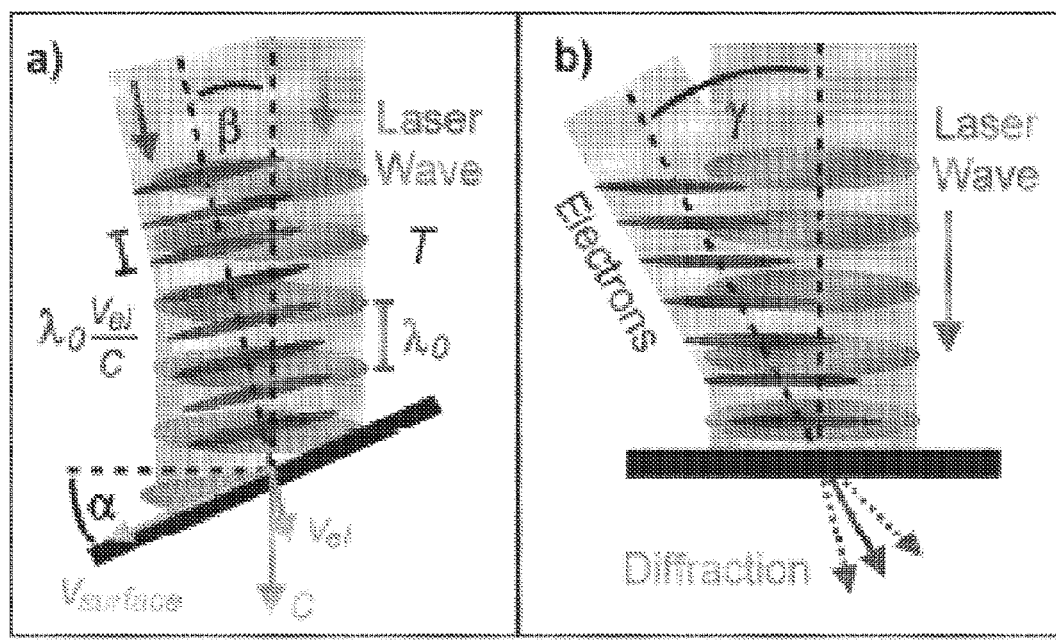
FIG. 9 illustrates methods for phase matching laser phase fronts and electron pulses at extended specimen areas according to an embodiment of the present invention.

Electron pulses at keV energies travel with significantly less than the speed of light (e.g. $v_{el}$=0.3 c for 30 keV electrons) and are, therefore, "overtaken" by the laser wave. Embodiments of the present invention provide two arrangements for matching the group velocity of electrons with the phase velocity of optical pulses. Both arrangements are suitable for applications in noncollinear, ultrafast electron microscopy and diffraction. FIG. 9(a) presents a concept for the transmission geometry of diffraction and microscopy in which two angles are introduced, one between the laser beam and the electron beam (β), and another one (α) for the tilt angle of the sample (black) to the phase fronts of the laser wave. Total synchrony is achieved if the relative delay between the optical wave and the attosecond electron pulses is made identical for all points along the entire sample surface. Each small volume of the sample is then subject to an individual pump-probe-type experiment with the same time delay.

The above condition is found when we match the coincidence along the entire width of the specimen. The effective surface velocity $v_{surface}$ of the laser and of the electron pulses must be identical. From FIG. 9A, this requirement is expressed by the following equation:

$$\frac{\sin(\alpha)}{\sin(\alpha-\beta)} = \frac{c}{v_{el}}. \quad (1)$$

It follows that an angle of β=10°, for example, results in an optimum angle for the sample tilt of α=14.8°, which are both easily achievable angles in a real experiment. The effective tilt of the sample with respect to the electron direction is then α−β=4.8°. Naturally, if this value is not coincident with a zone axis direction, a complete rocking curve should be obtained in order to optimize α and β with tilt requirements. Although different portions of the laser wavefront impinge on the surface of the sample at different times, this behavior is matched by the electron pulse, resulting in all portions of the surface of the sample being phase matched.

As illustrated in FIG. 9(a), the laser beam, also referred to as a laser wave, is used to activate the sample, for example, to heat the sample, cause motion of the sample, or to effect the chemical bonds present in the sample. The timing of the laser wave and the electron pulses are synchronized using the delay stage discussed in relation to FIG. 1. The train of electron pulses can be generated using the configuration illustrated in FIG. 10(a).

Another option for synchronization along extended surfaces is the use of tilted electron pulses, for that the electron density makes an angle with respect to the propagation direction. Tilted optical pulses have been used for reaching femtosecond resolution in reflection geometry, but here tilted electron pulses are introduced for effective spatiotemporal synchronization to the phase velocity of the excitation pulses along the entire sample surface. FIG. 9B depicts the concept. If an angle γ is chosen between the laser (red) and the attosecond electron pulses (blue), the electron pulses need to be tilted likewise. The sample is located parallel to the optical phase fronts and its entire surface is illuminated by the attosecond electron pulse at once and at the same time of incidence relative to the optical pulse wave. Because the incidence is delay-free for all points along the surface, velocity matching is provided for the whole probed area.

Figure 10:
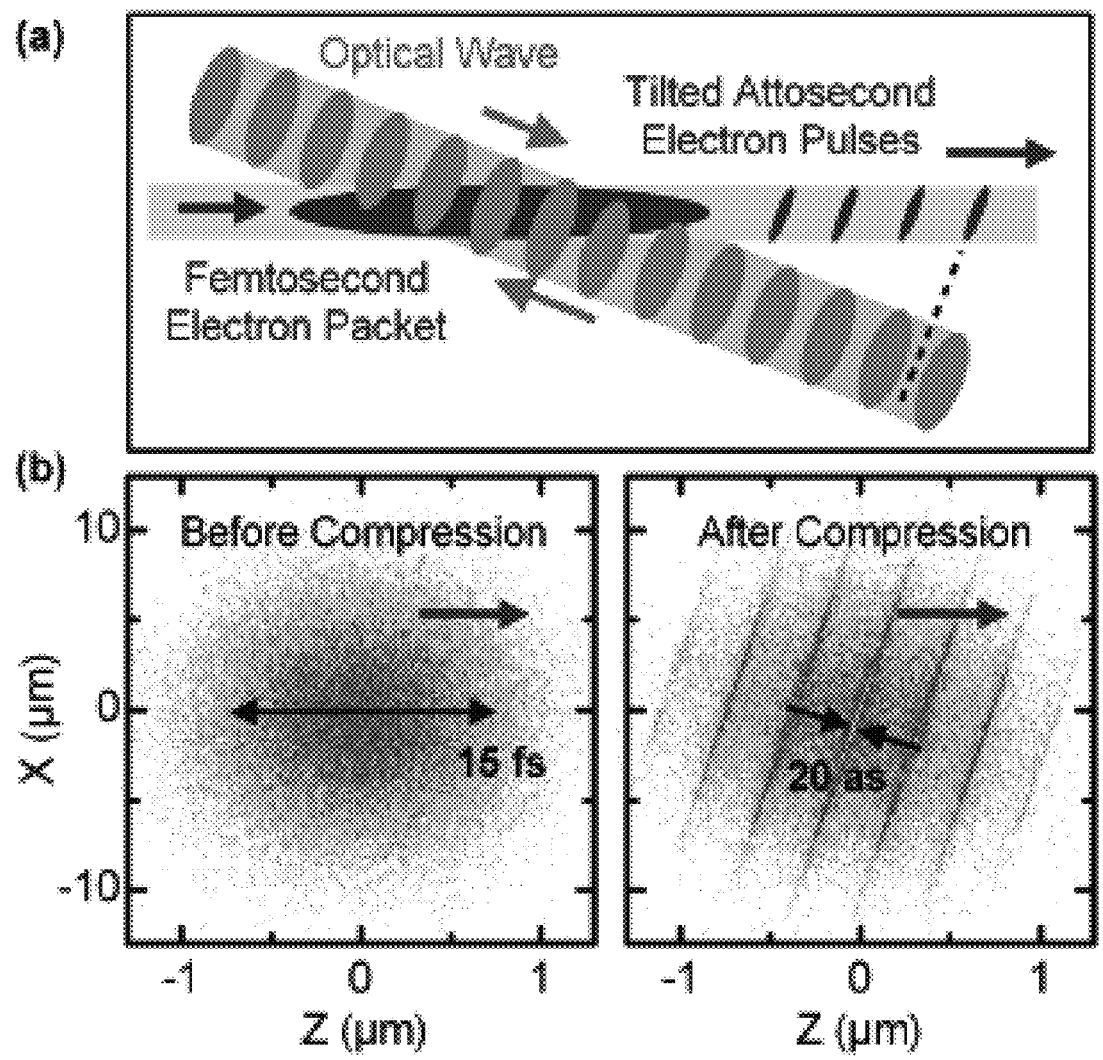
FIG. 10 illustrates generation of tilted electron pulses according to an embodiment of the present invention.

The generation of tilted attosecond electron pulses is outlined in FIG. 10(a). The introduction of an angle between the intensity grating (red) and the electron beam (blue) leads to formation of electron pulses with a tilt. As described above, a femtosecond electron packet (blue) is first generated by conventional photoelectron generation and accelerated in a static electric field. By intersecting the counter-propagating intensity grating at an angle, tilted electron pulses result with attosecond duration. The ponderomotive force accelerates the electrons towards the planes of destructive interference in the intensity wave and they form attosecond pulses that are compressed along the optical beam axis; but the pulses propagate in the original direction. Only a slight adjustment of the electrons' central energy is required to achieve phase matching to the moving optical grating.

Based on this concept, we simulated the tilting effect by using 31-keV electron pulses with an initial duration of ~15 femtoseconds and a spatial beam diameter of ~10 µm. FIG. 10(b) illustrates the simulation results for an initial packet of 15-femtosecond duration (left) and an intersection angle of 5°. The tilted attosecond pulses have duration of ~20 attoseconds when measured perpendicular to the tilt (note the different scale of Z and X). The optical intensity wave is synthesized by two counter-propagating laser pulses of 100-fs duration and wavelengths of 1040 and 520 nm. The angle between the electron beam and the laser wave is 5°. The results of compression are shown in FIG. 10(b): The attosecond electron pulses are formed at the minima of the optical intensity wave and, therefore, are tilted by 5° with respect to the electron propagation direction. For other incidence angles of the laser, the electron pulses are tilted accordingly. Perpendicular to the attosecond pulses, the measured duration is ~20 attoseconds, given as the full width at half maximum.

Based on the methodology for generation and synchronization of attosecond electron pulses described above, the diffraction and manifestation of electron dynamics in the patterns are described. By way of two different examples, embodiments of the present invention are utilized to observe electronic motions in molecules and materials with attosecond electron packets.

We consider first the physics of electron scattering and the change in scattering factors which characterize individual atoms and the electron density involved. Diffraction from molecular crystals or other crystalline structures provides two distinct advantages over that obtained for gas phase ensembles. First, the sample density is many orders of magnitudes higher ($10^{21}$ molecules/cm$^3$ as compared to $10^{10}$ to $10^{16}$/cm$^3$ in gas jets); diffraction is, therefore, more intense. Second, the crystalline order results in Bragg scatterings and they are concentrated into well-defined "spots" for ordered crystals; the patterns become rods for surfaces and narrow rings for amorphous substances. The diffraction results in intensities which are proportional to the square of the diffraction amplitude. As discussed below, coherence in diffraction is used in observing the changes of interest.

The diffraction from molecular crystals, or other crystalline materials of interest, is defined by the summation over the contributions of all scatterers in a unit cell. The intensity I of a Bragg spot with the Miller indices (hkl) is determined by the positions (xyz) of the scatterers j in the unit cell:

$$I(hkl) \propto \left| \sum_j f_j \exp[-2\pi i (hkl) \cdot (xyz)_j] \right|^2, \quad (2)$$

where $f_j$ are the atomic scattering factors. Electron diffraction is the result of Coulomb interaction between the incoming electrons and the potential formed by nuclei and electrons. The factors $f_j$ account for the effective scattering amplitude of atoms and are derived from quantum calculations that take into account the specific electron density distribution around the nuclei, including core electrons. The scattering we are considering here is the elastic one.

Figure 11:
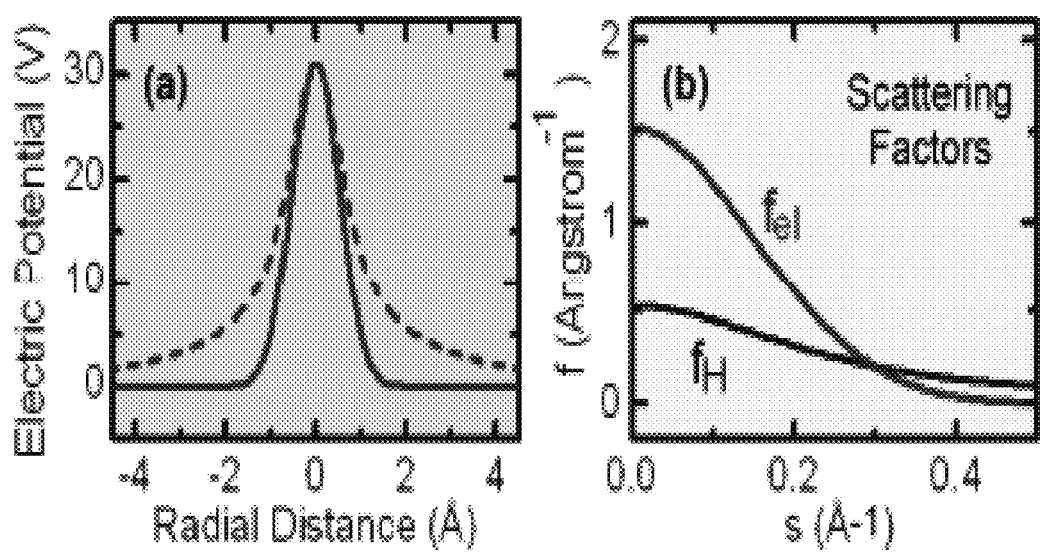
FIG. 11 illustrates scattering factors of electron energy density distributions according to an embodiment of the present invention.

In order to estimate the influence of electron dynamics on contributions to time-resolved diffraction patterns, we consider typical densities of electrons in chemical bonds, and the possible change. Static electron density maps show that typical covalent bonds consist of about one electron/Å$^3$ and that this density is delocalized over volumes with diameters in the order of 1 Å. For estimating an effective scattering factor of such electron density, we consider a Gaussian sphere with a diameter of 1 Å, consisting of one electron. The electric potential is derived by Gauss' law and results in a radial dependence that is represented in FIG. 11, dotted line. The total scattering amplitude of free charges diverges at small angles, because of the long-range behavior of the potential. Since in real crystals the potential is localized in unit cells, we use a Gaussian distribution of the same magnitude in order to restrict the range to about ±1.5 Å.

For potential of spherical symmetry, an effective scattering factor can be calculated from the radial potential $\Phi(r)$ according to $$f_{el}(s) = \frac{8\pi^2 m_e e}{h^2} \int_0^\infty r^2 \Phi(r) \frac{\sin(4\pi s r)}{4\pi s r} dr, \quad (3)$$

where $S = \sin(\nu/2)/\lambda_{el}$ is the scattering parameter for a diffraction angle $\nu$ and $\lambda_{el}$ is the de Broglie wavelength of the incident electrons. The result for our delocalized electron density is shown in FIG. 11(b); for comparison we plot also the tabulated scattering factor of neutral hydrogen. Both have comparable magnitude, which is expected because of their similar sizes.

Here, we consider the iodine molecule as a model case and invoke the transition from a bonding to an anti-bonding orbital. The crystal structure of iodine consists of nearly perpendicular iodine pairs with a bond length of ~2.7 Å. Two electrons contribute to the intramolecular σ bond; the intermolecular bond is weaker.

Figure 12:
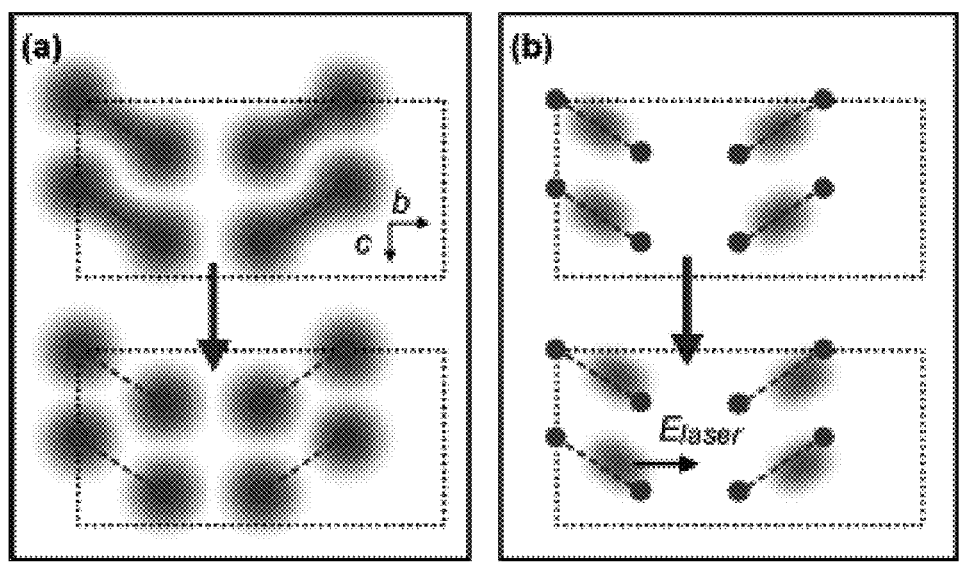
FIG. 12 illustrates schematic diagrams of molecular transitions measured using embodiments of the present invention.

FIG. 12 depicts the system under study and the two cases considered. The effect of antibonding excitation is made by comparing the Bragg intensities for the iodine structure, including the binding electrons, to a hypothetical iodine crystal consisting only of isolated atoms (see FIG. 12(a)). In Table 1, we give the results of the calculations following equation 2 with the values off tabulated for iodine atoms and from equation (3) for the electronic distribution changes. Despite the large difference in f of the iodine nuclei and the electron (about 50:1), the changes of Bragg spot intensity are significant, being on an order of 10-30%.

TABLE 1

Effects of Electron Motion on Selected Molecular Bragg Spots

| Miller Indices (hkl) | (a) $\Delta I_{Transition}$ | (b) $\Delta I_{Movement}$ (0.08 Å) |
|---|---|---|
| 100, 010, 001 | (forbidden) | (forbidden) |
| 200, 400, 600 | 0 | 0 |
| 002 | −35% | 0 |
| 020 (weak) | +100% | −17% |
| 400 | 0 | 0 |
| 040 | −18% | +13% |
| 004 | 0 | 0 |
| 111 | +15% | −2% |
| 331 | −20% | +15% |

In column (a), the magnitude of Bragg spot intensity change ΔI of crystalline iodine as a result of bonding to antibonding transition is given. In column (b), the magnitude of Bragg spot intensity change as a result of field interaction with charge density, also in iodine.

This large change is for two reasons. First, the bonding electrons are located in-between iodine atoms and contribute, therefore, strongly to the enhancement or suppression of all Bragg spots that project from the inter-atomic distances of the molecular units. Second, the large effect is result of the intrinsic "heterodyne detection" scheme of diffraction; the total intensity of a Bragg spot scales with the square of the coherent sum of individual contributions (see equation (2)). Although the total contribution to the intensity of a Bragg spot from bonding electrons is lower by a factor of several hundreds than the intensity contributions from the iodine atoms, the modulation is on the order of several percents as a result of the coherence of diffraction on a nanometer scale. Symmetry in the crystal is evident in the absence of change in certain Bragg orders. From measurements of the dynamics of multiple spots, it follows that electron density movies could be made. This is best achieved in an electron microscope in diffraction geometry; however conventional diffraction is also suitable to simultaneously monitor many Bragg spots and is advantageous for the study of ordered bulk materials. The example given is not far from an experimental observation made on a metal-to-insulator transition for which a σ*-type excitation was induced with a femtosecond pulse.

As a second model case we consider the reaction of bonded electron density to external electric fields, such as the ones from laser fields. Depending on the restoring force and the resonance, an electron density will oscillate with the driving field in phase or with a phase delay. This charge oscillation re-radiates and is responsible for the refractive index of a dielectric material. In order to estimate the magnitude of charge displacement, we must take into account the polarizability, β, and the electric field strength, $E_{laser}$. In the limit of only one moving charge, the displacement D is approximately given by $$D \approx \frac{\alpha}{e} E_{laser}.$$

The polarizability of molecular iodine along the bond is $\alpha \approx 130 \, \epsilon_0 \text{Å}^3$ (~70 a.u.) in the static limit and a similar magnitude is expected for the crystal for optical frequencies away from the strong absorption bands; the anisotropy of polarizability indicates the role of the bonding electrons. With femtosecond laser pulses, a field of $E_{laser} = 10^9$ V/m is possible for intensities below the damage threshold. With these parameters, one expects a charge displacement of D≈0.08 Å, or about 3% of the bond length.

FIG. 12(b) is a schematic for the change in charge distribution by an electric field. We assume an active role of only the bonded electrons, and take the polarization of the laser field to be along the b axis of solid iodine. This axis is chosen because it has the least symmetry; a is perpendicular to the bonds. Table 1 gives the intensity changes of selected Bragg spots; the change is in the range of ±20% for some of the indices. The total energy delivered to the molecular system by the laser field is only on the order of 0.01 eV. Nevertheless the changes of charge displacements on sub-angstrom scales are evident. This marks a central advantage of electron diffraction over spectroscopic approaches, which require large energy changes in order to have projections on dynamics. In contrast, diffraction allows for the direct visualization of a variety of ultrafast electron dynamics with combined spatial and temporal resolutions, and independent of the resolution of internal energy levels.

The "temporal lens" concept can be used for the focus and magnification of ultrashort electron packets in the time domain. The temporal lenses are created by appropriately synthesizing optical pulses that interact with electrons through the ponderomotive force. With such an arrangement, a temporal lens equation with a form identical to that of conventional light optics is derived. The analog of ray diagrams, but for electrons, are constructed to help the visualization of the process of compressing electron packets. It is shown that such temporal lenses not only compensate for electron pulse broadening due to velocity dispersion but also allow compression of the packets to durations much shorter than their initial widths. With these capabilities ultrafast electron diffraction and microscopy can be extended to new domains, but, as importantly, electron pulses are delivered directly on the target specimen.

With electrons, progress has recently been made in imaging structural dynamics with ultrashort time resolution in both microscopy and diffraction. Earlier, nuclear motions in chemical reactions were shown to be resolvable on the femtosecond (fs) time scale using pulses of laser light, and the recent achievement of attosecond (as) light pulses has opened up this temporal regime for possible mapping of electron dynamics. Electron pulses of femtosecond and attosecond duration, if achievable, are powerful tools in imaging. The "electron recombination" techniques used to generate such attosecond electron pulses require the probing electron to be created from the parent ions (to date no attosecond electron pulses have been delivered on an arbitrary target) and for general applications it is essential that the electron pulse be delivered directly to the specimen.

In ultrafast electron microscopy (UEM), the electron packet duration is determined by the initiating laser pulse, the dispersion of the electron packet due to an initial energy spread and electron-electron interactions. Since packets with a single electron can be used to image, and the initiating laser pulse can in principle be made very short (sub-10 fs), the limiting factor for the electron pulse duration is the initial energy spread. In photoelectron sources this spread is primarily due to the excess energy above the work function of the cathode, and is inherent to both traditional photocathode sources and optically-induced field emission sources. Energy-time uncertainty will also cause a measurable broadening of the electron energy spread, when the initiating laser pulse is decreased below ~10 fs. For ultrafast imaging techniques to be advanced into the attosecond temporal regime, methods for dispersion compensation and new techniques to further compress electron pulses to the attosecond regime need to be developed.

As described herein techniques for compressing free electron packets, from durations of hundreds of femtoseconds to tens of attoseconds, using spatially-dependent ponderomotive potentials are provided by embodiments of the present invention. Thus, a train of attosecond pulses can be created and used in ultrafast electron imaging. Because they are generated independent of the target they can be delivered to a specimen for studies of transient structures and electronic excitations on the attosecond time scale. The deflection of electrons (as in the Kapitza-Dirac effect) by the ponderomotive potential of intense lasers and the diffraction of electrons in standing waves of laser light have been observed, and so is the possibility (described through computer modeling) of spatial/temporal focusing with combined time-dependent electric and static magnetic fields.

The "temporal lens" description analytically expresses how ponderomotive compression can be used to both compensate for the dispersion and magnify, in this case compress, the temporal duration of electron packets. We obtain simple lens equations which have analogies in optics and the results of "electron ray optics" of temporal lenses allows for analytical expressions and for the design of different schemes using geometrical optics. Here, we consider two types of temporal lenses, thin and thick.

For the realization of the temporal thin lens, a laser beam with a Laguerre-Gaussian transverse mode, radial index $\rho=0$ and azimuthal index $l=0$ (or, in common nomenclature, a "donut" mode, is utilized. In the center of the donut mode, electrons will experience a spatially-varying ponderomotive potential (intensity) that is approximately parabolic. This potential corresponds to a linear spatial force which, for chirped electron pulses, can lead to compression from hundreds of fs to sub-10 fs. The second type, that of a thick lens, is based on the use of two counter-propagating laser beams in order to produce a spatially-dependent standing wave that co-propagates with the electrons. A train of ponderomotive potential wells are produced at the nodes of the standing wave, leading to compression but now with much "tighter focus" (thick lens). Because the electron co-propagates with the laser fields, velocity is matched. Analytical expressions are derived showing that this lens has the potential to reach foci with attosecond duration. Finally, we discuss methods for creating tunable standing waves for attosecond pulse compression, and techniques for measuring the temporal durations of the compressed pulses. Space-charge dispersed packets of electrons that have a linear spatial velocity chirp may also be compressed with the temporal lenses described here.

All electron sources, both cw and pulsed, have an initial energy spread. For pulsed electron sources this is particularly relevant as electron packets created in a short time disperse as they propagate. The initial energy spread leads to an initial spread in velocities. These different velocities cause the initial packet to spread temporally, with the faster electrons traveling a further distance and the slower electrons traveling a shorter distance in a given amount of time. The dispersion leads to a correlation between position (along the propagation direction) and electron velocity as described in relation to FIG. 14. The linear spatial velocity "chirp" can be corrected for with a spatially-dependent linear impulsive force (or a parabolic potential). Thus, if a pulsed, spatially-dependent parabolic potential can be made to coincide appropriately with the dispersed electron packet, the slow trailing electrons can be sped up and the faster leading electrons can be slowed down. The trailing electrons, now traveling faster, can catch the leading electrons and the electron pulse will thus be compressed.

Figure 13:
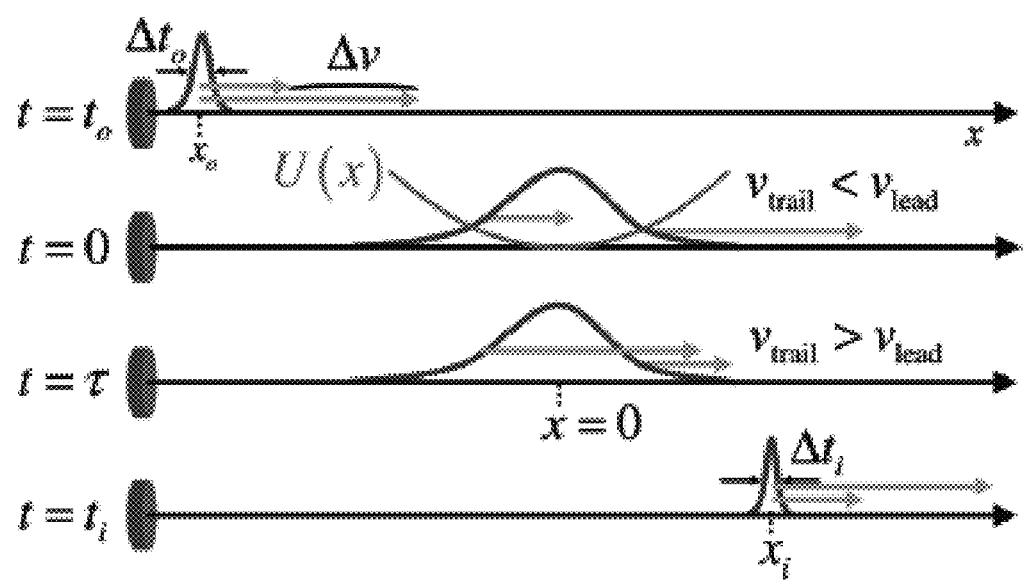
FIG. 13 illustrates dispersion of an ultrashort electron packet according to an embodiment of the present invention.

FIG. 13 illustrates dispersion of an ultrashort electron packet. At $t=t_o$ the packet is created from a photocathode and travels with a velocity $v_0$. As it propagates along the x-axis it disperses, with the faster electrons traveling further, and the slower ones trailing for a given propagation time t. At t=0 a parabolic potential is pulsed on, giving an impulsive "kick" to the dispersed electron packet. After the potential is turned off, $t>\tau$, the trailing electrons now have a greater velocity than the leading electrons. After a propagation time $t=t_i$, the pulse is fully compressed.

Consider a packet of electrons, propagating at a speed $v_0$ along the x-axis, with a spread in positions of $\Delta x_o = v_0 \Delta t_o$, at time $t=t_o$. At t=0, a potential of the form $U(x)=\frac{1}{2}Kx^2$ interacts with the electron packet for a duration t in the lab frame. The waist, or spatial extent of the potential (temporal lens) is chosen to be w, while the duration $\tau$ is chosen such that it is short compared to $w/v_0$. When this condition is met the impulse approximation holds, and the change in velocity is $\Delta v=-\tau/m(dU(x)/dx)=-\tau Kx/m$, for $|x|<w$, where m is the electron mass. After the potential is turned off, $t>\tau$, the electrons will pass through the same position, $x_f-x=(v_0+\Delta v)t_f$, at the focal time $t_f=-x/\Delta v=m/(K\tau)$. To include an initial velocity spread around $v_0$ (due to an initial $\Delta E$), consider electrons that all emanate from a source located at a fixed position on the x-axis. An electron traveling exactly at $v_0$ will take a time $t_0$ to reach the center of the potential well at x=0. Electrons leaving the source with other velocities $v_0+v_k$ will reach a location $x=v_k t_o$ at t=0. The image is formed at a location where electrons traveling with a velocity $v_0$ and a velocity $v_0+v_k$ intersect, this is, when $v_0 t_i = x + (v_0 + \Delta v + v_k) t_i$. The image time $t_i$ is then $t=-x/(\Delta v + v_k)$.

Figure 14:
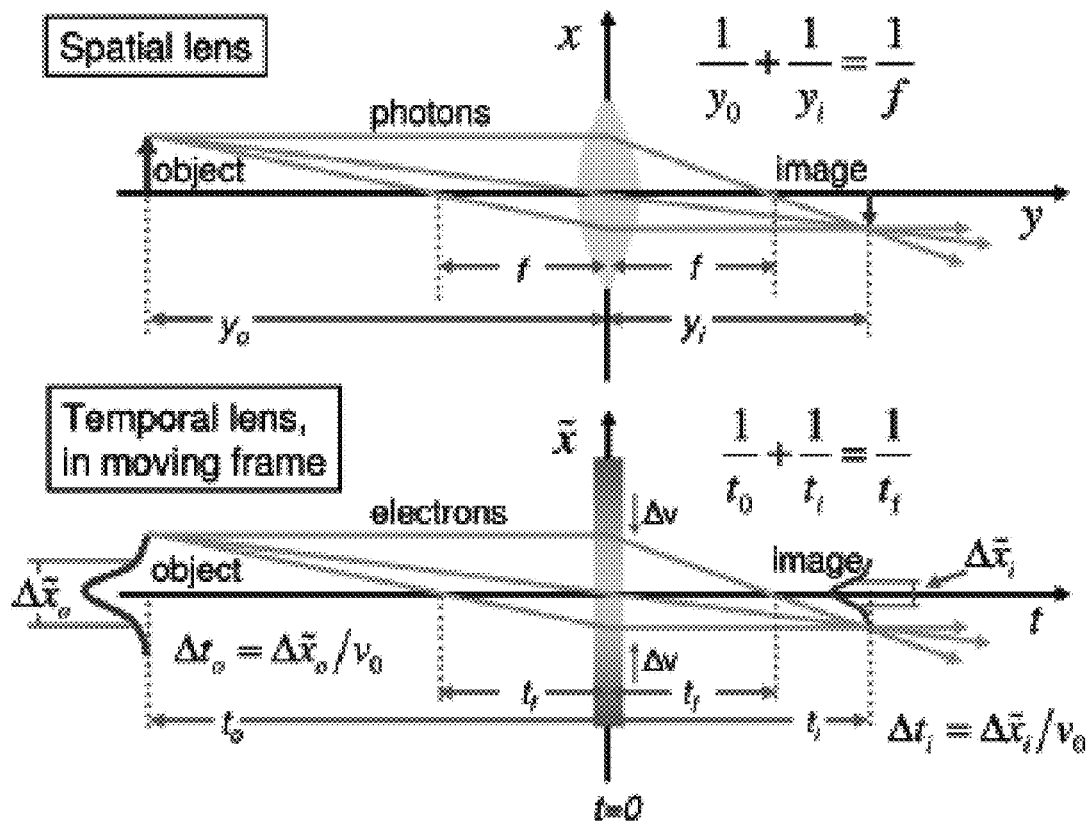
FIG. 14 illustrates simplified ray diagrams for spatial and temporal lenses according to an embodiment of the present invention.

FIG. 14 illustrates ray diagrams for spatial and temporal lenses. The top figure in FIG. 14 depicts three primary rays for an optical thin spatial lens. The object is located at $y_o$, and the spatial lens has a focal length, f. A real image of the object is created at the image plane, position y. The bottom figure in FIG. 14 is a ray diagram for a temporal thin lens. The diagram is drawn in a frame moving with the average speed $v_0$ of the electron packet. The slopes of the different rays in the temporal diagram correspond to different initial velocities that are present in the electron packet. As shown in the diagram, a temporal image of the original electron packet is created at the image time $t_i$. The initial packet (object) is created at a time $t_o$ with $\Delta t_o = \Delta x_o / v_0$, where the spatial extend of the pulse is directly related to the temporal duration of the object. The lens is pulsed on at t=0 and the temporal focal length of the lens is $t_f$. The lens represents the ponderomotive potential and in this case is on for the very short time $\tau$.

For the object time, $t_o=x/v_k$, image time $t=-x/(\Delta v+v_k)$ and the focal time $t_f=x/\Delta v$, the temporal lens equation holds, $$\frac{1}{t_o} + \frac{1}{t_i} = \frac{1}{t_f}. \quad (4)$$

Ray tracing for optical lenses is often used to visualize how different ray paths form an image, and is also useful for visualizing how temporal lenses work as shown in FIG. 14. As derived in later sections, the magnification M is defined as the ratio of the electron pulse duration ($\Delta t_i$) at the image position to the electron pulse duration ($\Delta t_o$), and is directly proportional to the ratio of the object and image times ($-t_i/t_o$) and distances ($-x_i/x_o$).

In polar coordinates, a Laguerre-Gaussian ($LG_0^1$) mode has a transverse intensity profile given by, $I(r, \phi) = I_0 \exp(1) 2r^2 \exp(-2(r/w)^2)/w^2$ where w is the waist of the focus and $I_0$ the maximum intensity. This "donut" mode has an intensity maximum located at $r=\sqrt{2}$ with a value of $I_0 = 2E_P(\sqrt{\ln 2/\pi^3}/(w^2\tau))$ where $E_P$ is the energy of the laser pulse and $\tau$ is the full-width-at-half-maximum of the pulse duration, assuming a Gaussian temporal profile given by $\exp(-4 \ln 2(t/\tau)^2)$. The ponderomotive energy $U_P(x)$ is proportional to intensity, $$U_P(x) = \frac{1}{2}\left[\frac{e^2\lambda^2 \exp(1) I_0}{2\pi^2 m\varepsilon_0 c^3 w^2}\sqrt{\frac{\ln 2}{\pi}}\right]x^2 \equiv \frac{1}{2}Kx^2, \quad (5)$$

where m is the electron mass, e is the electron charge and $\lambda$ the central wavelength of the laser radiation and replacing r with x. Near the center of the donut mode focus (or $x<<w$) the intensity distribution is approximately parabolic, and hence the ponderomotive energy near the donut center is also parabolic. In analogy with a mechanical harmonic oscillator, the quantity in the square brackets of equation (5) can be referred to as the stiffness K; it has units of $J/m^2 = N/m$, and at 800 nm has the numerical value of, $K \approx 3.1 \times 10^{-36} E_P/(w^4 \tau)$. For this parabolic approximation to be applicable, the spatial extent of the dispersed electron pulse, at t=0, $\Delta x(0) = v_0 \Delta t_o + \Delta v_o t_o$ must be much smaller than the laser waist, where the object velocity spread is $\Delta v_o = \Delta E/\sqrt{2mE}$.

Figure 15:
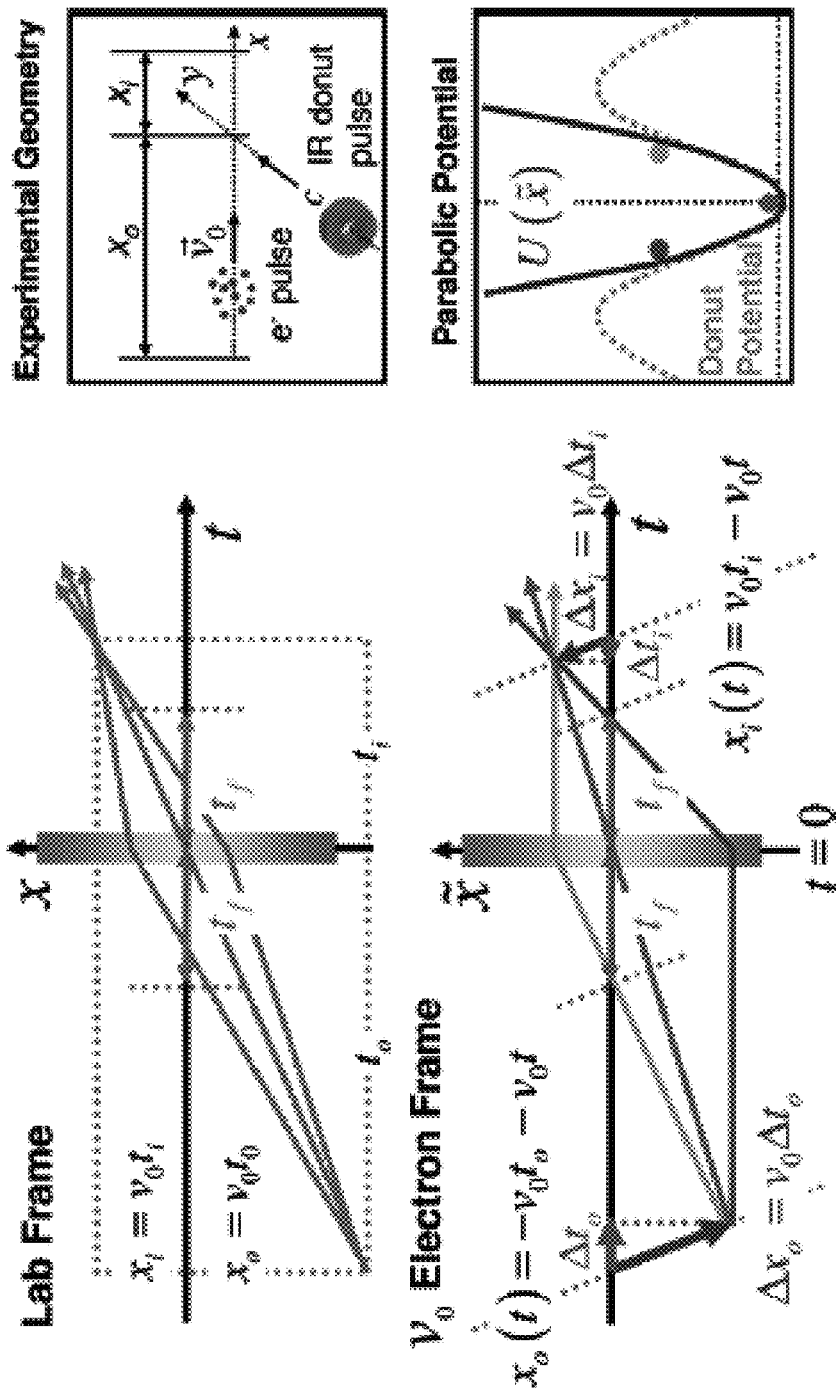
FIG. 15 illustrates simplified thin lens temporal ray diagrams for the lab and copropagating frames according to an embodiment of the present invention.

The effect of this parabolic potential on an ensemble of electrons emitted from a source will now be analyzed. The velocity distribution of the ensemble is centered around $v_0$, with an emission time distribution centered on $-t_o$, where all electrons are emitted from the same location $x_o = -v_0 t_o$. Assuming a single donut-shaped laser pulse is applied at t=0, and centered at x=0, the electron ensemble is then influenced by the potential $U(x) = \frac{1}{2} K x^2$. The $k^{th}$ electron in the ensemble has an initial velocity $v_0 + v_k$ and emission time $-t_o + t_k$. Using a Galilean transformation to a frame moving with velocity $v_0$, the propagation coordinate x (lab frame) is replaced with the moving frame coordinate $\tilde{x} = x - v_o t$. At t=0 the potential exists for the ultrashort laser pulse duration r, giving the electron an impulse (or "kick") dependent on its instantaneous position in the parabolic potential. In both frames, the position of the electron at t=0 is $x_k(0) = \tilde{x}_k(0) \equiv v_0 t_k + v_k t_o - v_k t_k$, where $x_k(t)$ and $\tilde{x}_k(t)$ are in the lab and moving frames, respectively. Using the impulse approximation the electron trajectory immediately after the potential is turned off becomes, $$\tilde{x}_k(t) = v_k t + \tilde{x}_k(0)(1 - t/t_f), \quad (6)$$

where $t_f = m/(K\tau)$ is the focal time. The electron trajectories, before and after t=0, can be plotted in both frames to give the equivalent of a ray diagram as illustrated in FIG. 15. Electrons emitted at the same time, i.e. $t_k = 0$, but with different velocities, will meet at the image position, $\tilde{x}_k = 0$ in the moving frame at the image time $t_i$. The image time is found by setting $\tilde{x}_k(t_i) = 0$, from equation (6), with $t_k = 0$, $\tilde{x}_k(t_i) = v_k t_i + v_k t_o (1 - t_i/t_f) = 0$ which is equivalent to the lens equation, equation (4): $t_o^{-1} + t_i^{-1} = t_f^{-1}$.

An expression for the magnification can be obtained when electrons that are emitted at different times $t_k$ and different velocities $v_k$ are considered. If the magnification is defined as $M = -t_i/t_o$ then the temporal duration at the image time becomes, $$\Delta t_i = M \Delta t_o \quad (7)$$

where $\Delta t_o$ and $\Delta t_i$ are the duration of the electron packet at the object and image time, respectively. Durations achievable with a thin temporal lens follow from equation (7).

An experimentally realistic temporal lens would use a 50 fs, 800 nm laser pulse with 350 μJ energy, focused to a waist of w=25 μm. These values result in a stiffness of $K = 5.5 \times 10^{-8}$ N/m and a focal time of t=0.3 ns; $t_f = m/(K\tau)$. If the lens is applied 10 cm from the source, electrons emitted at $v_0 = c/10$ (3 keV) would have an object time of $t_o = x_o/v_0 = 0.1/(c/10) = 3.0$ ns. Using the temporal lens equation, equation (4), $t_i$ is obtained to be 0.33 ns. Hence, a magnification of $M = -t_i/t_o = 0.1$. Consequently, a thin temporal lens can compress an electron packet with an initial temporal duration of $\Delta t_o \approx 100$ fs, after it has dispersed, to an image duration of $\Delta t_i \approx 10$ fs. While the example presented here is for 3 keV electrons, the thin lens approximation holds for higher energy electrons as long as r is chosen to be short compared to $w/v_0$. Experimentally, the thin temporal lens can be utilized in ultrafast diffraction experiments which operate at kHz repetition rates with lasers that typically possess power that exceeds the value needed for the ponderomotive compression.

Referring to FIG. 15, thin lens temporal ray diagrams for the lab and co-propagating frames are illustrated. The upper left panel is a ray diagram drawn in the lab frame showing how different initial velocities can be imaged to a single position/time. The gray lines are rays representing electrons with different velocities. The lower left panel is a ray diagram drawn in a frame moving with the average velocity $v_0$ of the electron packet. The rays represent velocities of $v_0/67$, $v_0/100$ and 0. In the co-propagating frame, the relationship between $\Delta t_o$ and $\Delta t_i$ can be visualized as $\Delta t_i = -\Delta t_o t_i/t_o$. One major difference between the lab frame and the moving frame is that in the latter the position of the object and image are moving. The lines representing the object and the image positions are drawn with slopes of $-v_0$. The upper right panel depicts the experimental geometry for the implementation of a thin temporal lens. Note that the laser pulse and electron packet propagate perpendicular to each other, and that the interception point between the electrons and photons is at x=0 and t=0. The lower right panel shows how the parabolic (idealized) potential compares to the experimentally realizable donut potential. The colored dots indicate the position of electrons following the rays indicated in the left bottom diagram.

Figure 16:
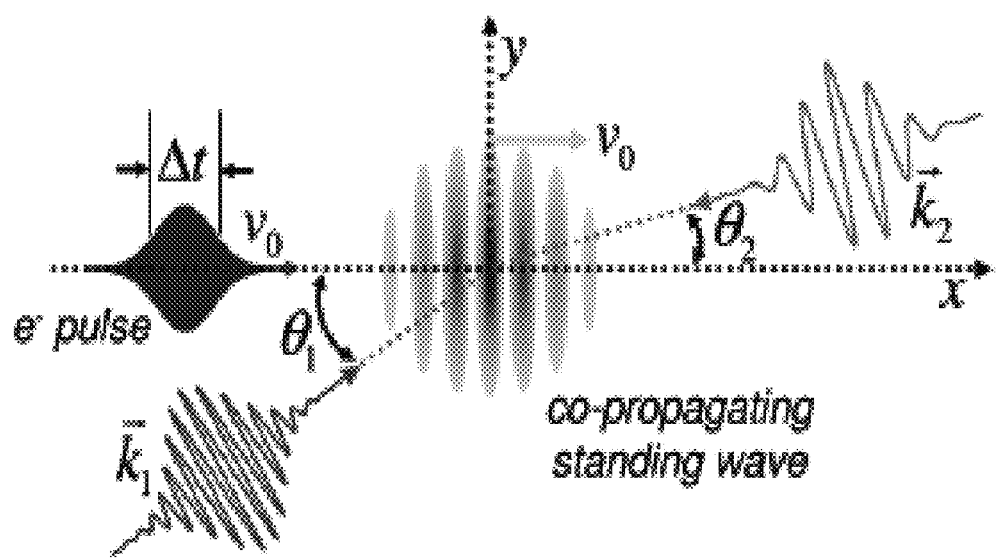
FIG. 16 a simplified 2D schematic diagram of tiled laser pulses according to an embodiment of the present invention.

Above, it was analytically shown that free electron packets can be compressed from hundreds to tens of femtoseconds using a temporal thin lens, which would correspond to a magnification of ~0.1. Co-propagating standing wave can be created by using two different optical frequencies, constructed by having a higher frequency ($\omega_1$) optical pulse traveling in the same direction as the electron packet and a lower frequency ($\omega_2$) traveling in the opposite direction. When the optical frequencies $\omega_1$, $\omega_2$, and the electron velocity $v_0$ are chosen according to $v_0 = c(\omega_1 - \omega_2)/(\omega_1 + \omega_2)$, a standing wave is produced in the rest frame of the electron as illustrated in FIG. 16. If the electron has a velocity $v_0 = c/3$, and $\omega_1 = 2\omega_2$ then the co-propagating standing wave has a ponderomotive potential of the form, $$U_P(x) = \frac{1}{2}\left(\frac{e^2 \tilde{\lambda}^2 E_0^2}{8\pi^2 mc^2}\right) \cos^2(\tilde{k}x), \quad (8)$$

where $E_0$ is the peak electric field, $\tilde{\lambda}$ the Doppler shifted wavelength. The envelopes of the laser pulses are ignored in this derivation, but they can be engineered so that the standing wave contrast is optimized. The standing waves can be provided outside the microscope housing or inside the microscope housing. The presence of the standing wave copropagating with the electron pulse or packet inside the microscope housing can produce a series of attosecond electron pulses as illustrated in FIG. 7B and FIG. 16. Depending on the geometry with which the laser beams interact, the standing wave and the electron pulse can overlap adjacent to the sample, providing attosecond electron pulse generation at distances close to the sample. The attosecond electron pulses can be single electron pulses.

To find an analytic solution in the thick lens geometry, each individual potential well in the standing wave is approximated by a parabolic potential that matches the curvature of the sinusoidal potential, $U_P(x) = \frac{1}{2}[e^2 E_0^2/(2mc^2)]x^2 = \frac{1}{2}Kx^2$. Using the exact solution to the harmonic oscillator the focal time is, $$t_f = \cot(\omega_P \tau)/\omega_P + \tau \quad (9)$$

where $\omega_P = \sqrt{K/m}$ and $\tau$ is the duration that the lens is on. For $\tau \to 0$, $t_f \to m/(K\tau)$, which is identical to the thin lens definition.

The image time, $t_i$, has a form, $$t_i = (1/\omega_p^2 + t_o t_f - t_f \tau + \tau^2)/(t_o - t_f + \tau), \quad (10)$$

and after the two assumptions, $\tau \to 0$ and $t_o \gg 1/(t_f \omega_p^2)$ becomes equivalent to equation (4), the lens equation: $t_o^{-1} + t_i^{-1} = t_f^{-1}$.

The standard deviation of the compressed electron pulse at arbitrary time to is, $$\Delta t_a = \sqrt{\frac{t_f^2(\tilde{\lambda}^2 + 4t_a^2 \Delta v_o^2) + t_a^2 \tilde{\lambda}^2 - 2t_f t_a \tilde{\lambda}^2}{48 t_f^2 v_0^2}}, \quad (11)$$

which is valid for an individual well. The time when the minimum pulse duration occurs is $t = t_f \tilde{\lambda}^2/(\tilde{\lambda}^2 + 4t_f^2/\Delta v_o^2) \approx t_f$ and for experimentally realistic parameters is equal to $t_f$. This implies that the thick lens does not image the initial temporal pulse; it temporally focuses the electrons that enter each individual well. Since there is no image in the thick lens regime, the minimum temporal duration is not determined by the magnification M as in the thin lens section, but is a given by, $$\Delta t_f = \sqrt{\frac{t_f^2 \tilde{\lambda}^2 \Delta v_o^2}{12 v_o^2 (\tilde{\lambda}^2 + 4t_f^2 \Delta v_0^2)}} \cong \frac{t_f \Delta v_o}{v_o 2\sqrt{3}} \quad (12)$$

It should be noted that neither the temporal focal length nor the temporal duration are directly dependent on the Doppler shifted wavelength $\tilde{\lambda}$, as long as the condition $t_o < v_o \Delta t_o/\Delta v_o$ is met.

An example illustrates what temporal foci are obtainable. A source emits electrons with an energy distribution of 1 eV and a temporal distribution of 100 fs. Electrons traveling at $v_0 = c/3$ and having an energy $E = 31$ keV gives a velocity distribution of $\Delta v_o = 1670$ m/s. If the distance between the source and the temporal lens is 10 cm, $t_o = 1.0$ ns is less than $v_0 \Delta t_o/\Delta v_o \approx 6.0$ ns, satisfying the condition $t_o < v_0 \Delta t_o/\Delta v_o$ and equation (12) is then valid. If the two colors used for the laser beams are 520 nm and 1040 nm, the Doppler-shifted wavelength is $\tilde{\lambda} = 740$ nm. For a laser intensity of $3 \times 10^{12}$ Wcm$^{-2}$ (available with repetition rates up to megahertz), the oscillation frequency in the potential well is $\omega_p \approx 2 \times 10^{12}$ rad/s, which gives a focal time of $t_f \approx 1$ ps. With these parameters, equation (12) gives a temporal duration at the focus of $\Delta t_f \approx 5$ as. To support this ~5 as electron pulse, time-energy uncertainty demands an energy spread of ~50 eV. The ponderomotive compression imparts an energy spread to the electron pulse which can be estimated from $\Delta E \sim m v_0 \lambda/(2t_f)$, giving ~50 eV similar to the uncertainty limit. This $\Delta E$ is very small relative to the accelerating voltage in microscopy (200 keV) and only contributes to a decrease of the temporal coherence. In optical spectroscopy such pulses can still be used as attosecond probes despite the relatively large $\Delta E$ when the chirp is well characterized. Combining the anharmonicity broadening of 15 as, we conclude that ultimately temporal pulse durations in the attosecond regime can be reached.

In the temporal thick lens case, the use of $\omega$ and $2\omega$ to create a co-propagating standing wave requires $v_0 = c/3$. However, the velocity of the electrons, $v_0$, can be tuned by changing the angle of the two laser pulses. A co-propagating standing wave can still be obtained by forcing the Doppler-shifted frequencies of both tilted laser pulses to be equal. A laser pulse that propagates at an angle $\theta$ with the respect to the electron propagation direction has a Doppler-shifted frequency $w = \gamma \omega (1 \pm (v/c) \cos \theta)$, where $\omega$ is the angular frequency in the lab frame, $\vec{v} = v \hat{x}$ is the electron velocity, and $\gamma = 1/\sqrt{1-v^2/c^2}$. When the two laser pulses are directed as shown in FIG. 16, a co-propagating standing wave occurs for an electron with a velocity $v_0 = c(k_1 - k_2)/(k_1 \cos \theta_1 + k_2 \cos \theta_2)$, where the laser pulse travelling with the electron packet has a wave vector of magnitude $k_1$ and makes an angle of $\theta_1$ with the electron propagation axis; the second laser pulse traveling against has a wave vector magnitude of $k_2$ and angle $\theta_2$, in the lab frame. An electron moving at $v_0$ will see a standing wave with an angular frequency, $$\tilde{\omega} = \frac{2(\cos \theta_1 + \cos \theta_2)}{2\cos \theta_1 + \cos \theta_2} \gamma \omega (1 - \beta), \quad (13)$$

where $2k = k_1 = 2k_2$ for experimental convenience, $\omega = kc$, and the wavelength is $\tilde{\lambda} = 2\pi c/\tilde{\omega} = 2\pi/\tilde{k}$.

The standing wave created with arbitrary angles $\theta_1$ and $\theta_2$ will be tilted with respect to the electron propagation direction, which will temporally smear the electron pulse. This tilting of the standing wave can be corrected for by constraining the angles $\theta_1$ and $\theta_2$ to be: $\theta_2 = \arcsin(2 \sin \theta_1)$.

For $\theta_1 = 150$ (forcing $\theta_2 \approx 31°$), electrons with velocity $v_0 = 0.36c$ ($E \approx 33$ keV) see a standing wave. A 1 eV electron energy distribution at the source gives a velocity distribution of $\Delta v_0 \approx 1630$ m/s, at 33 keV. Using the same laser intensity as in the thick lens case, and the new $v_0$ and $\Delta v_o$, the condition $t_o < v_0 \Delta t_o/\Delta v_o$ is still satisfied, allowing equation (13) to be used, resulting in a duration at the focus of $\Delta t_f \approx 4.6$ as. Using the tunable thick lens makes the experimental realization more practical, allowing for easy optical access and electron energy tuning, while at the same time keeping $\Delta t_f$ approximately the same. For additional tunability, an optical parametric amplifier can be used so that the laser pulse frequencies are not restricted to $\omega$ and $2\omega$.

Figure 17:
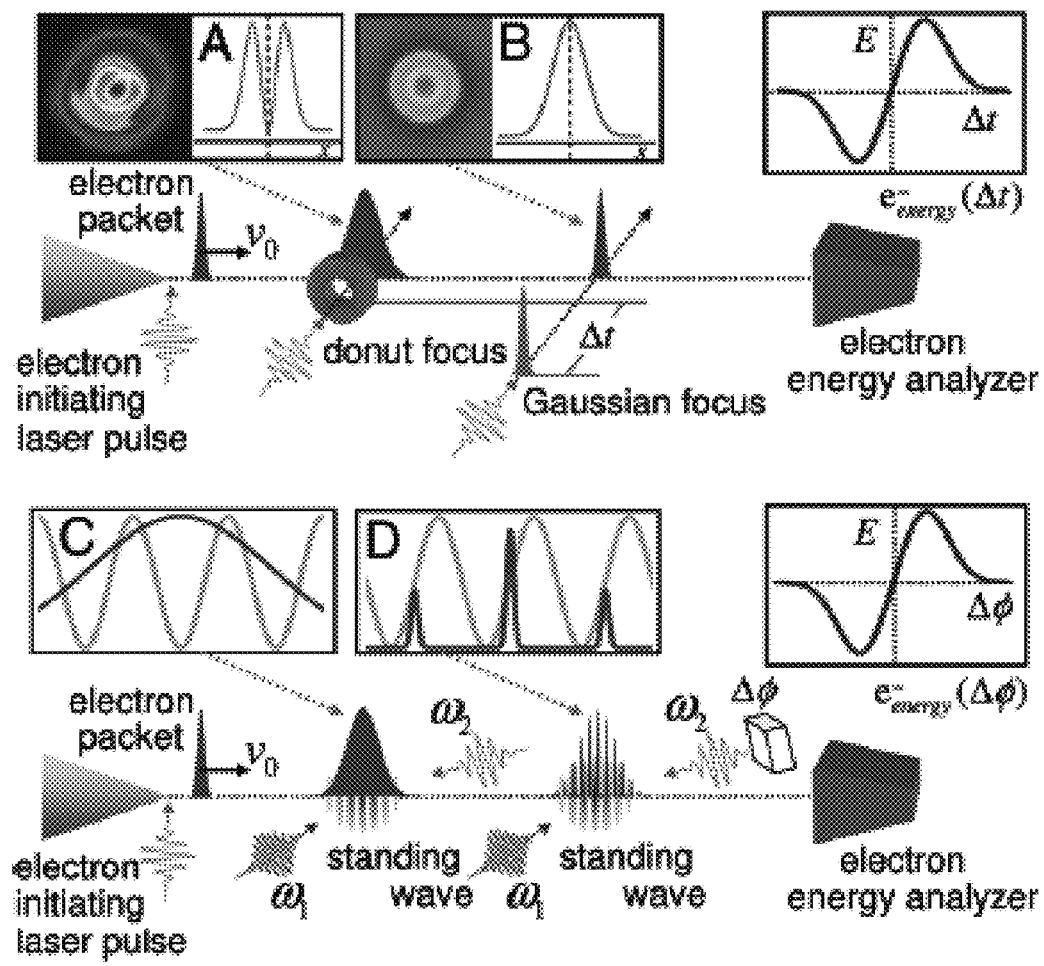
FIG. 17 illustrates methods for measuring femtosecond and attosecond compressed electron packets according to an embodiment of the present invention.

The ability to create electron pulses with duration from ~10 fs to ~10 as raises a challenge regarding the measuring of their duration and shape. Two different schemes are presented here for measuring pulses compressed by thick and thin temporal lenses. For measuring the thin lens compressed electron packet, the focused packet could be intersected by a laser pulse with a Gaussian spatial focus as illustrated in FIG. 17. An optical delay line would control the time delay between the measuring laser pulse and the compressed electron packet. As the time delay, $\Delta t$, is varied, so is the average energy of the electrons, as shown in FIG. 17. If the delay time is zero, then the average electron energy will be unaffected, as there is no force. If the delay line is changed so that the Gaussian pulse arrives early (late), then the average energy will decrease (increase). The change in the average energy is dependent on the duration of the electron pulse, and the intensity of the probing laser pulse. If the electron pulse is longer than the duration of the measuring laser pulse, then the change in the average energy will be reduced. The steepness of the average energy as a function of delay time, $\bar{E}(\Delta t)$, is a direct measure of the electron pulse duration, and using fs-pulsed electron energy loss spectra this scheme can be realized.

For the thick lens a similar method is described here. At the focal position and time of the compressed temporal electron packet, a second co-propagating potential is introduced. The positions of the individual wells in the second co-propagating standing wave can be moved by phase shifting one of the two laser beams that create the probing potential (FIG. 17). By varying the phase shift, the potential slope (and hence the force) that the electrons encounter at the focus is changed. If no phase shift is given to the probing standing wave, no average energy shift results. When a phase shift is introduced, the electrons will be accelerated (or decelerated) by the slope of an individual well in the standing wave, and as long as the phase stability between the electrons and the probing standing wave is appropriate, attosecond resolution can be achieved. As the electron pulse duration becomes less than the period of the standing wave, the average electron energy change increases. The electron temporal duration of the compressed electron packet can be determined directly by the steepness of the $\bar{E}(\phi)$ curve.

Diffraction with focused electron probes is among the most powerful tools for the study of time-averaged nanoscale structures in condensed matter. Embodiments of the present invention provide methods and systems for four-dimensional (4D) nanoscale diffraction, probing specific-site dynamics with ten orders of magnitude improvement in time resolution, in convergent-beam ultrafast electron microscopy (CB-UEM). For applications, we measured the change of diffraction intensities in laser-heated crystalline silicon as a function of time and fluence. The structural dynamics (change in 7.3±3.5 ps), the temperatures (up to 366 K), and the amplitudes of atomic vibrations (up to 0.084 angstroms) are determined for atoms strictly localized within the confined probe area of 50-300 nm; the thickness was varied from 2 to 100 nm. A broad range of applications for CB-UEM and its variants are possible, especially in the studies of single-particles and heterogeneous structures.

In fields ranging from cell biology to materials science, structures can be imaged in real-space using electron microscopy. Atomic-scale resolution of structures is usually available from Fourier-space diffraction data, but this approach suffers from the averaging over the selected specimen area which is typically on the micrometer scale. Significant progress in techniques has enabled localization of diffraction to nanometer and even angstrom-sized areas by focusing a condensed electron beam onto the specimen. Parallel illumination with a single electron wavevector is reshaped to a convergent beam with a span of incident wavevectors. This method of convergent beam electron diffraction (CBED), or electron microdiffraction, and with energy filtering, has made possible determination of structures in 3 dimensions with highly precise localization to areas reaching below one unit cell. The applications have been wide-ranging, from revealing bonding charge distribution and local defects and strains in solids to detecting local atomic vibrations and correlations. Today, aberration-corrected, atomic-sized convergent electron beams enable analytical probing using electron-energy-loss spectroscopy (EELS) and scanning transmission electron microscopy (STEM).

In order to resolve structural dynamics with appropriate spatiotemporal resolution, femtosecond (fs) and picosecond (ps) electron pulses are ideal probes because of their picometer wavelength and their large cross section, resulting from the effective Coulomb interaction with atomic nuclei and core/valence electrons of matter. Typically, ultrafast electron diffraction is achieved by initiating the physical or chemical change with a pulse of photons (pump) and observing the ensuing dynamics with electron pulses (probe) at later times. By recording sequentially delayed diffraction frames a "movie" can be produced to reveal the temporal evolution of the transient structures involved in the processes under study.

Figure 18:
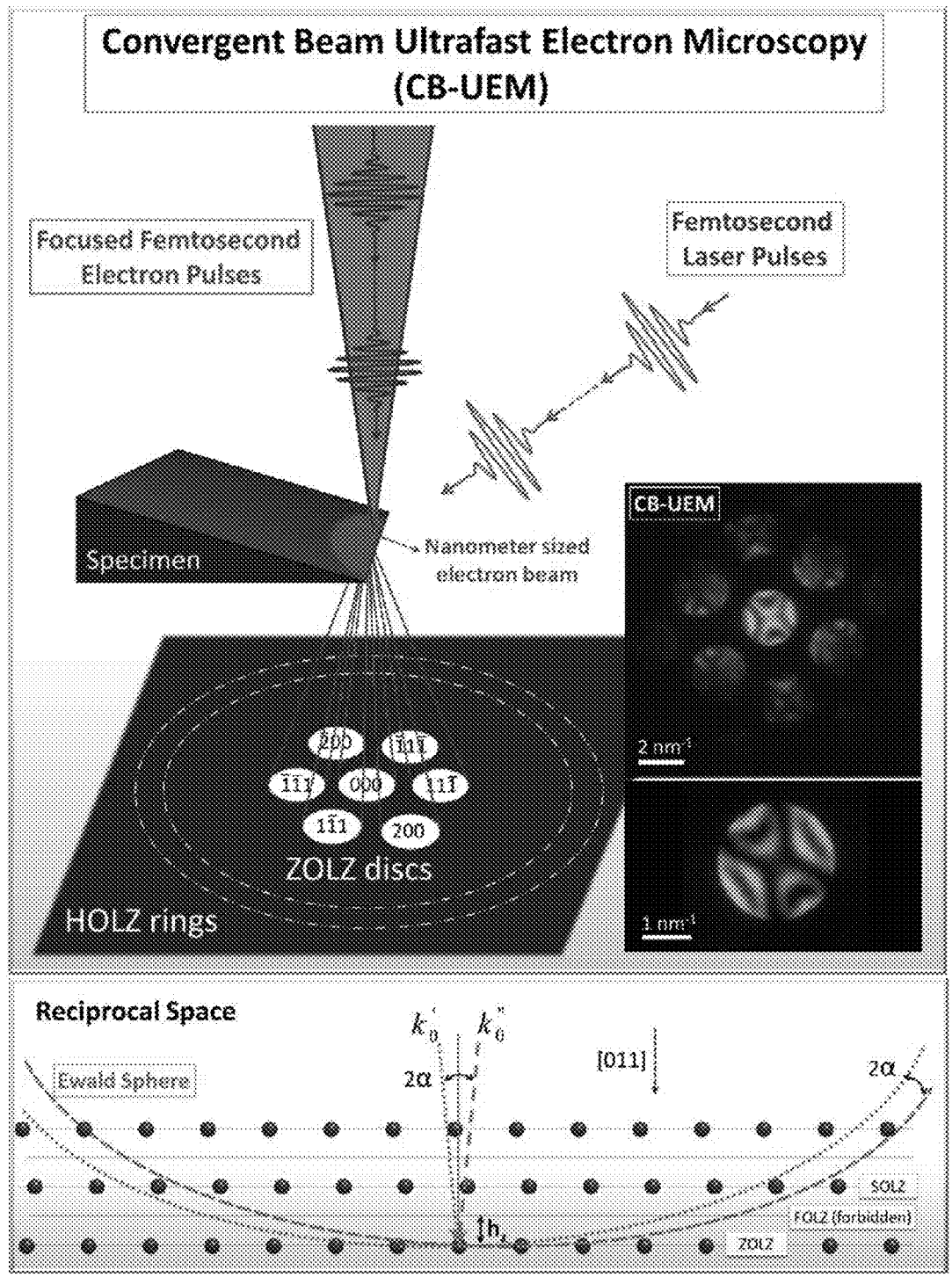
FIG. 18 is a simplified schematic diagram of a convergent beam ultrafast electron microscope according to an embodiment of the present invention.

FIG. 18 is a simplified schematic diagram of a CB-UEM set-up (top), and observed low-angle diffraction discs according to an embodiment of the present invention. Femtosecond electron pulses are focused on the specimen to form a nanometer-sized electron beam. Structural dynamics are determined by initiating a change with a laser pulse and then observing the consequences using electron packets delayed in time. Insets (right) show the CB-UEM patterns taken along the Si [011] zone axis at different magnifications. At the high camera length used, only the ZOLZ discs indexed in the figure are visible; the kinematically-forbidden 200 disc appears as a result of dynamic scattering. In the reciprocal space representation of the diffraction process (bottom) the Ewald sphere has an effective thickness of 2α, the convergence angle of the electron beam. The diamond structure of Si forbids any reflections from odd numbered Laue planes when the zone axis is [011].

Embodiments of the present invention provide CB-UEM methods and systems with applications in the study of nanoscale, site-selected structural dynamics initiated by ultrafast laser heating ($10^{14}$ K/s). Because of the femtosecond pulsed-electron capability, the time resolution is ten orders of magnitude improved from that of conventional TEM, which is milliseconds; and because of beam convergence, high-angle Bragg scatterings are visible with their intensities being very sensitive to both the 3D structural changes and amplitudes of atomic vibrations. The CB-UEM configuration is shown in FIG. 18; our chosen specimen is a crystalline silicon slab, a prototype material for such investigations. From these experiments, it is found that the structural change within the locally probed site occurs with a time constant of 7.3±3.5 ps, which is on the time scale of the rise of lattice temperature known for bulk silicon. For these local sites, the temperatures measured at different laser fluences range from 299° K to 366° K, corresponding to vibrational amplitude changes from 0.077 Å to 0.084 Å, respectively. The reported results would be impossible to obtain with conventional, parallel beam diffraction.

The electron microscope is integrated with a fs oscillator/amplifier laser system. The fundamental mode of the laser at 1036 nm was split into two beams: the first was frequency doubled to 518 nm and used to initiate the heating of the specimen, whereas the second, which was frequency tripled, was directed to the microscope for extracting electrons from the cathode. The time delay between pump and probe was adjusted by changing the relative optical path lengths of these two pulses. The pulses were sufficiently separated in time (5 μs) to allow for cooling of the specimen.

The electron packets were accelerated to 200 keV (corresponding to a de Broglie wavevector of 39.9 Å$^{-1}$), de-magnified, and finally focused (with a 6 mrad convergence angle) to an area of 50-300 nm diameter on the wedge-shaped specimen, as shown in FIG. 18. A wide range of thicknesses, starting from ~2 nm was accessible simply by moving the electron beam laterally. The silicon specimen was prepared by mechanical polishing of a wafer along the (011) planes, followed by Ar ion-milling for final thinning/smoothing; the wedge angle was 2°. In the microscope, Kikuchi lines were observed and used as a guide to orient the specimen with the [011] zone axis either parallel or tilted relative to the incident electron beam direction.

Figure 19:
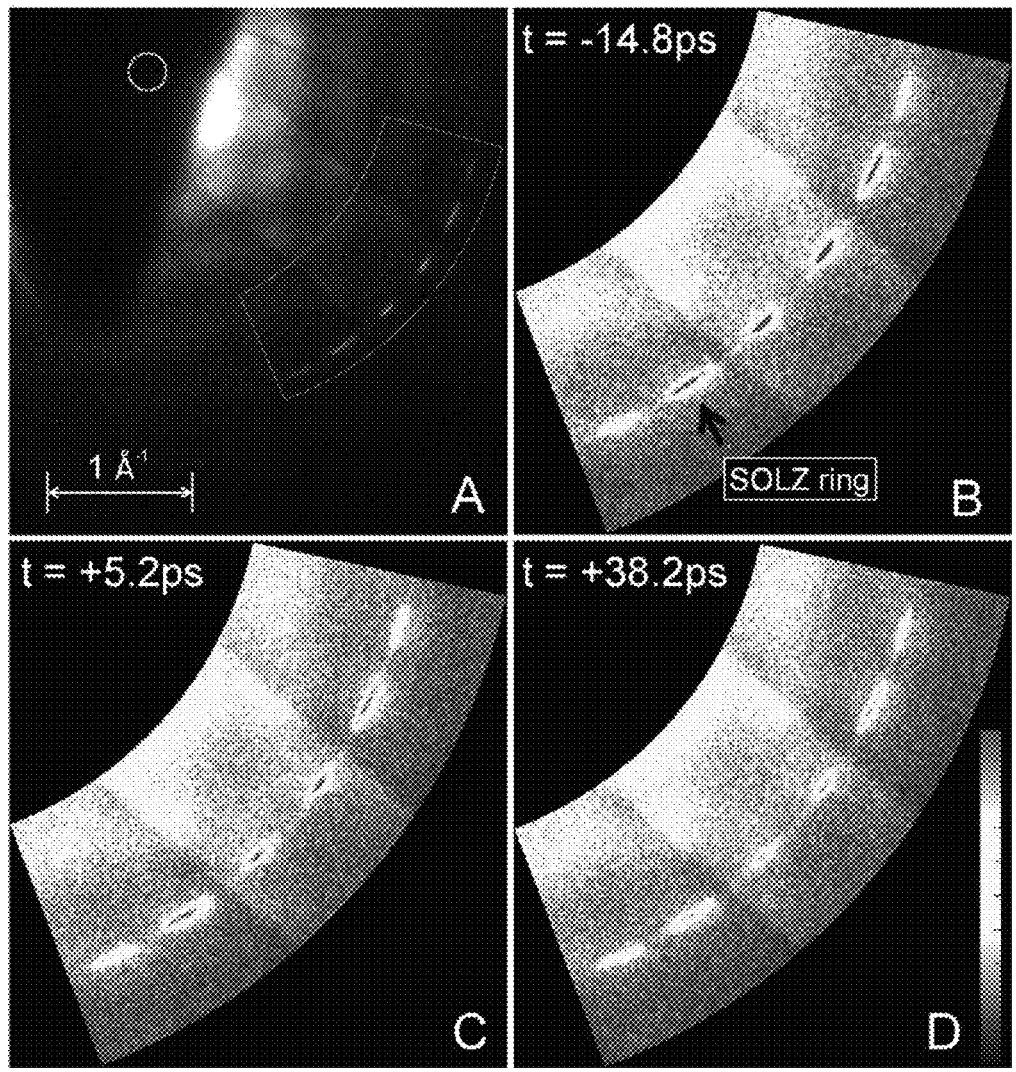
FIG. 19 illustrates temporal frames measured using the convergent beam ultrafast electron microscope illustrated in FIG. 18.

FIG. 18 display the typical high-magnification (high-value camera length) CB-UEM patterns of Si obtained when the specimen is unexcited and the zone axis is very close to [011]; the magnification (>10x) cab be seen by comparing the disc length scale in FIG. 18 and ring radius in FIG. 19. Unlike parallel-beam diffraction which yields spots, convergent-beam diffraction produces discs in reciprocal space (back focal plane of the objective lens) with their diameter given by the convergence angle ($2\alpha$) of the electron pulses. These discs form the Zero Order Laue Zone (ZOLZ) of the pattern; they show white contrast with thin specimens and exhibit the interference patterns displayed in FIG. 18 when the thickness is increased.

In the reciprocal space, the effective thickness of the Ewald sphere is $2\alpha$ (bottom panel of FIG. 18), giving rise to multiple spheres that can intersect with Higher Order Laue Zones (HOLZ) reflections, the focus of this study (see FIG. 19) and the key to 3D structural information; the first and second zones, FOLZ and SOLZ, are examples of such zones or rings. The interference patterns in the disks are the result of dynamical scattering in silicon and are reproduced in our CB-UEM patterns (FIG. 18).

The scattering vectors of HOLZ rings (R) are related to the inter-zone spacing in the reciprocal space ($h_z$ in $Å^{-1}$) by the tilt angle from the zone axis ($\eta$) and by the magnitude of the incident electron's wavevector ($k_0$). In the plane of the detector and for our tilt geometry, the HOLZ ring scattering vector is given by (equation (14)):

$$R \cong (k_0^2 \sin^2(\eta) + 2k_0 h_z)^{1/2} - k_0 \sin(\eta), \quad (14)$$

where, for our case of the [011] zone axis, $h_z = n/(\mu\sqrt{2})$ with $n=1, 2, 3 \ldots$ for the different Laue zones. Additionally, for this zone axis, $k+l=n$, where (hkl) are the Miller indices of the reciprocal space. When $k+l=1$, for FOLZ, k and l must have different parity, which is forbidden by the symmetry of the diamond Si structure. Therefore, the FOLZ along the [011] zone axis should be absent and the first visible ring should belong to SOLZ; in general, all odd numbered zones will be forbidden. Here, HOLZ indexing is defined according to the fcc unit cell and not to the primitive one [1].

FIG. 19 illustrates temporal frames obtained using CBUED. In FIG. 19(*a*) high angle SOLZ ring obtained for a tilt angle of 5.15° from the [011] zone axis are shown. Besides SOLZ, Kikuchi lines and periodic bands (due to atomic correlations) are visible. The ZOLZ discs are blocked (top left) to enhance the dynamic range in the area of interest; the disc of the direct beam (the center one in FIG. 18 discs) is indicated by a circle. The intensity scale is logarithmic. In FIG. 19(*b, c, d*) time frames of the SOLZ ring are shown by color mapping for visualization of dynamics. The intensity of the ring changes within picoseconds, but the surrounding background remains at the same level.

FIG. 19(*a*) presents the HOLZ ring taken with the CB-UEM. In order to reduce the strong on-zone-axis dynamic scattering (and to bring the high scattering angles into the range of the recording camera), the slab was tilted 5.15° away from the [011] zone axis, along the [022] direction. The scattering vector of the Bragg points of the ring, from the direct beam position, was measured to be 2.2 $Å^{-1}$, close to the value of 2.22 $Å^{-1}$ obtained by using equation (14) for $n=2$, which identifies the spots shown as part of the SOLZ. From this value, the know lattice separation of 5.4 Å was obtained for silicon.

In addition to the SOLZ ring, Kikuchi lines and some oscillatory bands are also visible in the CB-UEM, as seen in FIG. 19(*a*). Kikuchi lines arise from elastic scatterings of the inelastically scattered electrons, whereas the oscillatory bands in the thermal diffuse scattering (TDS) background result from correlations between the atoms. We also observed deficit HOLZ lines and interference fringes in ZOLZ discs for a two-beam condition.

The temporal behavior is displayed in FIG. 19, with three CB-UEM frames taken at time delays of $t=-14.8$ ps, +5.2 ps, and +38.2 ps, together with a static image; the zero of time is defined by the coincidence of the pump and probe pulses in space and time. The frame at negative time has higher ring intensity than that observed at +38.2 ps, whereas the +5.2 ps frame shows an intermediate intensity value. It is clear from the results that the intensity change is visible within the first 5 ps of the structural dynamics. For quantification, the intensities in each frame were normalized to the area of azimuthally integrated background. The normalization of the HOLZ ring intensities to the TDS background makes the atomic vibration estimations insensitive to the thickness changes of the probed area, which may result from slight beam jittering.

Figure 20:
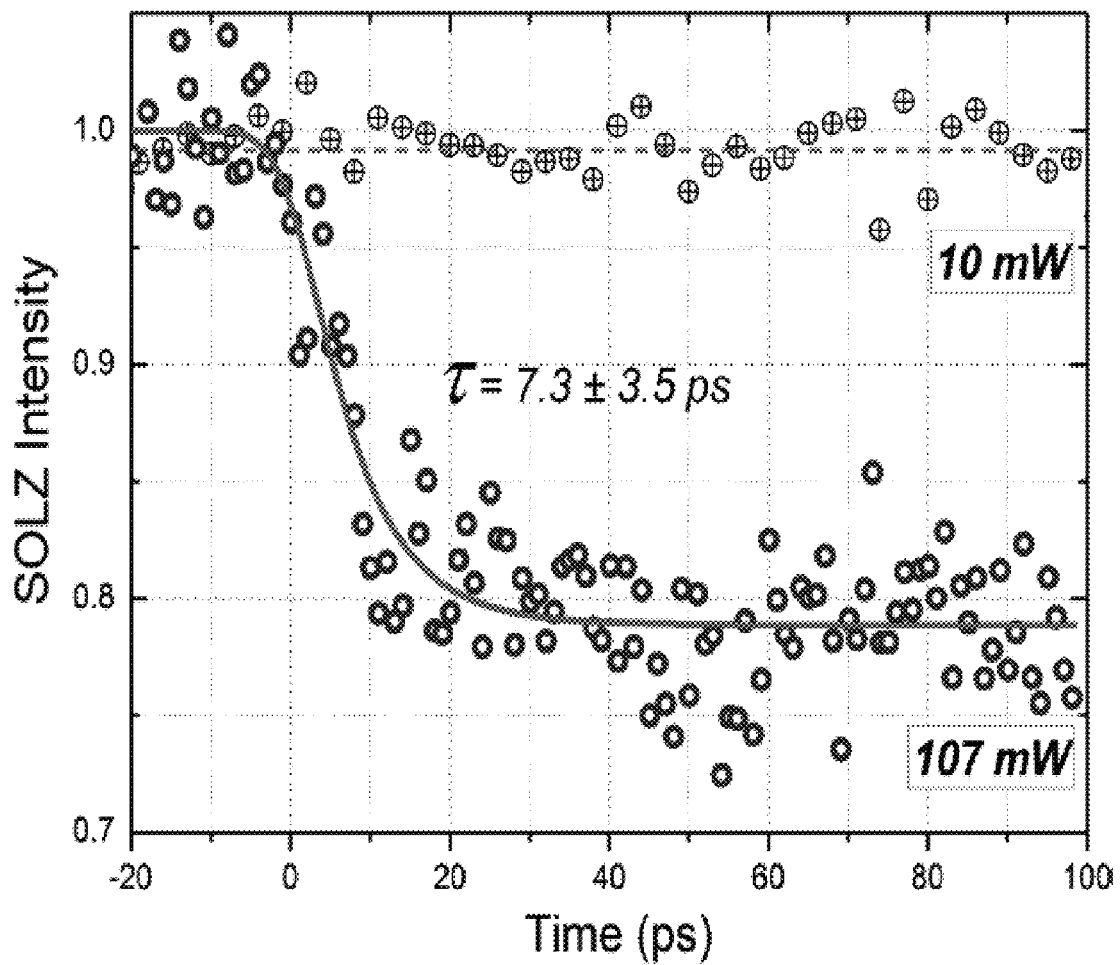
FIG. 20 is a plot of diffraction intensities as a function of time and fluence according to an embodiment of the present invention.

FIG. 20 illustrates diffraction intensities at different times and fluences. Normalized, azimuthally-integrated intensity changes of the SOLZ ring are shown with time ranging from $-20$ ps to $+100$ ps, for two different laser powers. Whereas the 10 mW response does not show noticeable dynamics, the 107 mW transient has a clear intensity change with a characteristic time of $7.3\pm3.5$ ps. The range of fluences studied was 1.7 to 21 mJ/cm² (see FIG. 21). The red curve is a mono-exponential fit based on the Debye-Waller effect. The red dashed line through the 10 mW data is an average of the points after +20 ps. The dependence on fluence is given in FIG. 21.

FIG. 20 depicts the transient behavior of the SOLZ ring intensity for two different laser power, 10 mW and 107 mW, corresponding to pulse fluence of 1.7 and 19 mJ/cm², respectively; the heating laser beam diameter on the specimen is 60 µm. The intensities were normalized to the average value obtained at negative times. Whereas the intensity change is essentially absent in the 10 mW data, the results for the 107 mW set shows a transient behavior with a characteristic time of $7.3\pm3.5$ ps, obtained from the mono-exponential fit shown in red in the figure. The temporal response of UEM-2 is on the fs time scale, as obtained by EELS, and it is much shorter than the 7 ps illustrated here.

The local heating of the lattice is responsible for the SOLZ intensity change with time. A pump laser, in our case at 518 nm (2.4 eV), excites the valance electrons of Si to the conduction band; one-photon absorption occurs through the indirect bandgap at 1.1 eV, and multi-photon absorption excites electron-hole pairs through the direct gap. The excited carriers thermalize within 100 fs, via carrier-carrier scatterings, and then electron cooling takes place in ~1 ps, by electron-phonon coupling. During this time lattice heating occurs through increased atomic vibration, reducing SOLZ intensity. The effective lattice temperature is ultimately established with a time constant of a few picoseconds depending on density of carriers or fluence. However, in CB-UEM measurements the lattice-temperature rise could be slower than in bulk depending on the dimension of the specimen relative to the mean free path of electrons in the solid.

The dynamical change can be quantified by considering a time-dependent Debye-Waller factor with an effective temperature describing the decrease in the Bragg spot intensity with time. If the root-mean-square (rms) displacement of the atoms, $\langle u_x^2 \rangle^{1/2}$, along one of the three principle axes is denoted by $u_x$ for simplicity, and the scattering vector by s, then the HOLZ ring intensity can be expressed as (equation (15)):

$$I_{Ring}^F(t) = I_0(t_-) \exp[-4\pi^2 s^2 u_x^2(t)], \quad (15)$$

where $I_{Ring}^F(t)$ is the measured intensity for a given fluence, F, and the vibrational amplitude is now time dependent. Note that $u_x$ is 1/3 of the total, $u_{total}$.

In the Einstein model of atomic vibrations, which has been used successfully for silicon, the atoms are treated as independent harmonic oscillators, with the three orthogonal components of the vibrations decoupled. As a result, a single frequency ($\omega$) is sufficient to specify the energy eigenstates of the oscillators. The relationship of the vibrational amplitude to temperature can be established by simply considering the Boltzmann average over the populated eigenstates. Consequently, the probability distribution of atomic displacements is derived to be of Gaussian form, with a standard deviation corresponding to the rms ($u_x$) of the vibration involved (equation (16)):

$$u_x = [(\hbar/2\omega m)\cot h(\hbar\omega/2k_B T_{eff})]^{1/2} \quad (16)$$

where $\hbar$ is Planck's constant, $k_B$ the Boltzmann constant, $T_{eff}$ in our case the effective temperature, and m the mass of the oscillator. In the high temperature limit, i.e. when $\hbar\omega/2k_B T \ll 1$, eq. 3 simplifies to $m\omega^2 u_x^2 = k_B T$, which is the classical limit for a harmonic oscillator; the zero-point energy, which contributes almost half of the mean vibration amplitude at room temperature, is included in equation (16). The value of $\hbar\omega$ is 25.3 meV. Despite its simplicity, the Einstein model in equation (16) was remarkably successful in predicting the HOLZ rings and TDS intensities by multi-slice simulations.

Figure 21:
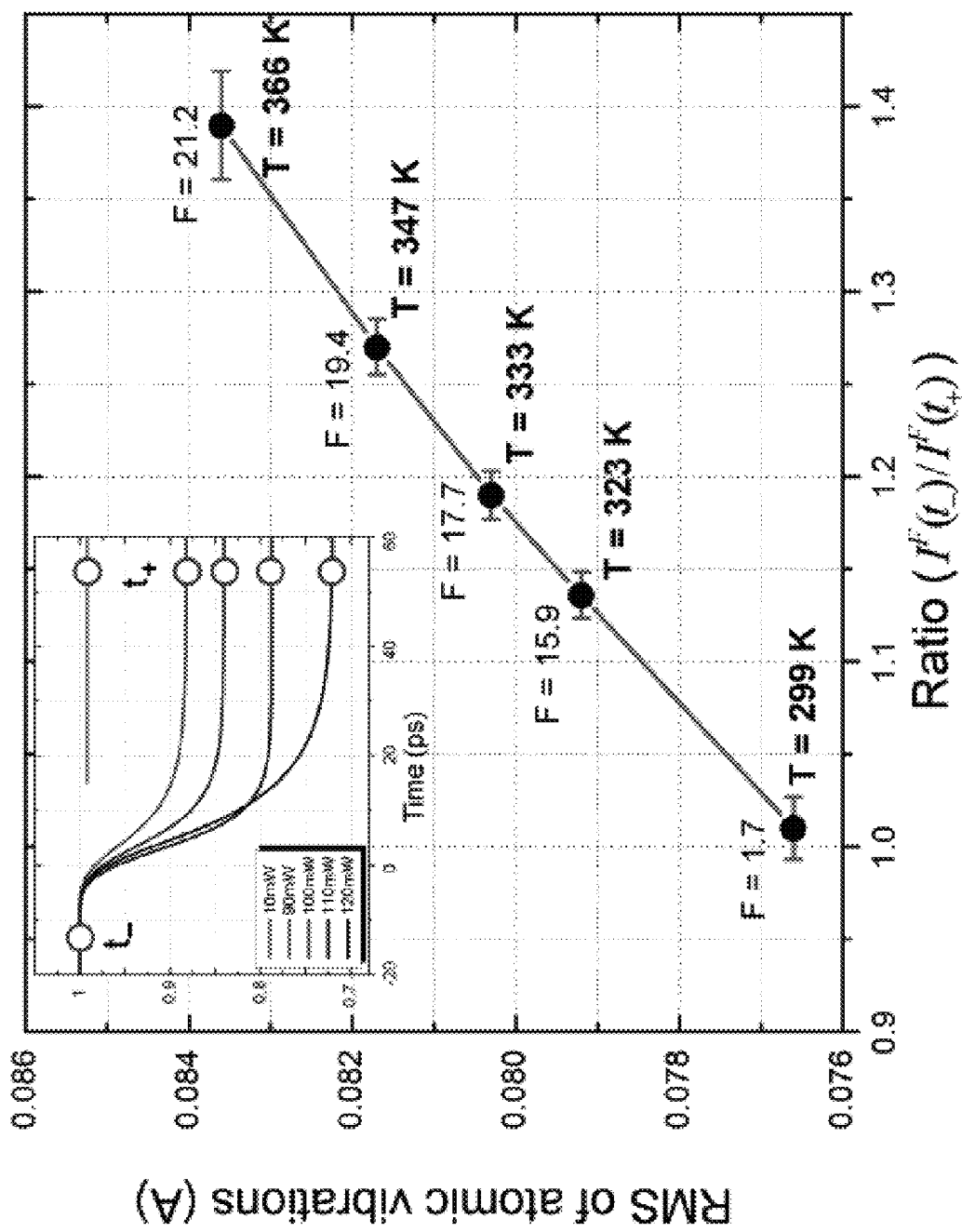
FIG. 21 is a plot of amplitudes of atomic vibrations as a function of observed intensity changes at different fluences according to an embodiment of the present invention.

FIG. 21 illustrates the amplitudes of atomic vibrations (rms) plotted against the observed intensity change at different fluences. The inset shows the mono-exponential temporal behavior, with the asymptotes highlighted (circles) for their values at different fluences. The fluence was varied from 1.7 to 21 mJ/cm². This comparative study of the effect of the fluence was performed at a slightly different sample tilt (corresponding to s=2.7 Å$^{-1}$), corresponding to a thickness of ~80 nm. For each fluence, the temperature represents the effective value for the lattice structural change. The error bars given were obtained from the fits at the asymptotes shown in the inset, and they are determined by the noise level of temporal scans.

In FIG. 21, we present the change in the asymptotic intensity with fluence (inset), and the derived vibrational amplitudes for the different temperatures. The amplitudes are directly obtained from equation (15), as s is experimentally measured. The relative temperature change (from $t_-$ to $t_+$) is then derived from equation (16), taking the value of $u_x$ at room temperature (297° K) to be 0.076 Å. The amplitude of atomic vibrations, and hence the temperature, increases as the fluence of the initiating pulse increases. Although the trend is expected for an increased $u_x$ with temperature, the absolute values, from 0.077 to 0.084 Å, correspond to a large 3.2% to 3.6% change in nearest neighbor separation; these values are still well below the 15% criterion for a melting phase transition.

The linear thermal expansion coefficient has been accurately determined for silicon, and for a value of 2.6×10$^{-6}$K$^{-1}$ at room temperature the vibrational amplitudes reported here are much higher than the equilibrium thermal values at the same temperature. This is because the effective temperature applies to a lattice arrested in a picosecond time window; at longer times, the vibrations equilibrate to a lower temperature. As such, measuring nanoscale local temperatures on the ultrashort time scale enhances the sensitivity of the probe thermometer by orders of magnitude. Moreover, the excitation per site is significantly enhanced. For a single-photon absorption at the fluence used, we estimate, for a 60 nm-thick specimen, the number of absorbed photons per Si atom (for the fs pulse employed) to be ~0.01, as opposed to 10$^{-9}$ photons per atom if the experiments were conducted in the time-averaged mode.

The achievement of nanoscale diffraction with convergent-beam ultrafast electron microscopy opens the door to exploration of different structural, morphological, and electronic phenomena. The spatially focused and timed electron packets enable studies of single particles and structures of heterogeneous media. Extending the methodology reported here to other variants, such as EELS, STEM and nanotomography, promises possibilities for mapping individual unit cells and atoms on the ultrashort time scale of structural dynamics.

With 4D electron microscopy, in situ imaging of the mechanical drumming of a nanoscale material is measured. The single crystal graphite film is found to exhibit global resonance motion that is fully reversible and follows the same evolution after each initiating stress pulse. At early times, the motion appears "chaotic" showing the different mechanical modes present over the micron scale. At longer time, the motion of the thin film collapses into a well defined fundamental frequency of 0.54 MHz, a behavior reminiscent of mode locking; the mechanical motion damps out after ~200 ps and the oscillation has a "cavity" quality factor of 150. The resonance time is determined by the stiffness of the material and for the 53-nm thick and 55-μm wide specimen used here we determined Young's modulus to be 0.8 TPa, for the in-plane stress-strain profile. Because of its real-time dimension, this 4D microscopy has applications in the study of these and other types of materials structures.

Structural, morphological, and mechanical properties of materials have different length and time scales. The elementary structural dynamics, which involve atomic movements, are typically of picometer length scale and occur on the time scale of femto (fs) to picoseconds (ps). Collective phenomena of such atomic motions, which define morphological changes, are observed on somewhat longer time scale, spanning the ps to nanosecond (ns) time domain, and the length scale encompasses up to sub-micrometers. These microscopic structures are very different in behavior from those involved in the mechanical properties. On the nanoscale, when the membrane-like mechanical properties have high frequencies and complex spatial-mode structures, imaging becomes of great value in displaying the spatiotemporal behavior of the material under stress.

Utilizing embodiments of the present invention, we have visualized nanoscale vibrations of mechanical drumming in a single-crystalline graphite film (53-nm thick). To study the transient structures, in both space and time, our method of choice has been 4D ultrafast electron microscopy (UEM). This microscope enables investigation of the atomic structural and morphological changes in graphite on the fs to ns time scale and for nm-scale resolution. Additionally, mechanical properties can be determined in real time, which are evident on the ns and microsecond (μs) time scale. The stress is introduced impulsively using a ns laser pulse while observing the motions in real space (in situ) in the microscope using the stroboscopic electron pulses. Remarkably, at times immediately following the initiating pulse the motion appears "chaotic" in the full image transients, showing the different mechanical modes present in graphite. However, after several μs the motion of the nanofilm collapses into a final global resonance of 0.54 MHz. From this resonance of mechanical drumming of the whole plate, we obtained the in-plane Young's modulus of 0.8 terapascal (Tpa). The reported coherent resonance represents the in-phase build up of a mechanical drumming, which is directly imaged without invasive probes.

Graphite was chosen because of its unique material properties; it is made of stacked layers of 2D graphene sheets, in which the atoms of each sheet are covalently bonded in a honeycomb lattice, and the sheets separated by 0.335 nm are weakly held together by van der Waals forces. It displays anisotropic electromechanical properties of high strength, stiffness, and thermal/electric conductivity along the 2D basal planes. More recently, with the rise of graphene, a new type of nano-electromechanical system (NEMS) has been highlighted with a prototypical NEMS being a nanoscale resonator, a beam of material that vibrates in response to an applied external force. With the thicknesses reaching the one atomic layer, graphene remains in a high crystalline order, resulting in a NEMS with extraordinary thinness, large surface area, low mass density, and high Young's modulus.

Briefly, the setup for ultrafast (and fast) electron imaging involves the integration of laser optical systems into a modified transmission electron microscope (TEM). Upon the initiation of a structural change by either heating of the specimen or through electronic excitation by the laser pulses, an electron pulse generated by the photoelectric effect is used to probe the specimen with a well-defined time delay. A microscopy image or a diffraction pattern is then taken. A series of time-framed snapshots of the image or the diffraction pattern recorded at a number of delay times provides a movie, which displays the temporal evolution of the structural (morphological) and mechanical motions, using either the fs or ns laser system.

Because here the visualization is that of the mechanical modes with resonances on the MHz scale, the ns resolution was sufficient. The electrons are accelerated to 200 kV with a de Broglie wavelength of 2.5079 pm. Two laser pulses were used to generate the clocking, excitation pulse at 532 nm and another at 355 nm for the generation of the electron pulse for imaging. The time delay was controlled by changing the trigger time for electron pulses with respect to that of clocking pulses. The delay can be made arbitrarily long and the repetition rate varies from a single shot to 200 kHz, to allow complete heat dissipation in the specimen. The experiments were carried out with a natural single crystal of graphite flakes on a TEM grid. Graphite flakes were left on the surface, covering some of the grid squares completely. The observed dynamics are fully reversible, retracing the identical evolution after each initiating pulse; each image is constructed stroboscopically, in a half second, from typically 2500 pulses of electrons and completing all time-frames (movies) in twenty minutes.

Figure 22:
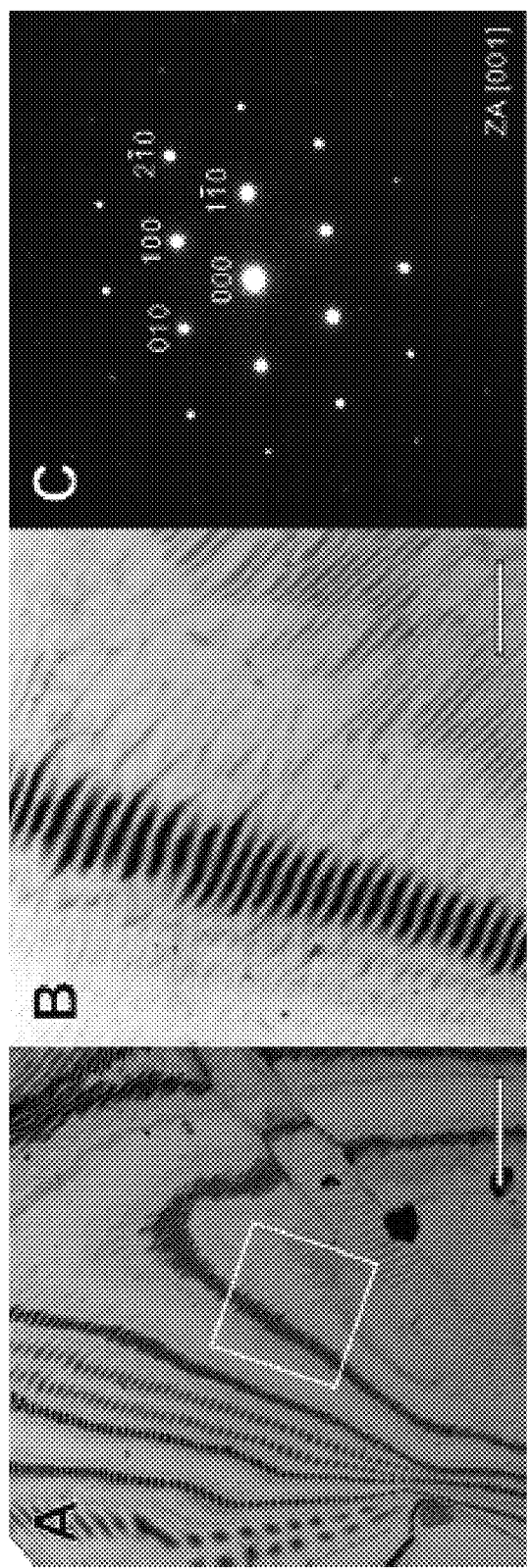
FIG. 22 illustrates images and diffraction patterns of a graphite sample according to an embodiment of the present invention.

FIG. 22 illustrates images and the diffraction pattern of graphite. (A), an image shows features of fringes in contrast (scale bar: 5 µm). Sample thickness was measured to be 53 nm using electron energy loss spectroscopy (EELS). (B) Magnified view of the indicated square of panel A (scale bar: 1 µm). (C) Diffraction pattern obtained by using a selected area diffraction aperture (SAD), which covered an area of 6 µm in diameter on the specimen. The incident electron beam is parallel to the [001] zone axis. Bragg spots are indexed as indicated for some representative ones.

Panels A and B of FIG. 22 show the UEM (bright field) images of graphite, and in panel C, a typical electron diffraction pattern is given. The Bragg spots are indexed according to the hexagonal structure of graphite along the [001] zone axis, with the lattice dimension of a=b=2.46 Å (c=6.71 Å). In FIG. 22A, and at higher magnification in FIG. 22B, contrast fringes are clear, typically consisting of linear fringes having ~1 µm length and a few hundred-nm spacing. These contrast fringes are the result of physical bucking of the graphene layers by constraints or by nanoscale defects within the film. In the dark regions, the zone axis (the crystal [001]) is well aligned with the incident electron beam and electrons are scattered efficiently, whereas in the lighter regions the alignment of the zone axis deviates more and the scattering efficiency is lower. With these contrast patterns, changes in image provide a sensitive visual indicator of the occurrence of mechanical motions. The black spots are natural graphite particles.

Figure 23:
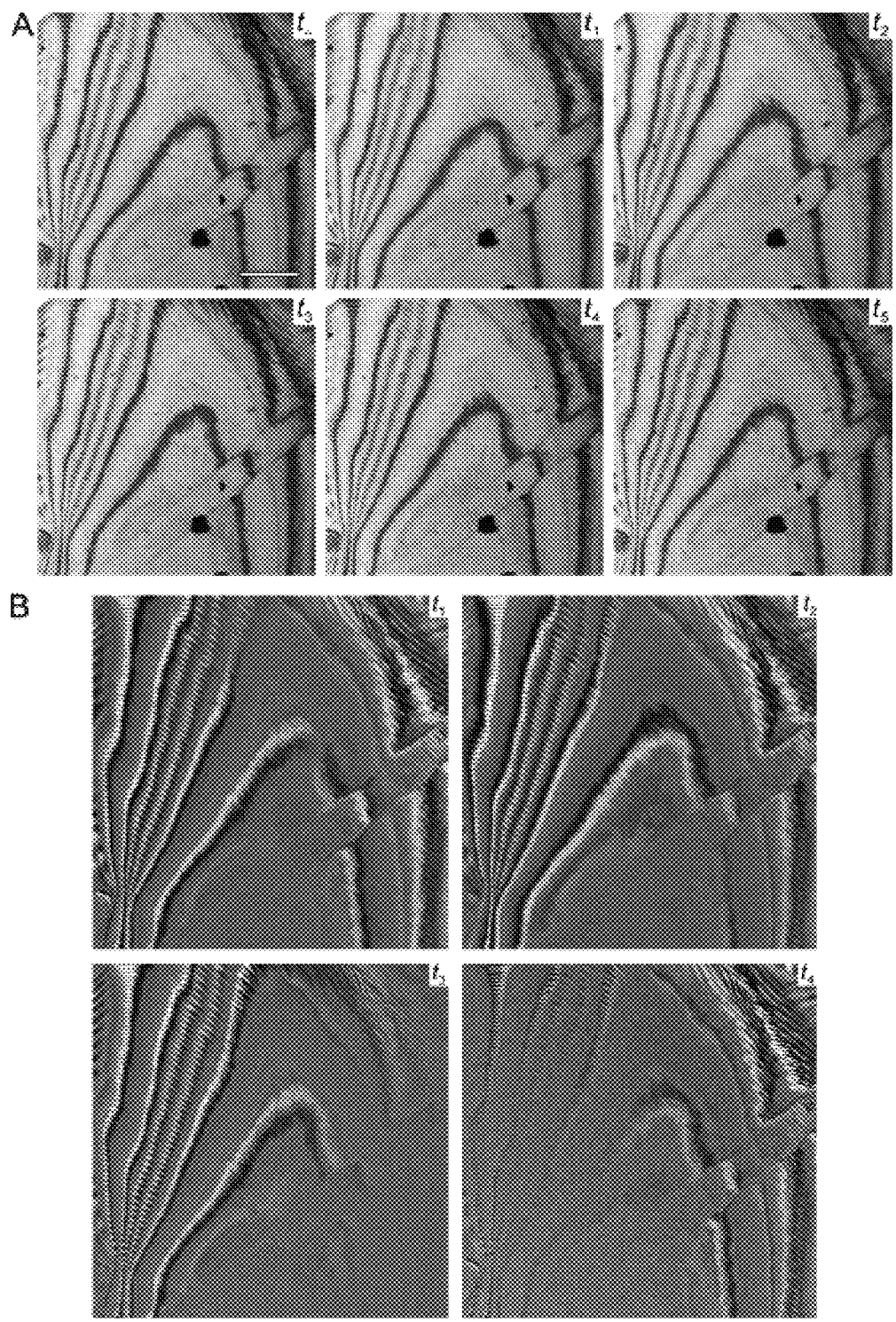
FIG. 23 illustrates time-resolved images and difference frames for a graphite sample according to an embodiment of the present invention.

FIG. 23 illustrates representative image snapshots and difference frames. (A) Images recorded stroboscopically at different time delays, indicated at the top right corner of each image ($t_1$, $t_2$, $t_3$, $t_4$, and $t_5$), after heating with the initiating pulse (fluence=7 mJ/cm$^2$); $t_1$=200 ns; $t_2$=500 ns; $t_3$=10 µs; $t_4$=30 µs; $t_5$=60 µs; and the negative time frame was taken at −1000 ns. Note the change in position of fringes with time, an effect that can be clearly seen in FIG. 23B. (B) Image difference frames with respect to the image taken at ~1 µs, i.e., Im(−1 µs; t), which show the image change with time. The reversal in contrast clearly displays the oscillatory (resonance) behavior.

In FIG. 23(A), we display several time-framed images of graphite taken at a repetition rate of 5 kHz and at delay times indicated with respect to the clocking (heating) pulse with the fluence of 7 mJ/cm$^2$. At positive times, following t=0, visual changes are seen in the contrast fringes. With time, the contrast fringes change their location in the images, and with these and other micrographs of equal time steps we made a movie of the mechanical motions of graphite following the ns excitation impulse. To more clearly display the temporal evolution on the nanoscale, image-difference frames were constructed.

In FIG. 23(B), depicted are the images obtained when referencing to the −1 µs frame, i.e., Im(−1 µs; t). In the difference images, the regions of white or black indicate locations of surface morphology change (contrast pattern movement), while gray regions are areas where the contrast is unchanged from that of the reference frame. Care was taken to insure the absence of long-term specimen drifts as they can cause apparent contrast change; note that in the difference images, the static features are not present. The image changes, reported in this study, are fully reproducible, retracing the identical evolution after each initiating laser pulse, as mentioned above. The reversal of contrast with time in FIG. 23(B) directly images the oscillatory behavior of the drumming.

The image change was quantified by using the method of cross-correlation. The normalized cross correlation of an image at time t with respect to that at time t' is expressed as $$\gamma(t) = \frac{\sum_{x,y} C_{x,y}(t) C_{x,y}(t')}{\sqrt{\sum_{x,y} C_{x,y}(t)^2 \sum_{x,y} C_{x,y}(t')^2}} \quad (17)$$

where the contrast $C_{x,y}(t)$ is given by $[I_{x,y}(t)-\bar{I}(t)]/\bar{I}(t)$, and $I_{x,y}(t)$ and $I_{x,y}(t')$ are the intensities of pixels at the position of (x,y) at times t and t'; $\bar{I}(t)$ and $\bar{I}(t')$ are the means of $I_{x,y}(t)$ and $I_{x,y}(t')$, respectively. This correlation coefficient $\gamma(t)$ is a measure of the temporal change in "relief pattern" between the two images being compared, which can be used as a guide to image dynamics as a function of time. Shown in FIG. 24 are cross-correlation values between the image at each measured time point and a reference image recorded before the arrival of the clocking pulse.

Figure 24:
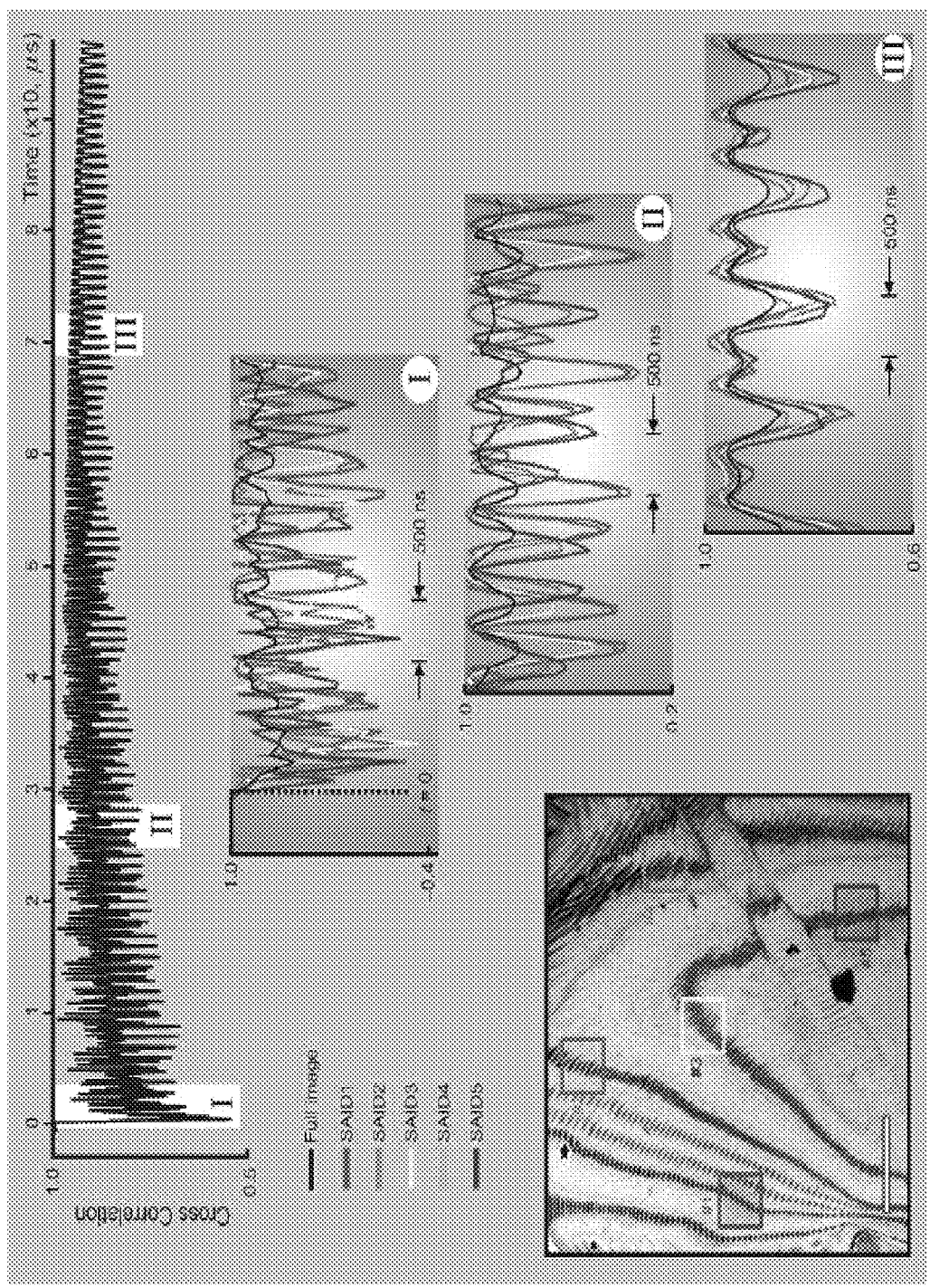
FIG. 24 illustrates time dependence of image cross correlation according to an embodiment of the present invention.

FIG. 24 illustrates the time dependence of image cross correlation. The whole scan for 100 µs is made of 2000 images taken at 50-ns steps. Also depicted are the zoomed-in image cross-correlations of three representative time regimes (I, II, and III). In each zoomed-in panel, the selected-area image dynamics of five different regions are included. Note the evolution from the "chaotic" to the global resonance (drumming) behavior at long times.

Over all pixels, the time scale for image change covers the full range of time delays, from tens of ns to hundreds of µs, indicating the collective averaging over the sites of the specimen. Upon impulsive heating at t=0, the image cross-correlation changes considerably with an appearance of a "chaotic" behavior, in the ~5 µs range (regime I in FIG. 24). After 10 µs, e.g., regime II, the cross correlation change begins to exhibit periodicity (regime II), and at longer time, a well-defined resonance oscillation emerges (regime III). This is also evident in the selected-area image dynamics (SAID) in several regions (noted as 1 to 5) where the temporal behavior is of different shapes at early time but converges into a single resonance transient after several tens of µs. The shape of image cross correlation dynamics was robust at different fluences, from 2 to ~10 mJ/cm², but the amplitude varies.

The overall decay of the transients is on a time scale shorter than the separation between pulses. In fact, we have verified the influence of repetition rate and could establish the full recovery at the time intervals indicated. Heat transfer must occur laterally. With an initial z-independent heat profile by absorption of the heating pulse in graphite, we estimated, using a 2D heat diffusion in a homogeneous medium, the time scale for an in-plane transfer, with thermal conductivity λ=5300 W/(m·K), density ρ=2260 kg/m³, and specific heat $c_P$=707 J/(K·kg). For the radius at half height of the initial pulse heat distribution $r_0$=30 µm, $t_{1/2}$, the time for the axial temperature to drop to a half of its initial value, is deduced to be ~720 ns, certainly much shorter than the 200-µs time interval between pulses. It follows that the decay of the oscillation [$Q/(\pi \cdot f_0)$], as derived below, is determined by the damping of mechanical motions.

When the specimen absorbs intense laser light, the lattice energy, converted from carriers (electron energy) by electron-phonon coupling, in a few ps, builds up in the illuminated spot on the surface within the duration of the laser pulse. As a consequence, the irradiated volume will expand rapidly following phonon-phonon interaction on the time scale of tens of ps. The resulting thermal stress can induce mechanical vibration in the material, but a coherent oscillatory behavior, due to the thermoelastic stress, will only emerge in the image if the impulsive stress is on a time scale shorter than the period; probing of images should be over the entire time scale of the process, in this case 100 µs. On the ultrashort time scale we have observed the structural and morphological elastic changes.

Figure 25:
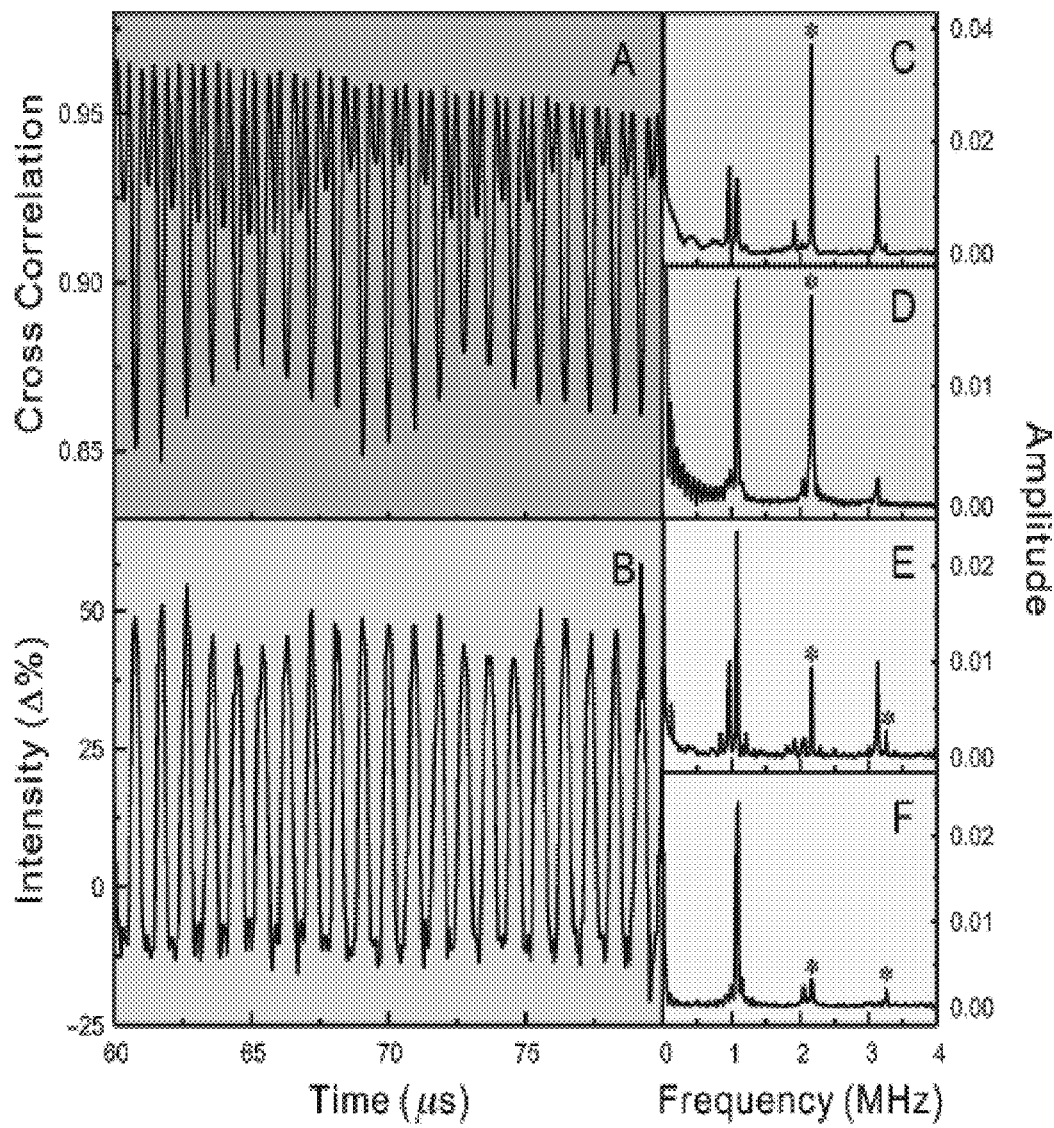
FIG. 25 illustrates resonance dynamics and corresponding FFTs of a graphite sample according to an embodiment of the present invention.

FIG. 25 illustrates resonance dynamics and FFT of graphite. (Left) Time dependences of image cross correlation of full image (A) and image intensity on the selected area of 4×6 pixels as indicated by the arrowhead (B) in FIG. 24. (Right) Fast Fourier transforms of image cross-correlation (C: 0-100 µs; D: 60-100 µs) and image intensity (E: 0-100 µs; F: 60-100 µs). Asterisks in the panels indicate overtones. Note the emergence of the resonance near 1 MHz in panel F.

The resonance modes in graphite are highlighted in FIG. 25 by taking the fast Fourier transform (FFT) of image cross-correlation in the time regime of 0-100 µs. The FFT (FIG. 25C) shows several peaks of different frequencies, among which the strongest one around 2.13 MHz is attributed to the overtone of 1.08 MHz. The overtones, due to the truncated nature of cross-correlation close to the value of 1, are greatly reduced in the FFT of image intensity change (FIGS. 25E and 25F). In a few tens of µs, various local mechanical modes observed at early time damp out and one global mode around 1 MHz survives. The peak when fitted to a Lorentzian yields a resonant frequency of 1.08 MHz, and a "cavity" quality factor Q (=$f_0/\Delta f$)=150±30. This dominant peak gives the fundamental vibration mode of the plate in graphite. For a period of vibration, the contrast pattern of image would recur twice to its initial feature giving the observed frequency to be twice that of structural vibration; the fundamental frequency is, thus, obtained to be 0.54 MHz.

A square mechanical resonator clamped at four edges without tension has a fundamental resonance mode of $f_0$ which is given by $$f_0 = A\frac{d}{L^2}\left[\frac{Y}{(1-v^2)\rho}\right]^{1/2} + f(T) \tag{18}$$

where f(T) due to tension T is zero in this case. Y is the Young's modulus; ρ is the mass density; v is the Poisson's ratio; L is the dimension of a grid square; d is the thickness of the graphite; and A is a constant, for this case equal to 1.655. We measured d to be 53 nm from EELS. Knowing ρ=2260 kg/m³ (300 K), v=0.16 for graphite, and L=55 µm, we obtained from the observed resonance frequency the Young's modulus to be 0.8 TPa, which is in good agreement with the in-plane value of 0.92 TPa, obtained using stress-strain measurements. This value is different by more than an order of magnitude from the c-axis value we measured using the microscope in the ultrafast mode of operation.

Thus, using embodiments of the present invention, we have demonstrated a very sensitive 4D microscopy method for the study of nanoscale mechanical motions in space and time. With selected-area-imaging dynamics, the evolution of multimode oscillations to a coherent resonance (global) mode at long time provides the mapping of local regions in the image and on the nanoscale. The time scale of the resonance is directly related to materials anisotropic elasticity (Young's modulus), density, and tension, and as such the reported real-time observation in imaging can be extended to study mechanical properties of membranes (graphene in the present case) and other nanostructures with noninvasive probing. The emergent properties resolved here are of special interest to us as they represent a well-defined "self-organization" in complex macroscopic systems.

The function of many nano and microscale systems is revealed when they are visualized in both space and time. Here, four-dimensional (4D) electron microscopy provided in accordance with an embodiment of the present invention is used to measure nanomechanical motions of cantilevers. From the observed oscillations of nanometer displacements as a function of time, for free-standing beams, we are able to measure the frequency of modes of motion, and determine Young's elastic modulus, the force and energy stored during the optomechanical expansions. The motion of the cantilever is triggered by molecular charge redistribution as the material, single-crystal organic semiconductor, switches from the equilibrium to the expanded structure. For these material structures, the expansion is colossal, typically reaching the micron scale, the modulus is 2 GPa, the force is 600 µN, and the energy is 200 pJ. These values translate to a large optomechanical efficiency (minimum of 1% and up to 10% or more), and a pressure of nearly 1,500 atm. We note that the observables here are real-material changes in time, in contrast to those based on changes of optical/contrast intensity or diffraction.

As the physical dimensions of a structure approach the coherence length of carriers, phenomena not observed on the macroscopic scale (e.g., quantization of transport properties)

become apparent. The discovery and understanding of these quantization effects requires continued advances in methods of fabrication of atomic-scale structures and, as importantly, in the determination of their structural dynamics in real-time when stimulated into a configuration of a nonequilibrium state. Of particular importance are techniques that are noninvasive and capable of nanoscale visualization in real-time.

Examples of the rapid progress in the study of nanoscale structures are numerous in the field of micro and nanoelectromechanical systems (i.e., MEMS and NEMS, respectively). Recent advancements have resulted in structures having single-atom mass detection limits and binding specificities on the molecular level, and especially for biological systems. Beyond mass measurement and analyte detection, changes in the dynamics of these nanoscale structures have been shown to be sensitive to very weak external fields, including electron and nuclear spins, electron charge, and electron and ion magnetization. The response to external stimuli is manifested in deflections of the nanoscale, and a variety of techniques have been used to both actuate and detect the small-amplitude deflections. Optical interference is often used for measurement purposes, wherein the deflections of the structure cause a phase shift in the path-stabilized laser light thus providing detection sensitivities that are much less than the radius of a hydrogen atom.

High spatiotemporal resolutions (atomic-scale) can be achieved in 4D ultrafast electron microscopy (UEM). Thus it is possible to image structures, morphologies, as well as nanomechanical motions (e.g., nanogating and nanodrumming) in real-time. Using embodiments of the present invention, we direct visualized nano and microscale cantilevers, and the (resonance) oscillations of their mechanical motions. The static images were constructed from a tomographic tilt series of images, whereas the in situ temporal evolution was determined using the stroboscopic configuration of UEM, which is comprised of an initiating (clocking) laser pulse and a precisely-timed packet of electrons for imaging. The pseudo-one-dimensional molecular material (copper 7,7,8,8-tetracyanoquinodimethane, [Cu(TCNQ)]), which forms single crystals of nanometer and micrometer length scale, is used as a prototype. The optomechanical motions are triggered by charge transfer from the TCNQ radical anion (TCNQ$^-$) to copper (Cu$^+$). More than a thousand frames were recorded to provide a movie of the 3D movements of cantilevers in time. As shown below, the expansions are colossal, reaching the micrometer scale, and the spatial modes are resolved on the nanoscale in the images (and angstrom-scale in diffraction) with resonances of megahertz frequencies for the fixed-free cantilevers. From these results, we obtained the Young's modulus, and force and energy stored in the cantilevers.

Here, different crystals were studied and generally are of two types: (1) those "standing", which are free at one end (cantilevers), and (2) those which are "sleeping" on the substrate bed; the latter will be the subject of another report. For cantilevers, the dimensions of the two crystals studied are 300 nm thick by 4.6 μm long and 2.0 μm thick by 10 μm long (see FIG. 26). As such, they define an Euler-Bernoulli beam, for which we expect the fundamental flexural modes to be prominent, besides the longitudinal one(s) which are parallel to the long axis of the crystal.

Figure 26:
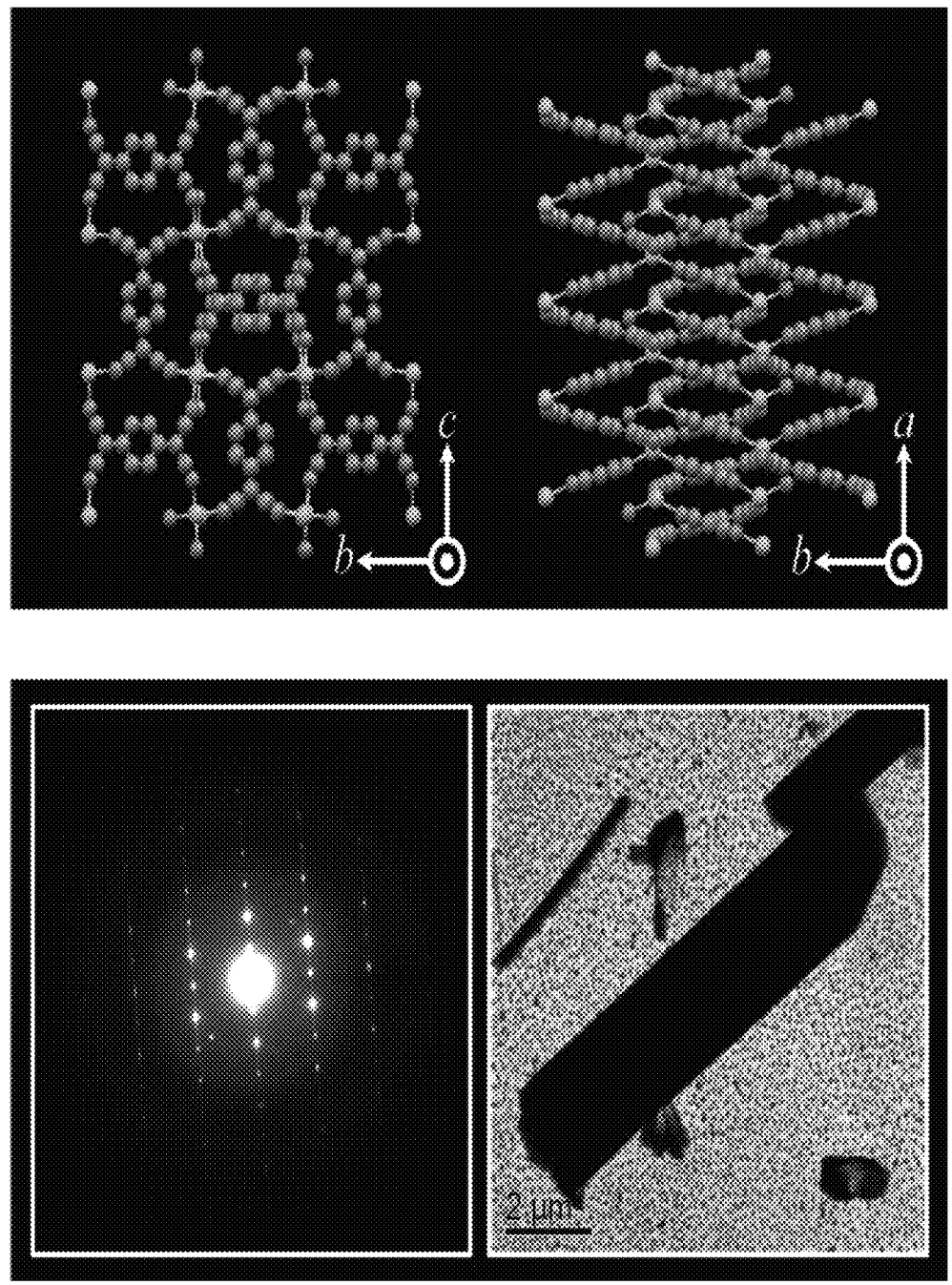
FIG. 26 illustrates the structure of phase I Cu(TCNQ), a diffraction pattern obtained using an embodiment of the present invention, and an image of phase I Cu(TCNQ)

Our interest in Cu(TCNQ) stems from its highly anisotropic electrical and optical properties, which arise from the nature of molecular stacking in the structure. As illustrated in FIG. 26, Cu(TCNQ) consists of an interpenetrating network of discrete columns of Cu$^+$ and TCNQ$^-$ running parallel to the crystallographic μ-axis. The TCNQ molecules organize so that the ie-systems of the benzoid rings are strongly overlapped, and the favorable interaction between stacked TCNQ molecules makes the spacing between the benzoid rings only 3.24 Å, significantly less than that expected from purely van der Waals-type interactions. It is this strong π-stacking that results in the pseudo-one-dimensional macroscale crystal structure and is responsible for the anisotropic properties of the material. With electric field or light, the material becomes mixed in valence with both Cu$^+$(TCNQ$^-$) and Cu$^0$ (TCNQ$^0$) in the stacks, weakening the interactions and causing the expansion. At high fluences, the reversible structural changes become irreversible due to the reduction of copper from the +1 oxidation state to copper metal and subsequent formation of discrete islands of copper metal driven by Ostwald ripening. The methodology we used here for synthesis resulted in the production of single crystals of phase I.

FIG. 26 illustrates atomic to macro-scale structure of phase I Cu(TCNQ). Shown in the upper panel is the crystal structure as viewed along the a-axis (i.e., π-stacking axis) and c-axis. The unit cell is essentially tetragonal (cf. ref. 19) with dimensions: a=3.8878 Å, b=c=11.266 Å, α=γ=90°, β=90.00(3)°; gray corresponds to carbon, blue corresponds to nitrogen, and yellow corresponds to copper. The hydrogen atoms on the six-membered rings are not shown for clarity. The lower panel displays a typical selected-area diffraction pattern from Cu(TCNQ) single crystals as viewed down the [011] zone axis along with a micrograph taken in our UEM. The rod-like crystal habit characteristic of phase I Cu(TCNQ) is clearly visible.

Figure 27:
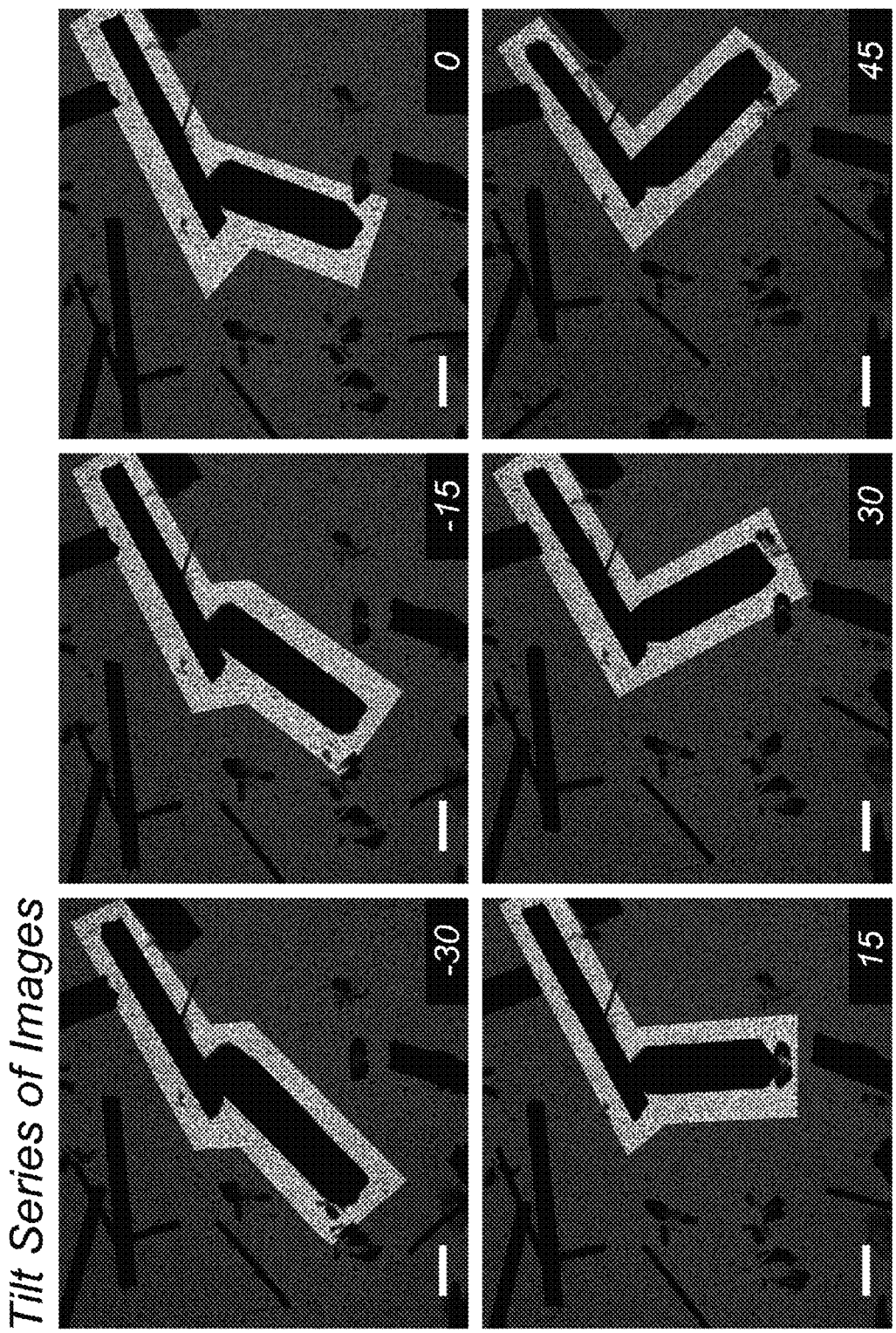
FIG. 27 illustrates a tomographic tilt series of images of Cu(TCNQ) single crystals according to an embodiment of the present invention.

FIG. 27 illustrates a tomographic tilt series of images. The frames show images (i.e., 2D-projections) of the Cu(TCNQ) single crystals acquired at different tilt angles of the specimen substrate. The highlighted region illustrates a large change in the position of the free-standing mircoscale crystal relative to another, which is lying flat on the substrate, as we change the tilt angle. The scale bar in the lower left corner measures two micrometers. The tilt angle at which each image was acquired is shown in the lower right corner of each frame in degrees. The tilt angle is defined as zero when the specimen substrate is normal to the direction of electron propagation in the UEM column.

The tilt series images shown in FIG. 27 provide the 3D coordinates of the cantilevers. The dimensions and protrusion angles of these free-standing crystals were characterized by taking static frames at different rotational angles of the substrate. By placing the crystal projections into a laboratory frame orthogonal basis and measuring the length of the projections in the x-y (substrate) plane as the crystal is rotated by an angle α about the x-axis, the measured projections were obtained to be Θ of 37.8° and φ of 25.3°, where Θ is the angle the material beam makes with respect to substrate-surface normal and φ is the azimuthal angle with respect to the tilt axis, respectively. Note that the movie of the tilt series clearly shows the anchor point of the crystal to be the substrate. The dimensions and geometries of the crystals are determined from the tilt series images with 5% precision.

To visualize real-time and space motions, the microscope was operated at 120 kV and the electron pulses were photoelectrically generated by laser light of 355 nm. The clocking optical pulses (671 nm laser), which are well-suited to induce the charge transfer in Cu(TCNQ), were held constant at 3 μJ, giving a maximum fluence of 160 mJ/cm$^2$. Because the relevant resonance frequencies are on the MHz scale, the ns pulse arrangement of the UEM was more than enough for resolving the temporal changes. The time delay between the initiating laser pulse and probe electron pulse was controlled with precision, and the repetition rate of 100 Hz ensured recovery of the structure between pulses. A typical static image and selected-area diffraction are displayed in FIG. 26. From the selected-area diffraction and macroscopic expansion we could establish the nature of correlation between unit cell and the crystal change.

Figure 28:
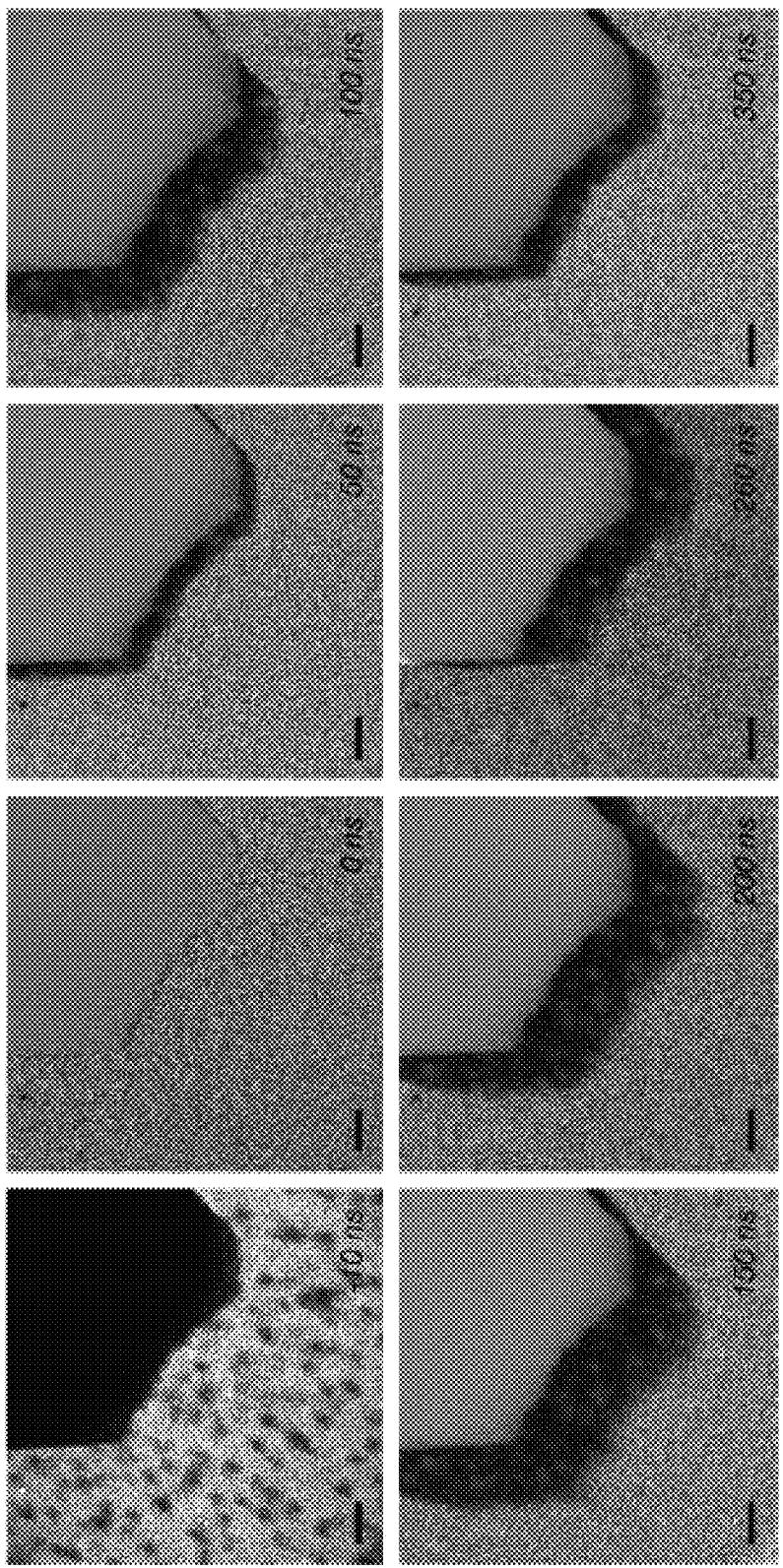
FIG. 28 illustrates 4D electron micrographs of a microscale cantilever according to an embodiment of the present invention.
Figure 29:
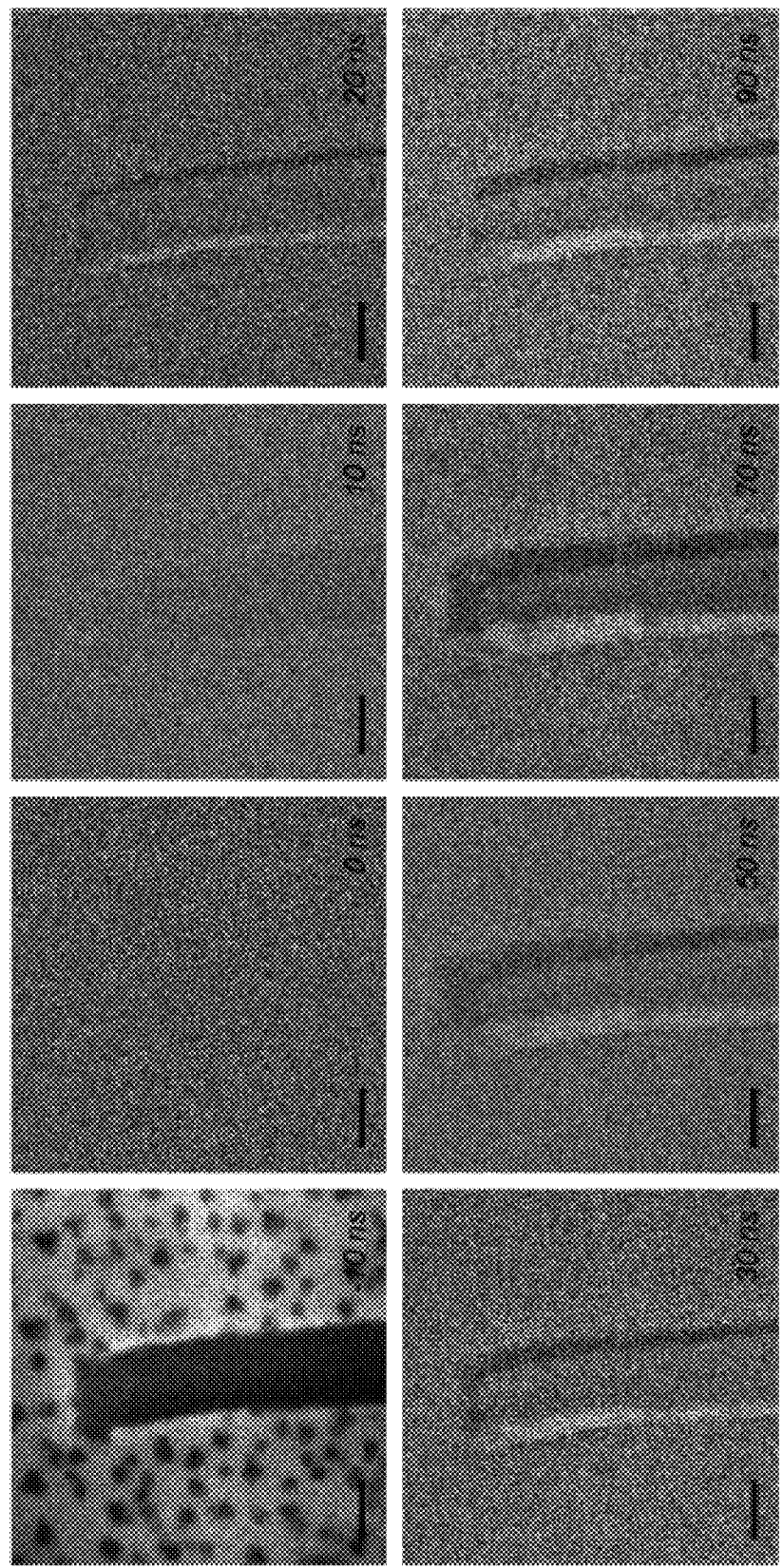
FIG. 29 illustrates 4D electron micrographs of a nanoscale cantilever according to an embodiment of the present invention.

The 4D space-time evolution of cantilevers is shown in FIGS. 28 and 29. The referenced (to negative time, $t_{ref}=-10$ ns; i.e., before the arrival of the clocking pulse) difference images of the microscale (FIG. 28) and nanoscale (FIG. 29) free-standing single crystal clearly display modes of expansion on the MHz scale. Each image illustrates how the spatial location of the crystal has changed relative to the reference image as a function of the time delay, elucidating both the longitudinal and transverse displacements from the at-rest position. In order to accurately measure the positions in space we used a reference particle in the image. These reference particles, which are fixed to the surface of the substrate, do not appear in frame-reference images if drift is absent or corrected for. This is an important indication that the observed crystal dynamics do not arise from motion of the substrate due to thermal drift or photothermal effects. Moreover, there is no significant movement observed in images obtained before the arrival of the excitation pulse, indicating that, during the time of pulse separation, the motion has completely damped out and the crystal has returned to its original spatial configuration. The thermal, charging, and radiation effects of the electron pulses are negligible here and in our previous studies made at higher doses. This is evidenced in the lack of blurring of the images or diffraction patterns; no beam deflection due to sample charging was observed. Lastly, no signs of structural fatigue or plasticity were observed during the course of observation, showing the function of the cantilever to be robust for at least $10^7$ pulse cycles.

Figure 30:
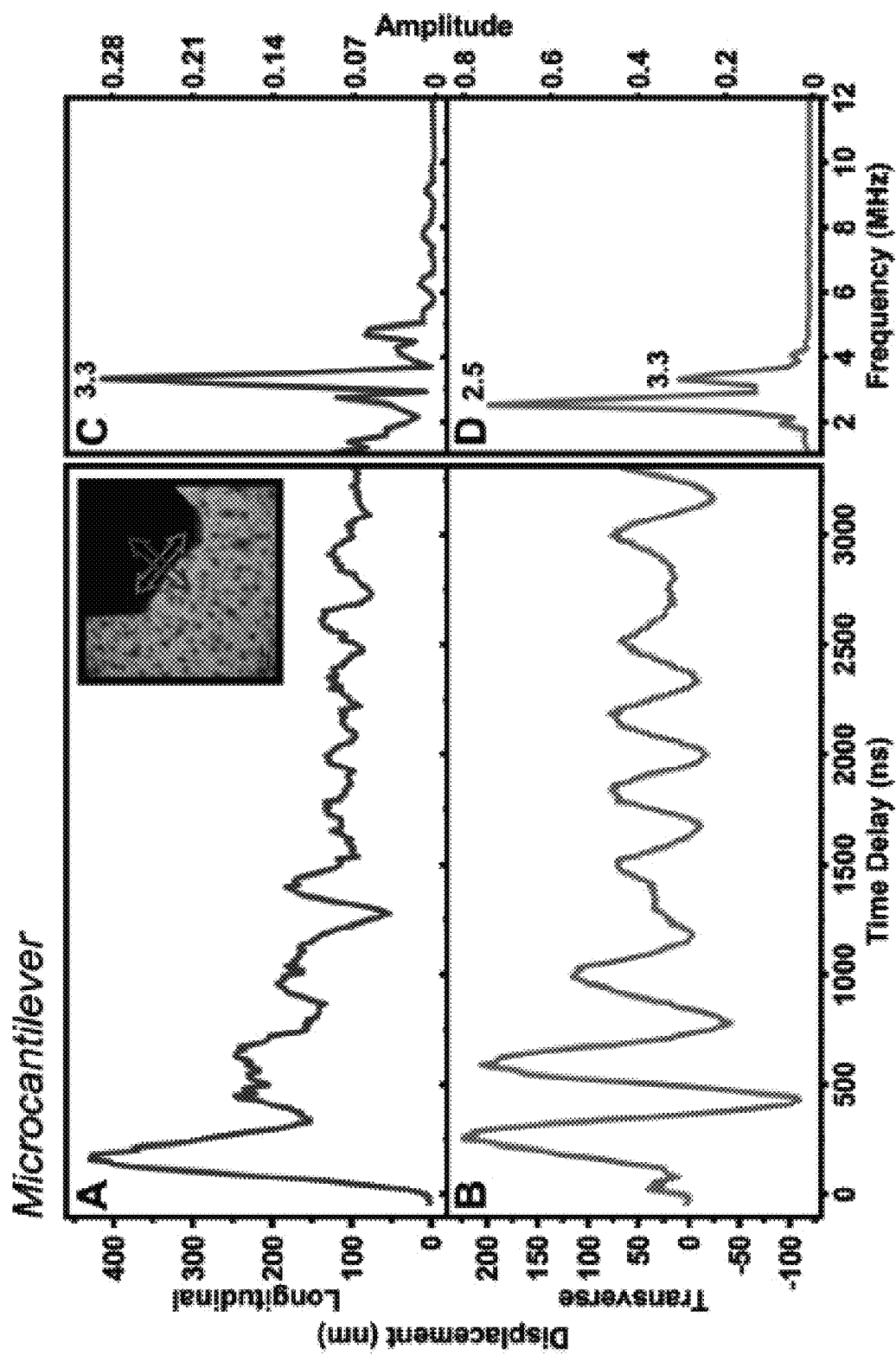
FIG. 30 illustrates oscillation dynamics and frequencies of a microcantilever according to an embodiment of the present invention.

Shown in FIG. 30 is the displacement of the microscale single crystal as a function of time, in both the longitudinal and transverse directions, along with the fast Fourier transforms (FFT) of the observed spatial oscillations for the time range shown (i.e., 0 to 3.3 is). The motions in both directions of measurement are characterized by a large initial displacement from the at-rest position. The scale of expansion is enormous. The maximum longitudinal expansion possible (after accounting for the protrusion angle) for the 10 μm crystal would be 720 nm or over 7% of the total length. For comparison, a piezoelectric material such as lead zirconate titanate has typical displacements of less than 1% from the relaxed position, but it is known that molecular materials can show enormous optically-induced elastic structural changes on the order of 10% or more. The large initial motion is transferred into flexural modes in the z and x-y directions, and these modes persist over the microsecond (or longer) scale. The overall relaxation of the crystal to its initial position is not complete until several milliseconds after excitation. From the FFTs of the measured displacements, we obtained the frequency of longitudinal oscillation to be 3.3 MHz, whereas the transverse oscillations are found at 2.5 and 3.3 MHz (FIG. 30). We note that the motion represents coupling of modes with dephasing, so it is not surprising that the FFT gives more than one frequency. In fact, from an analysis consisting of a decomposition of the motion via rotation of a principle axes coordinate system relative to the laboratory frame, we found that the plane of lateral oscillation of the crystal was tilted by 18° relative to the plane of the substrate. The nature of contact with the substrate influences not only the mode structure but also the damping of cantilevers.

Because of the boundary conditions of a fixed-free beam, the vibration nodes are not evenly spaced and the overtones are not simple integer multiples of the fundamental flexural frequency ($f_1$), but rather occur at 6.26, 17.5, and 34.4 for $f_2$, $f_3$, and $f_4$, respectively. This is in stark contrast to the integer multiples of the fundamental frequency of a fixed-fixed beam. Taking 3 MHz to be the main fundamental flexural frequency of the microscale crystal, we can deduce Young's elastic modulus of the crystal. The expression for the frequencies of transverse (flexural) vibrations of a fixed-free beam is given by, $$f_n = \eta \frac{\pi \kappa}{8L^2} c \equiv \eta \frac{\pi \kappa}{8L^2} \sqrt{\frac{Y}{\rho}} \quad (19)$$

where $f_n$ is the frequency of the $n^{th}$ mode in Hz, L is the beam length at rest, Y is Young's modulus, and ρ is the density. The radius of gyration of the beam cross section is κ and is given as t/12, where t is the thickness of the beam with rectangular cross section. The value of η for the beam is: $1.194^2$; $2.988^2$; $5^2$; $7^2$; ... ; $(2n-1)^2$, approaching whole numbers for higher q values. The overtones are not harmonics of the fundamental, and the numerical terms for $f_1$ and $f_2$, which result from the trigonometric solutions involved in the derivation, must be used without rounding. For the longitudinal modes of fixed-free beam, $f_n=(2n-1)c/4L$.

From the above equation, and knowing ρ=1.802 g·cm$^3$, we obtained Young's modulus to be 2 GPa, with the speed of sound, therefore, being 1,100 μm·s$^{-1}$; we estimate a 12% uncertainty in Y due to errors in t, L, and f This value of Young's modulus (N·m$^2$) is very similar to that measured for TTF-TCNQ single crystals using a mm-length vibrating reed under an alternating voltage. Both materials are pseudo-one-dimensional, and the value of the modulus is indicative of the elastic nature along the stacking axis in the direction of weak intercolumn interactions. Young's modulus slowly varies in value in the temperature range of 50 to 300 K but, when extrapolated to higher temperatures, decreases for both TTF-TCNQ and K(TCNQ). From the absorbed laser pulse energy (30 nJ), the amount of material (7.2×10$^{-14}$ kg), and assuming the heat capacity to be similar to TTF-TCNQ (430 J·K$^{-1}$·mol$^{-1}$), the temperature rise in the microscale crystal is expected to be at most 260 K. Finally, we note that for the same modulus reported here, the frequency of longitudinal mode expansion [f=c/4L; n=1] should be nearly 25 MHz, which is not seen in the FFT with the reported resolution, thus suggesting that the observed frequencies in the longitudinal direction are those due to cantilever motion in the z direction; the longitudinal expansion of the crystal is about 1 to 2% of its length, which in this case will be 100 to 200 nm.

The potential energy stored in the crystal and the force exerted by the crystal at the moment of full extension along the long axis just after time zero [cf. FIG. 30(A)] can be estimated from the amplitudes and using Hooke's law:

$$V = \frac{1}{2}\left(\frac{YA}{L}\right)\Delta L^2 \quad (20a)$$

$$F = \left(\frac{YA}{L}\right)\Delta L \quad (20b)$$

where V and F are the potential energy and force, respectively, and A is the cross-sectional area of the crystal. The bracketed term in equation (20) is the spring constant (assuming harmonic elasticity, and not the plasticity range), and by simple substitution of the values, we obtained 200 pJ and 600 μN for the potential energy and force, respectively, considering the maximum possible expansion of 720 nm; even when the amplitude is at its half value [see FIG. 30(A)], the force is very large (~300 µN). For comparison, the average force produced by a single myosin molecule acting on an actin filament, which was anchored by two polystyrene beads, was measured to be a few piconewtons. In other words, because of molecular stacking, the force is huge. Also because of the microscale cross-section, the pressure of expansion translates to 0.1 GPa, only a few orders of magnitude less than pressures exerted by a diamond anvil. Based on the laser fluence, crystal dimensions, and absorptivity of Cu(TCNQ) at 671 nm ($3.5 \times 10^6$ $m^{-1}$), the maximum pulse energy absorbed by the crystal is 30 nJ. This means that, of the initial optical energy, a minimum of ~1% is converted into mechanical motion of the crystal. But in fact, it could reach 10 or more percent as determined by the projection of the electric field of light on the crystal.

Figure 31:
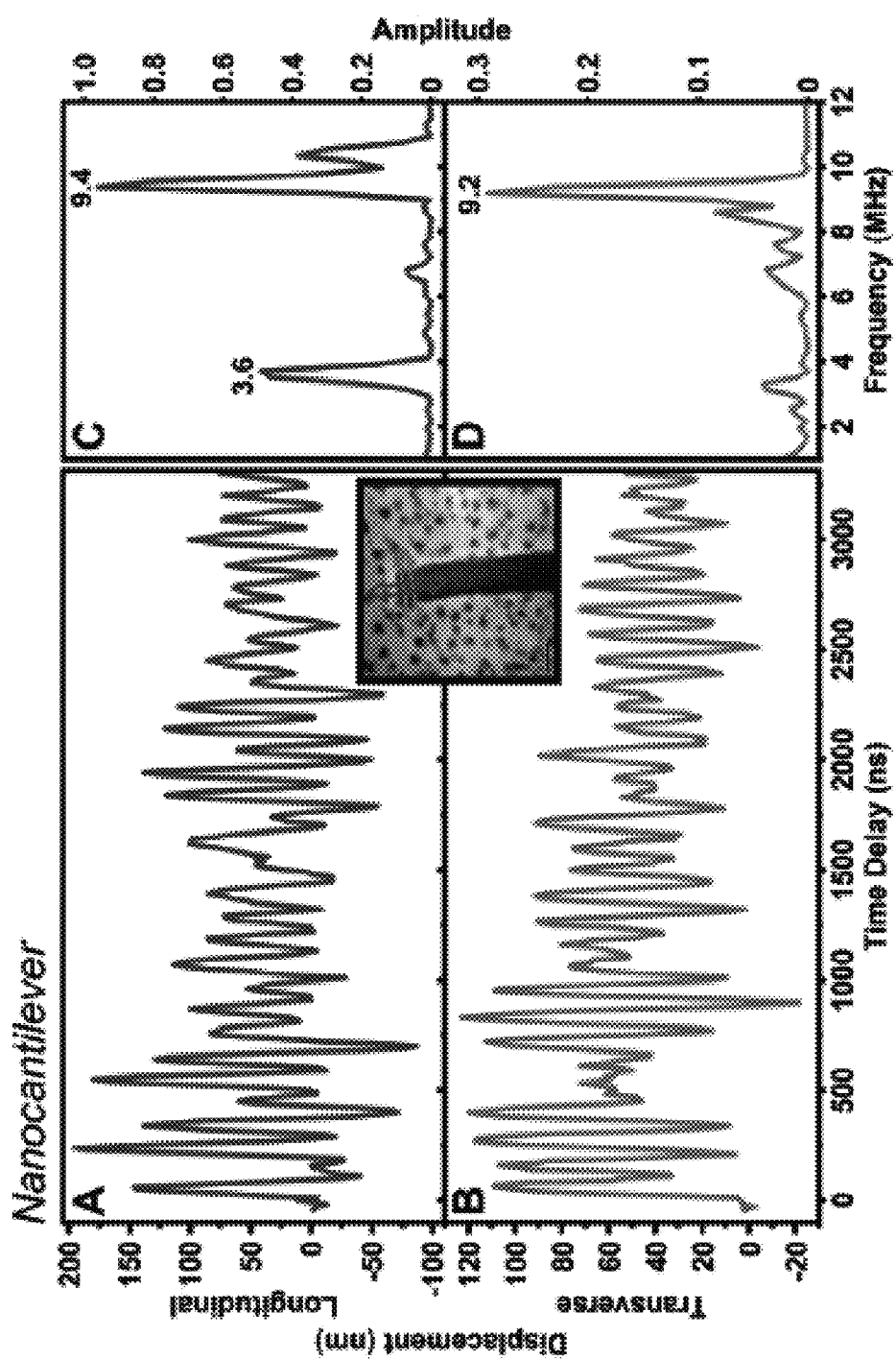
FIG. 31 illustrates oscillation dynamics and frequencies of a microcantilever according to an embodiment of the present invention.

In order to verify the trend in frequency shifts, the above studies were extended to another set of crystal beams, namely those of reduced dimensions. Because the resonant frequencies of a fixed-free beam are determined, in part, by the beam dimensions [cf. equation (19)], a Cu(TCNQ) crystal of different length than that shown in FIG. 30 should change the oscillation frequencies by the $\kappa/L^2$ dependence. With a smaller cantilever beam we measured the oscillation frequencies for a crystal of 300 nm thickness and 4.6 µm length, using the same laser parameters as for the larger crystals, and found them to be at higher values (FIG. 31). This is confirmed by the FFTs of the displacement spanning the range 0 to 3.3 µs [FIGS. 31 (C) and (D)]; a strong resonance near 9 MHz with another weaker resonance at 3.6 MHz in the longitudinal direction [FIG. 31 (C)] is evident. Within a few microseconds, the only observed frequency in the FFT was near 9 MHz. This oscillation persists up to the time scans of 30 µs, at which point the amplitude was still roughly 40% of the leveling value near 2 is. By taking this duration (30 µs) to be the decay time ($\tau$) required for the amplitude to fall to 1/e of the original value, the quality factor ($Q=\pi f\tau$) of the crystal free oscillator becomes near 1,000. However, on longer time scales, and with less step resolution, the crystal recovers to the initial state in a few milliseconds, and if the mechanical motion persists, Q would increase by an order of magnitude.

It is clear from the resonance value of the flexural frequency at 9 MHz that as the beam reduces in size, the frequency increases, as expected from equation (19). However, if we use this frequency to predict Young's modulus we will obtain a value of 30 GPa, which is an order of magnitude larger than that for the larger microscale crystal. The discrepancy points to the real differences in modes structure as we reach nanometer-scale cantilevers. One must consider, among other things, the anchor-point(s) of the crystals, the frictional force with substrate and other crystals, and the curvature of the beam (see movie in supporting information). This curvature will cause the crystal to deviate from ideal Euler-Bernoulli beam dynamics, thus shifting resonance frequencies from their expected positions. Interestingly, by using the value of 30 GPa for Young's modulus, the minimum conversion efficiency increases by a factor of 15. These dependencies and the extent of displacement in different directions, together with the physics of modes coupling (dephasing and rephasing), will be the subject of our full account of this work.

Thus, with 4D electron microscopy it is possible to visualize in real space and time the functional nanomechanical motions of cantilevers. From tomographic tilt series of images, the crystalline beam stands on the substrate as defined by the polar and azimuthal angles. The resonance oscillations of two beams, micro and nanocantilevers, were observed in situ giving Young's elastic modulus, the force, and the potential energy stored. The systems studied are unique 1D molecular structures, which provide anisotropic and colossal expansions. The cantilever motions are fundamentally of two types, longitudinal and transverse, and have resonance Q factors that make them persist for up to a millisecond. The function is robust, at least for $10^7$ continuous pulse cycles (~$10^{11}$ oscillations for the recorded frames), with no damage or plasticity. With these imaging methods in real-time and with other variants, it is now possible to test the various theoretical models involved in MEMS and NEMS.

Electron energy loss spectroscopy (EELS) is a powerful tool in the study of valency, bonding and structure of solids. Using our 4D electron microscope, we have performed ultrafast EELS, taking the time resolution in the energy-time space into the femtosecond regime, a 10 order of magnitude increase, and for a table-top apparatus. It is shown that the energy-time-amplitude space of graphite is selective to changes, especially in the electron density of the $\pi+\sigma$ plasmon of the collective oscillation of the four electrons of carbon. Embodiments of the present invention related to EELS enable the microscope to be used as an analytical tool. As electrons pass through the specimen, each type of material (e.g., gold, copper, or zinc) will have a different electron energy. Thus, it is possible to "tune" into a particular element and study the dynamic behavior of the material itself.

In microscopy, EELS provides rich characteristics of energy bands describing modes of surface atoms, valence- and core-electron excitations, and interferences due to local structural bonding. The scope of applications thus spans surface and bulk elemental analysis, chemical characterization and electronic structure of solids. The static, time-integrated, EEL spectra do not provide direct dynamic information, and with video-rate scanning in the microscope could changes be recorded only with a time resolution of millisecond or longer. Dedicated time-resolved EELS apparatus, without imaging, have obtained millisecond resolution, being determined primarily by detector response and electron counts. However, for studies of dynamics of electronic structure, valency and bonding, the time resolution must increase by at least nine orders of magnitude.

We have performed femtosecond resolved EELS (FEELS) using our ultrafast electron microscope (UEM), developed for 4D imaging of structures and morphology. Embodiments of the present invention are conceptually different from time-resolved EELS (termed TREELS) as the time resolution in FEELS is not limited by detector response and sweep rate. Moreover, both real-space images and energy spectra can be recorded in situ in UEM and with energy filtering the temporal resolution can be made optimum. We demonstrate the method in the study of graphite which displays changes on the femtosecond (fs) time scale with the delay steps being 250 fs. Near the photon energy of 2.4 eV (away from the zero energy loss peak), and similarly for the $\pi+\sigma$ plasmon band, the change is observed, but it is not as significant for the $\pi$ plasmon band. Thus it is possible to chart the change from zero to thousands of eV and in 3D plots of time, energy and amplitude; the decrease in EELS intensity at higher energies becomes the limiting factor. This table-top approach using electrons is discussed in relation to recent achievements using soft and hard (optical) X-rays in laboratory and large-scale facilities of synchrotrons and free electron lasers.

According to embodiments of the present invention, the probing electrons and the initiating light pulses are generated by a fs laser, and the EEL spectra of the transmitted electrons are recorded in a stroboscopic mode by adjusting the time delay between the pump photons and the probe electron bunches. The concept of single-electron packet used before in imaging is utilized in this approach. When each ultrafast electron packet contains at most one electron, "the single-electron mode," space-charge broadening of the zero-loss energy peak, which decreases the spectrometer's resolution, is absent.

Figure 32:
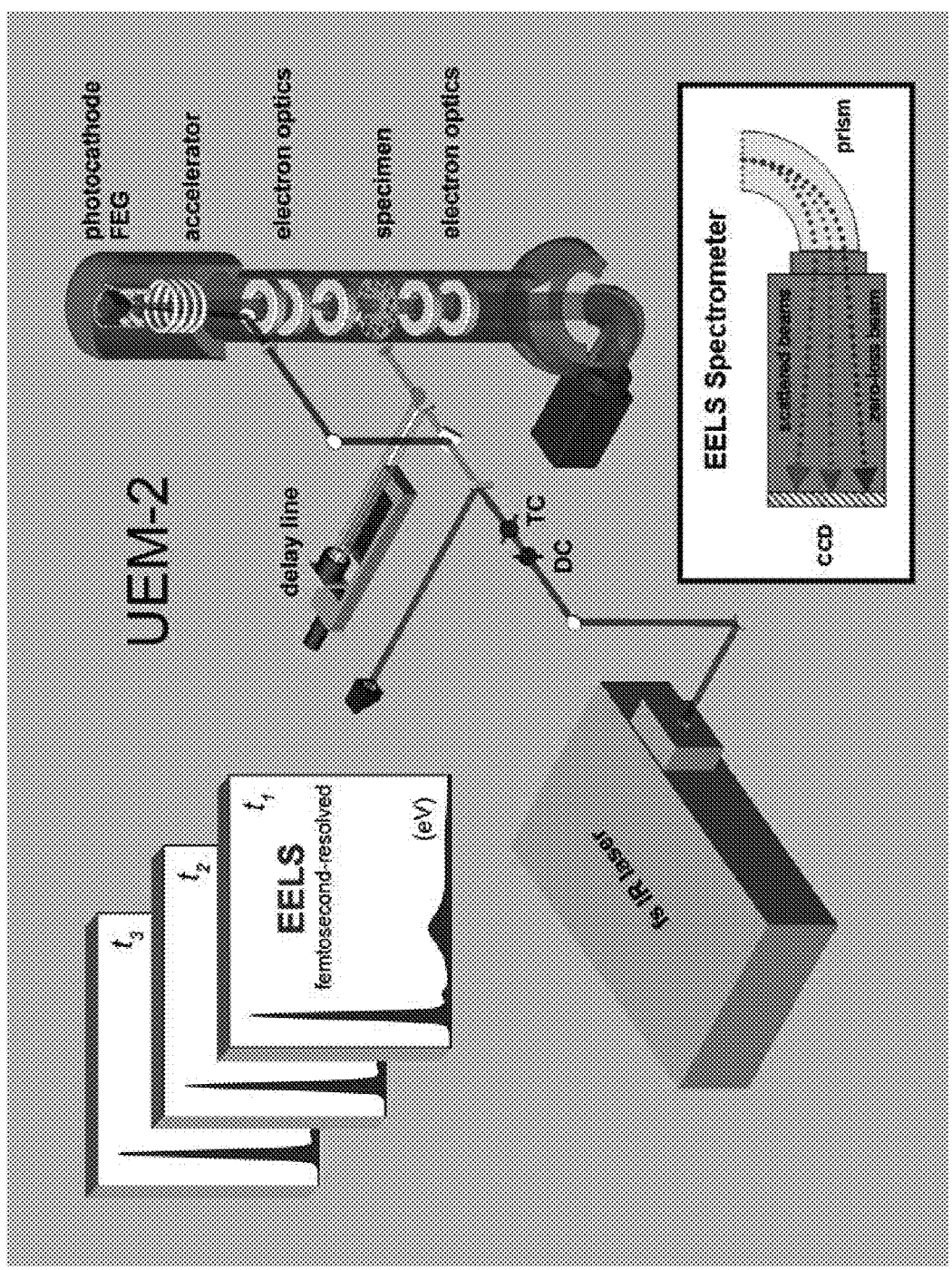
FIG. 32 is a simplified schematic diagram of a ultrafast electron microscope-electron energy loss spectroscopy system according to an embodiment of the present invention.

FIG. 32 is a schematic diagram of a microscope used in embodiments of the present invention. A train of 220 fs laser pulses at 1.2 eV was frequency doubled and tripled and then split into two beams. In other embodiments, a range of laser pulse widths could be used, for example from about 10 femtoseconds to about 10 microseconds. The frequency tripled light at 3.6 eV was directed to the microscope photocathode, and the photoelectron probe pulse was accelerated to 200 keV. The 2.4 eV pulses were steered to the specimen, and provided the excitation at a fluence of 5.3 mJ/cm$^2$. In other embodiments, a fluence ranging from about 1 mJ/cm$^2$ to about 20 mJ/cm$^2$ could be utilized. By varying the delay time between the electron and optical pulses, the time dependence of the associated EEL spectrum was followed. The electrons pass through the sample and a set of magnetic lenses to illuminate the CCD camera, forming either a high resolution image of the specimen, a diffraction image, or they can be energy dispersed to provide the EEL spectra.

The apparatus is equipped with a Gatan imaging filter (GIF) Tridiem, of the postcolumn type, which is attached below the transmission microscope camera chamber. The energy width of near 1 eV was measured for the EELS zero-loss peak and it is comparable to that obtained in thermal-mode operation of the TEM, but increases significantly in the space-charge limited regime. The experiments were performed at repetition rates of 100 kHz and 1 MHz, and no difference in the EEL spectra or the temporal behavior was observed, signifying a complete recovery of electronic structure changes between subsequent pulses. The reported temporal changes were missed when the scan resolution exceeded 250 fs, and the entire profile of the transient is complete in 2 µs. The electron beam passes through the graphite sample perpendicular to the sample surface while the laser light polarization was parallel to the graphene layers. Finally, the zero of time was determined to the precision of the reported steps, and was observed to track the voltage change in the FEG module of the microscope.

Figure 33:
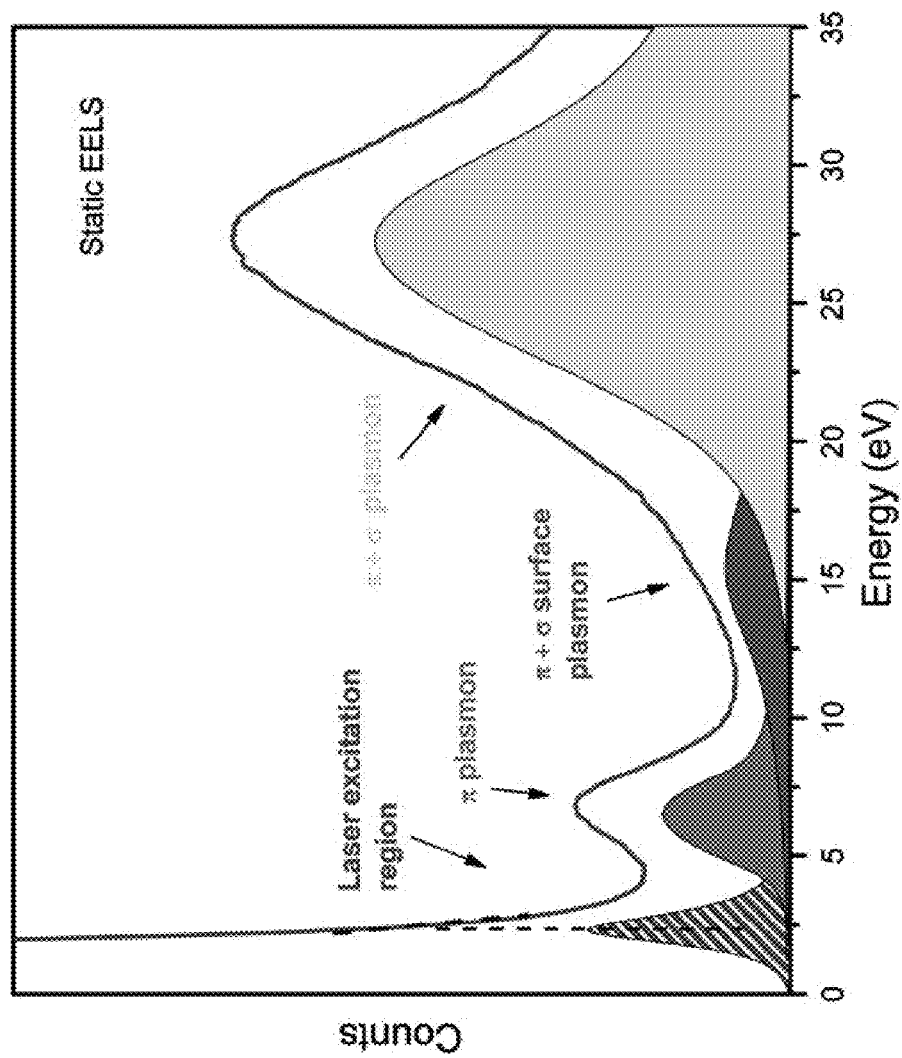
FIG. 33 illustrates a static EEL spectrum according to an embodiment of the present invention.

The semi-metal graphite is a layered structure, which was prepared as free-standing film. The thickness of the graphite film was estimated from the EEL spectrum to be 106 nm (inelastic mean-free path of ~150 nm), and the crystallinity of the specimen was verified by observing the diffraction pattern which was indexed as reported. FIG. 33 shows a static EEL spectrum of graphite taken in UEM. The distinct features are observed in the spectrum and indeed are typical of the electronic structure bands of graphite; the in-plane π plasmon is found near 7 eV, while at higher energy, the peak at 27 eV is observed with a shoulder at 15 eV. These latter peaks correspond to the π+σ oscillation of the bulk and surface plasmons, respectively. The results are in agreement with those of literature reports. The bands displayed in different colors (FIG. 33) are the simulations of the profiles with peak positions reproducing the theoretical values near 7, 15 and 27 eV.

Figure 34:
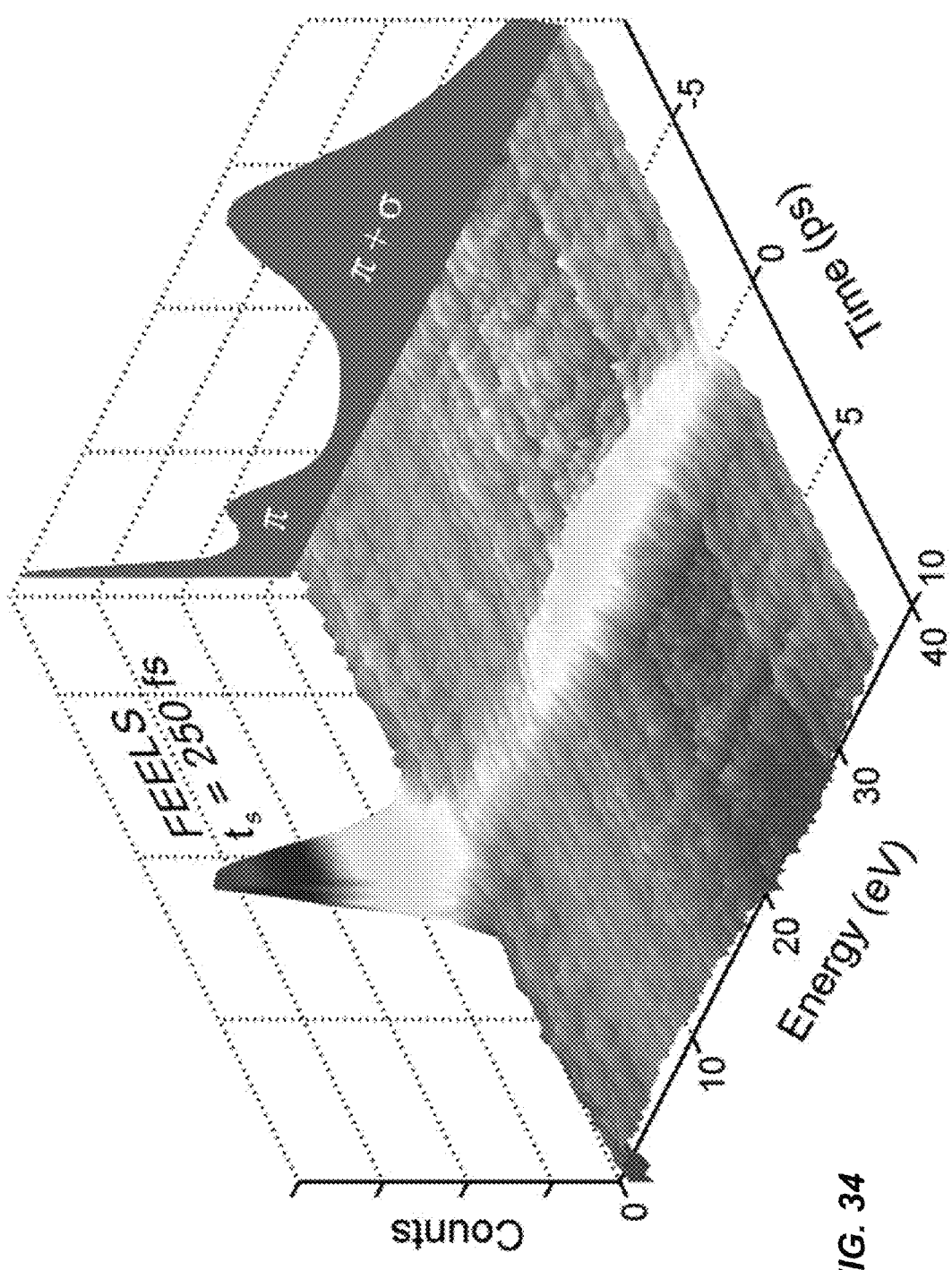
FIG. 34 illustrates the 3D time-energy-amplitude evolution of an EEL spectra according to an embodiment of the present invention.

The 3D FEELS map of the time-energy evolution of the amplitude of the plasmon portion of the spectrum (up to 35 eV) is shown in FIG. 34, together with the EEL spectrum taken at negative time. The spectra were taken at 1 MHz repetition-rate, for a pump fluence of 5.3 mJ/cm$^2$ at room temperature and for ts=250 fs for each difference frame. The map reflects the difference for all energies and as a function of time, made by subtracting a reference EEL spectrum at negative time from subsequent ones. The relatively strong enhancement of the energy loss in the low energy (electron-hole carriers) region is visible and the change is near the energy of the laser excitation. This feature represents the energy loss enhancement due to the creation of carriers by the fs laser excitation in the ππ* band structure, as discussed below. At higher energy, the 7 eV π plasmon peak remains nearly unperturbed by the excitation, and no new features are observed at the corresponding energies. For the 27 eV π+σ bulk plasmon an increased spectral weight at positive time is visible as a peak in the time-resolved spectrum.

In order to obtain details of the temporal evolution of the different spectroscopic energy bands, we divided the spectrum into three regions: the low energy region between 2 and 5 eV, the π plasmon region between 6 and 8 eV, and the π+σ plasmon region between 20 and 30 eV. The 3D data are integrated in energy within the specified regions of the spectrum, and the temporal evolution of the different loss features are obtained; see FIG. 35. For regions where changes occur, the time scales involved in the rise and subsequent decay are similar. In FEELS, the shortest decay is 700 fs taken with the steps of 250 fs. The duration of the optical pulse is ~220 fs, but we generate the UV pulse for electron generation through a non-linear response, and it is possible that the pulses involved are asymmetric in shape and that multiphotons are part of the process; full analysis will be made later. We note that the observed ~700 fs response indeed reflects the joint response from both the optical and electron pulses and it is an upper limit for the electronic change.

Figure 35:
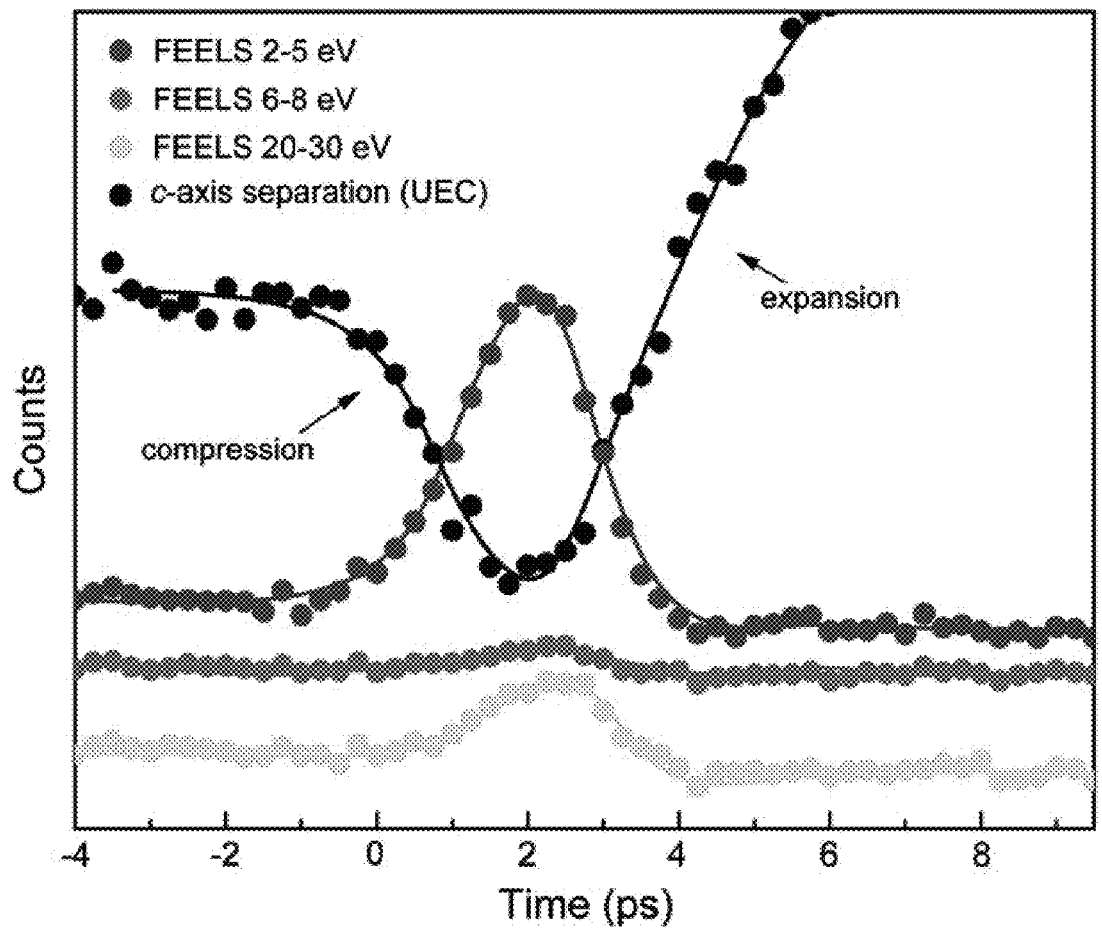
FIG. 35 illustrates the FEELS and UEC temporal behavior according to an embodiment of the present invention.

It is remarkable that, in FIG. 35, the temporal evolution of the interlayer spacing of graphite obtained by ultrafast electron crystallography (UEC) at a similar fluence, i.e. 3.5 mJ/cm$^2$, the timescale of the ultrafast compression corresponds well to the period in which the bulk plasmon is out of equilibrium; in this plot the zero of time is defined by the change of signal amplitude. In graphite, the characteristic time for the thermalization of photo-excited electrons is known to be near 500 fs at low fluences (a few µJ/cm$^2$). When excited by an intense laser pulse, a strong electrostatic force between graphene layers is induced by the generated electron-hole (carrier) plasma. This causes the structure to be out of equilibrium for nearly 1 ps; a stressful structural rearrangement is imposed on the crystal, which, at very high fluences (above 70 mJ/cm$^2$), has been proposed as a cause of the phase transformation into diamond.

Because graphite is a quasi two-dimensional structure, distinct spectral features are visible in EELS. The most prominent and studied peaks are those at 7 eV and the much stronger one at 27 eV. From the solution of the in-plane and out-of-plane components of the dielectric tensor it was shown, for graphite, that the 7 eV band is a π plasmon, resulting from interband ππ* transitions in the energy range of 2-5 eV, whereas the 27 eV band is a π+σ plasmon dominated by σσ* transitions beyond 10 eV (FIG. 5). We note that in this case the plasmon frequencies are not directly given by the ππ* and σσ* transition energies as they constitute tensorial quantities. For example $$\varpi_{\pi+\sigma}^2 = \varpi_p^2 + \frac{1}{4}(\Omega_\pi^2 + 3\Omega_\sigma^2),$$

where $\omega_p = npe^2/\epsilon_0 m)^{1/2}$ is the free electron gas plasma frequency; $\Omega_\pi$ and $\Omega_\sigma$ are the excitation energies for ππ* and σσ* transitions, respectively. For $\omega_p$, the electron density is np, n is the number of valence electrons per atom and p is the density of atoms, and $\in_0$ is the vacuum dielectric constant. It follows that the density of occupied and empty ($\pi$, $\sigma$, $\pi^*$, and $\sigma^*$) states is critical, and that the it Plasmon is from the collective excitation of the $\pi$ electrons (one electron in the p-orbital, with screening corrections) whereas the $\pi+\sigma$ plasmon is the result of all 4 valence electrons collectively excited over the coherent length scale of bulk graphite; there are also surface plasmons but at different energies.

Recently it was demonstrated, both theoretically and experimentally, that the $\pi$ and $\pi+\sigma$ plasmons are sensitive to the inter-layer separation, but while the former shows some shift of peaks the latter is dramatically reduced in intensity, and, when reaching the grapheme limit, only a relatively small peak at ~15 eV survives. This is particularly evident when the momentum transfer is perpendicular to the c-axis, the case at hand and for which the EEL spectrum is very similar to ours. With the above in mind, it is now possible to provide, in a preliminary picture, a connection between the selective fs atomic motions, which are responsible for the structural dynamics, and changes in the dielectric properties of Plasmon resonances, the electronic structure.

The temporal behavior, and coherent oscillation (shear modes of ~1 ps), of c-axis expansion display both contraction and expansion on the picometer length scale per unit cell. The contraction precedes the expansion, as shown in FIG. 35, with velocity that depends on the fluence, i.e., the density of carriers. With fs excitation, the electronic bands are populated anisotropically, and, because of energy and momentum conservation, the carriers transiently excite large-momentum phonons, so called strongly coupled phonons. They are formed on the fs time scale (electron-phonon coupling) but decay in ~7 ps. The initial compression suggests that the process is a cooperative motion and is guided by the out-of-equilibrium structure change dictated by the potential of excited carriers; in this case $\pi\pi^*$ excitation which weakens c-axis bonding.

Figure 36:
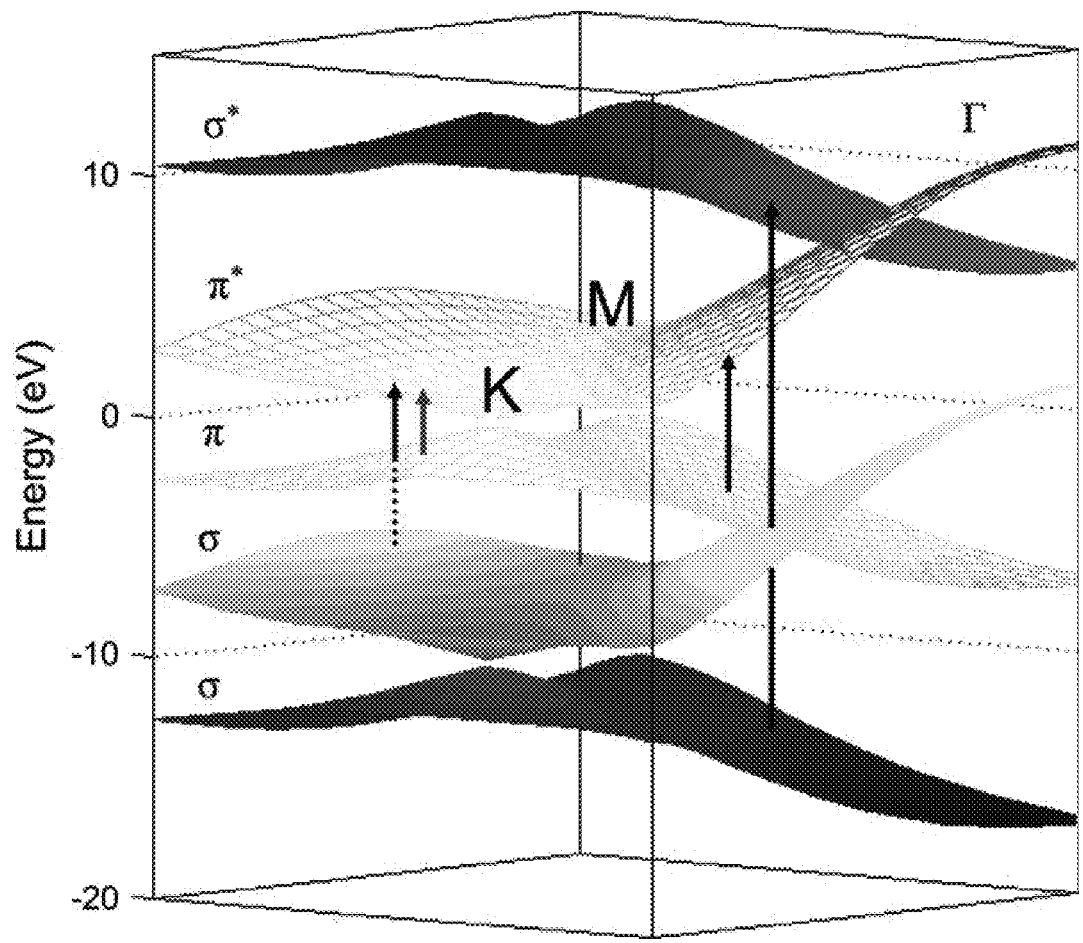
FIG. 36 illustrates calculated bands of graphite in a portion of the Brillion zone according to an embodiment of the present invention.

The initial atomic compression, when plotted with transient EELS data (FIG. 35), shows that it is nearly in synchrony with the initial change, suggesting that the spacing between layers (c-axis separation) is the rate determining step, and that in the first 1 µs, the compressed 'hard graphite' effect is what causes the increase in the amplitude of the $\pi+\sigma$ plasmon peak. In other words, the decrease of the spectral weight due to the change of electronic structure upon increasing the interlayer separation (to form graphene) becomes an increase when the plates are compressed, because of the enhanced collectiveness of all four valence electrons of carbon. The change involves shear motions and it is not surprising that the $\pi+\sigma$ peak (dominated by $\sigma\sigma^*$ excitation) is very sensitive to such changes. The $\pi$ peak is less influenced as only one electron is involved, as discussed above, and the amplitude change is relatively small. The faster recovery of EEL peaks in 700 fs is, accordingly, the consequence of expansion which 'decouples' the $\pi$ and $\sigma$ system. Lastly, the relatively large increase in EEL near the photon energy is due to carrier excitation ($\pi^*$) which leads to a loss of electron energy at near 3 eV, possibly by electronic excitation involving the cy system (FIG. 36). The created carriers cause an increase in the Drude band as evidenced in the decrease in optical transmission.

The demonstration of ultrafast EELS in electron microscopy opens the door to experiments that can follow the ultrafast dynamics of the electronic structure in materials. The fs resolution demonstrates the ability of UEM to probe transients on the relevant sub-picosecond time scale, while keeping the energy resolution of EELS. Moreover, the selectivity of change in the collective electron density (for graphite) suggests future experiments, including those with changes in polarization, shorter optical pulses, core excitation and oxidation sites. We believe that this table-top UEM-EELS should provide the methodology for studies which have traditionally been made using synchrotrons (and free electron lasers) especially in the UV and soft X-ray regions.

Chemical bonding dynamics are important to the understanding of properties and behavior of materials and molecules. Utilizing embodiments of the present invention, we have demonstrated the potential of time-resolved, femtosecond electron energy loss spectroscopy (EELS) for mapping electronic structural changes in the course o nuclear motions. For graphite, it is found that changes of milli-electron volts in the energy range of up to 50 electron volts reveal the compression and expansion of layers on the subpicometer scale (for surface and bulk atoms). These nonequilibrium structural features are correlated with the direction of change from $sp^2$ [two-dimensional (2D) grapheme] to $sp^3$ (3D-diamond) electronic hybridization, and the results are compared with theoretical charge-density calculations. The reported femtosecond time resolution of four-dimensional (4D) electron microscopy represents an advance of 10 orders of magnitude over that of conventional EELS method.

Bonding in molecules and materials is determined by the nature of electron density distribution between the atoms. The dynamics involve the evolution of electron density in space and the motion of nuclei that occur on the attosecond and femtosecond time scale, respectively. Such changes of the charge distribution with time are responsible for the outcome of chemical reactivity and for phenomena in the condensed phase, including those of phase transitions and nanoscale quantum effects. With convergent-beam electron diffraction, the static pattern of charge-density difference maps can be visualized, and using x-ray absorption and photoemission spectroscopy substantial progress has been made in the study of electronic-state dynamics in bulks and on surfaces. Electron energy loss spectroscopy (EELS) is a powerful method in the study of electronic structure on the atomic scale, using aberration-corrected microscopy, and in chemical analysis of selected sites; the comparison with synchrotron-based near-edge x-ray absorption spectroscopy is impressive. The time and energy resolutions of ultrafast electron microscopy (UEM) provide the means for the study of (combined) structural and bonding dynamics.

Here, time-resolved EELS is demonstrated in the mapping of chemical bonding dynamics, which require nearly 10 orders of magnitude increase in resolution from the detector-limited millisecond response. By following the evolution of the energy spectra (up to 50 eV) with femtosecond (fs) resolution, it was possible to resolve in graphite the dynamical changes on a millielectronvolt (subpicometer motion) scale. In this way, we examined the influence of surface and bulk atoms motion and observed correlations with electronic structural changes: contraction, expansion, and recurrences. Because the EEL spectra of a specimen in this energy range contain information about plasmonic properties of bonding carriers, their observed changes reveal the collective dynamics of valence electrons.

Graphite is an ideal test case for investigating the correlation between structural and electronic dynamics. Single-layered grapheme, the first two-dimensional (2D) solid to be isolated and the strongest material known, has the orbitals on carbon as $sp^2$ hybrids, and in graphite the $\pi$-electron is perpendicular to the molecular plane. Strongly compressed graphite transforms into diamond, whose charge density pattern is a 3D network of covalent bonds with $sp^3$ hybrid orbitals. Thus, any structural perturbation on the ultra-short time scale of the motion will lead to changes in the chemical bonding and should be observable in UEM. Moreover, surface atoms have unique binding, and they too should be distinguishable in their influence from bulk atom dynamics.

The experiments were performed on a nm-thick single crystal of natural hexagonal graphite. The sample was cleaved repeatedly until a transparent film was obtained, and then deposited on a transmission electron microscopy (TEM) grid; the thickness was determined from EELS to be 108 nm. The fs-resolved EELS (or FEELS) data were recorded in our UEM, operating in the single-electron per pulse mode to eliminate Boersch's space charge effect. A train of 220 fs infrared laser pulses ($\lambda$=1038 nm) was split into two paths, one was frequency-doubled and used to excite the specimen with a fluence of 1.5 mJ/cm$^2$, and the other was frequency-tripled into the UV and directed to the photoemissive cathode to generate the electron packets. These pulses were accelerated in the TEM column and dispersed after transmission through the sample in order to provide the energy loss spectrum of the material.

The experimental, static EEL spectra of graphite in our UEM, with grapheme for comparison, are displayed in FIG. 37A; FIG. 37B shows the results of theoretical calculations. The spectral feature around 7 eV is the $\pi$ Plasmon, the strong peak centered around 26.9 eV is the $\pi$+$\sigma$ bulk plasmon, and the weaker peak on its low energy tail is due to the surface Plasmon. The agreement between the calculated EEL spectra and the experimental ones is satisfactory both for graphite and grapheme. Of relevance to our studies of dynamics is the simulation of the spectra for different c-axis separations, ranging from twice as large as naturally occurring (2c/a; a and c are lattice constraints) to 5 times as large. This thickness dependence is displayed in FIG. 37B.

Figure 37:
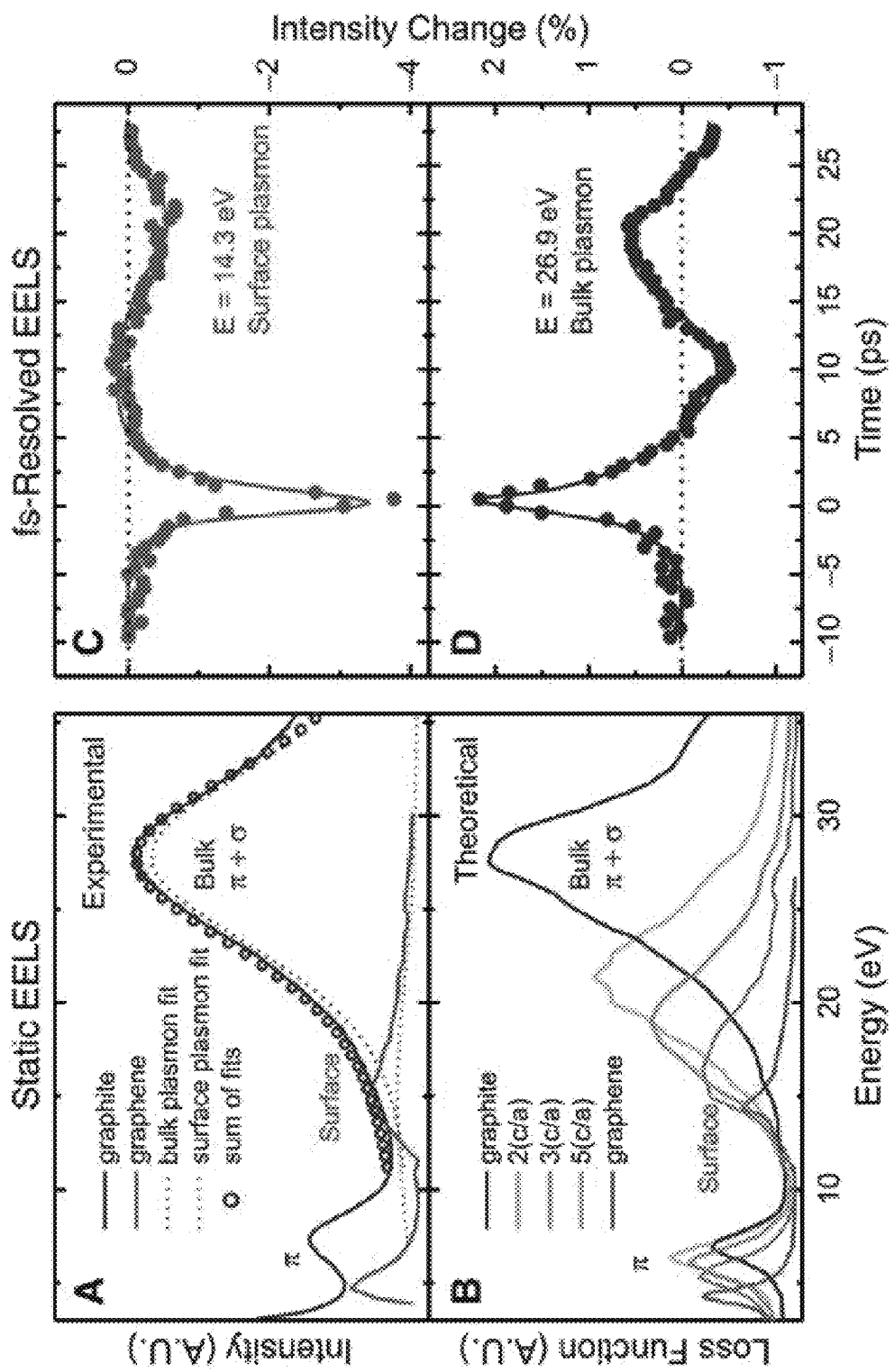
FIG. 37 illustrates static and femtosecond-resolved EELS of graphite according to an embodiment of the present invention.

As displayed in FIG. 37, the surface and bulk Plasmon bands (between 13 and 35 eV) can be analyzed using two Voigt functions, thus defining the central position, intensity, and width. At different delay times, we monitored the changes and found that they occur in the intensity and position; the width and shape of the two spectral components are relatively unchanged. FIGS. 37C and 37D, show the temporal changes of the intensity for both the surface and bulk plasmons. As noted, the behavior of bulk dynamics is "out of phase" with that of the surface dynamics, corresponding to an increase in intensity for the former and a decrease for the latter. Each time point represents a 500-fs change. Within the first 1 ps, the bulk Plasmon gains spectral weight with the increase in intensity. With time, the intensity is found to return to its original (equilibrium) value. At longer times, a reverse in sign occurs, corresponding to a decrease and then an increase in intensity—an apparent recurrence or echo occurring with dispersion. The intensity change of the surface plasmon in FIGS. 37C and 37D, shows a $\pi$ phase-shifted temporal evolution with respect to that of the bulk plasmon.

Figure 38:
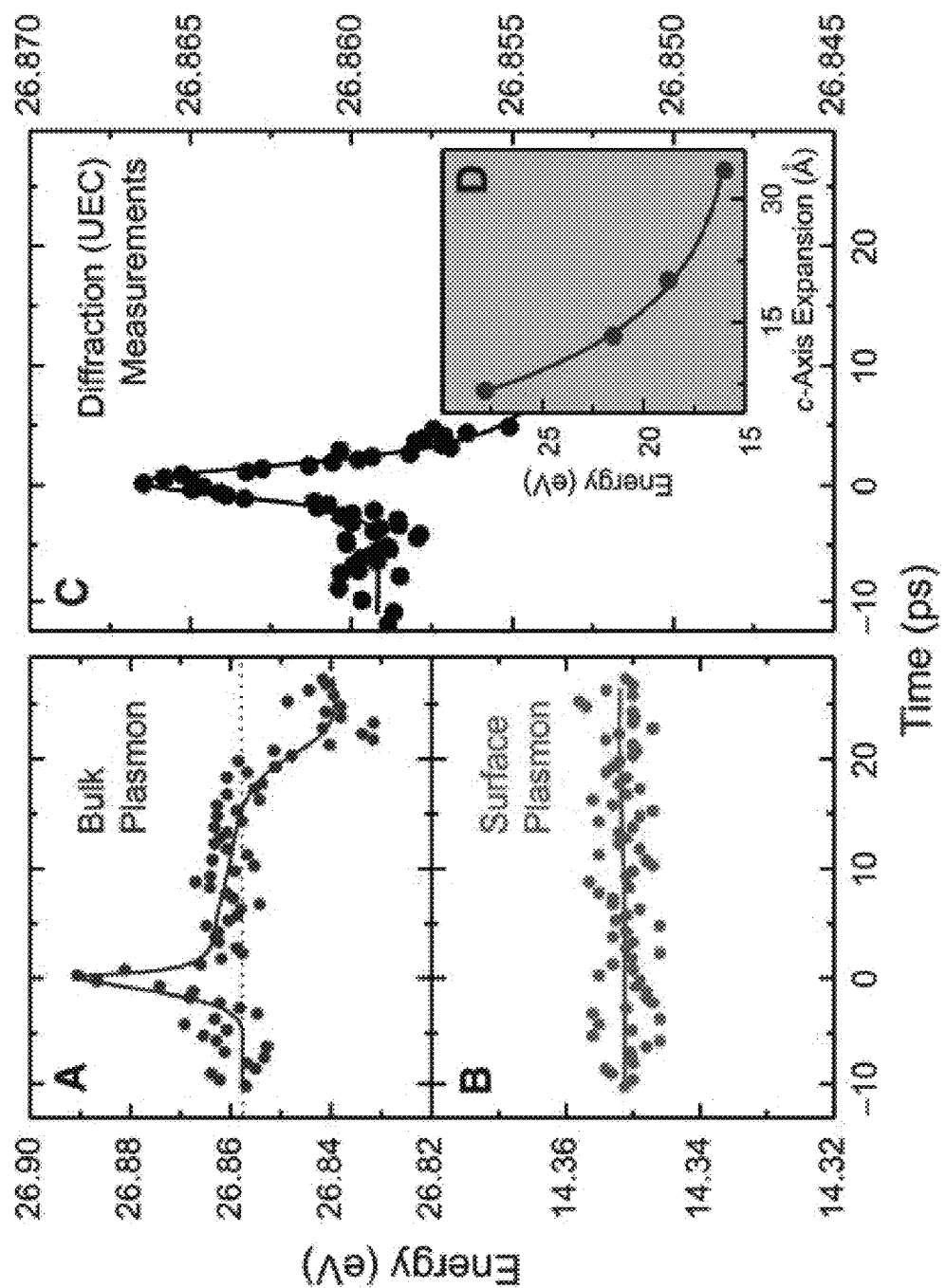
FIG. 38 illustrates EELS peak position and diffraction as a function of time according to an embodiment of the present invention.

The time dependence of the energy position of the different spectral bands is displayed in FIG. 38. The least-squares fit converges for a value of the surface plasmon energy at 14.3 eV and of the bulk plasmon at 26.9 eV. The temporal evolution of the surface plasmon gives no sign of energy dispersion, whereas the bulk plasmon is found to undergo first a blueshift and then a redshift at longer times (FIGS. 38A and 38B). The overall energy-time changes in the FEEL spectra are displayed in FIG. 39. To make the changes more apparent, the difference between the spectra after the arrival of the initiating laser pulse (time zero) and a reference spectrum taken at −20 $\mu$s before time zero is shown. The most pronounced changes are observed in the region near the energy of the laser itself (2.39 eV), representing the energy-loss enhancement due to the creation of carriers by the laser excitation, and in the region dominated by the surface and bulk plasmons (between 13 and 35 eV). Clearly evident in the 3D plot are the energy dependence as a function of time, the echoes, and the shift in phase.

A wealth of information has been obtained on the spectroscopy and structural dynamics of graphite. Of particular relevance here are the results concerning contraction and expansion of layers probed by diffraction on the ultra-short time scale. Knowing the amplitude of contraction/expansion, which is 0.6 $\mu$m at the fluence of 1.5 mJ/cm$^2$, and from the charge of plasmon energy with interlayer distance (FIG. 37), we obtained the results shown in FIG. 38C. The diffraction data, when now translated into energy change, reproduce the pattern in FIG. 38A, with the amplitude being within a factor of two. When the layers are fully separated, that is, reaching grapheme, the bulk plasmon, as expected, is completely suppressed.

Figure 39:
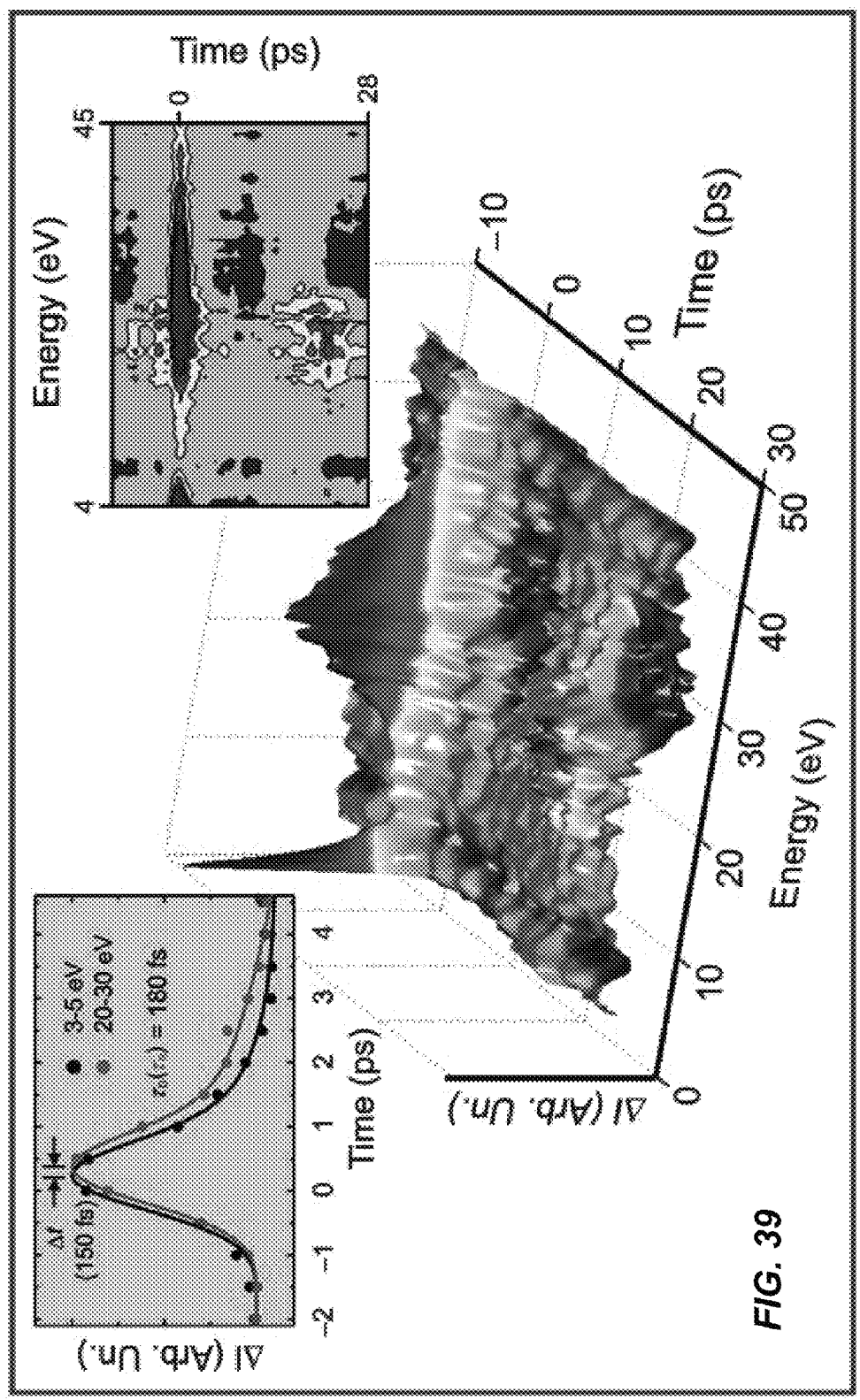
FIG. 39 illustrates a 3D intensity-energy-time FEELS plot according to an embodiment of the present invention.

The dynamics of chemical bonding can now be pictured. The fs optical excitation of graphite generates carriers in the nonequilibrium state. They thermalize by electron-electron and electron-phonon interactions on a time scale found to be less than 1 $\mu$s, less than 500 fs, and −200 fs. From our FEELS, we obtained a rise of bulk plasmons in ~180 fs (FIG. 39). The carriers generated induce a strong electrostatic force between grapheme layers, and ultrafast interlayer contraction occurs as a consequence. In FIG. 37D, the increase of the bulk plasmon spectral weight on the fs time scale reflects this structural dynamics of bond-length shortening because it originates from a denser and more 3D charge distribution. After the compression, a sequence of dilatations and successive expansions along the c axis follows, but, at longer times lattice thermalization dephases the coherent atomic motions; at a higher fluence, strong interlayer distance variations occur, and grapheme sheets can be detached as a result of these interlayer collisions. Thus, the observations reported here reflect the change in electronic structure: contraction toward diamond and expansion toward grapheme. The energy change with time correlates well with the EELS change calculated for different interlayer distances (FIG. 37).

Figure 40:
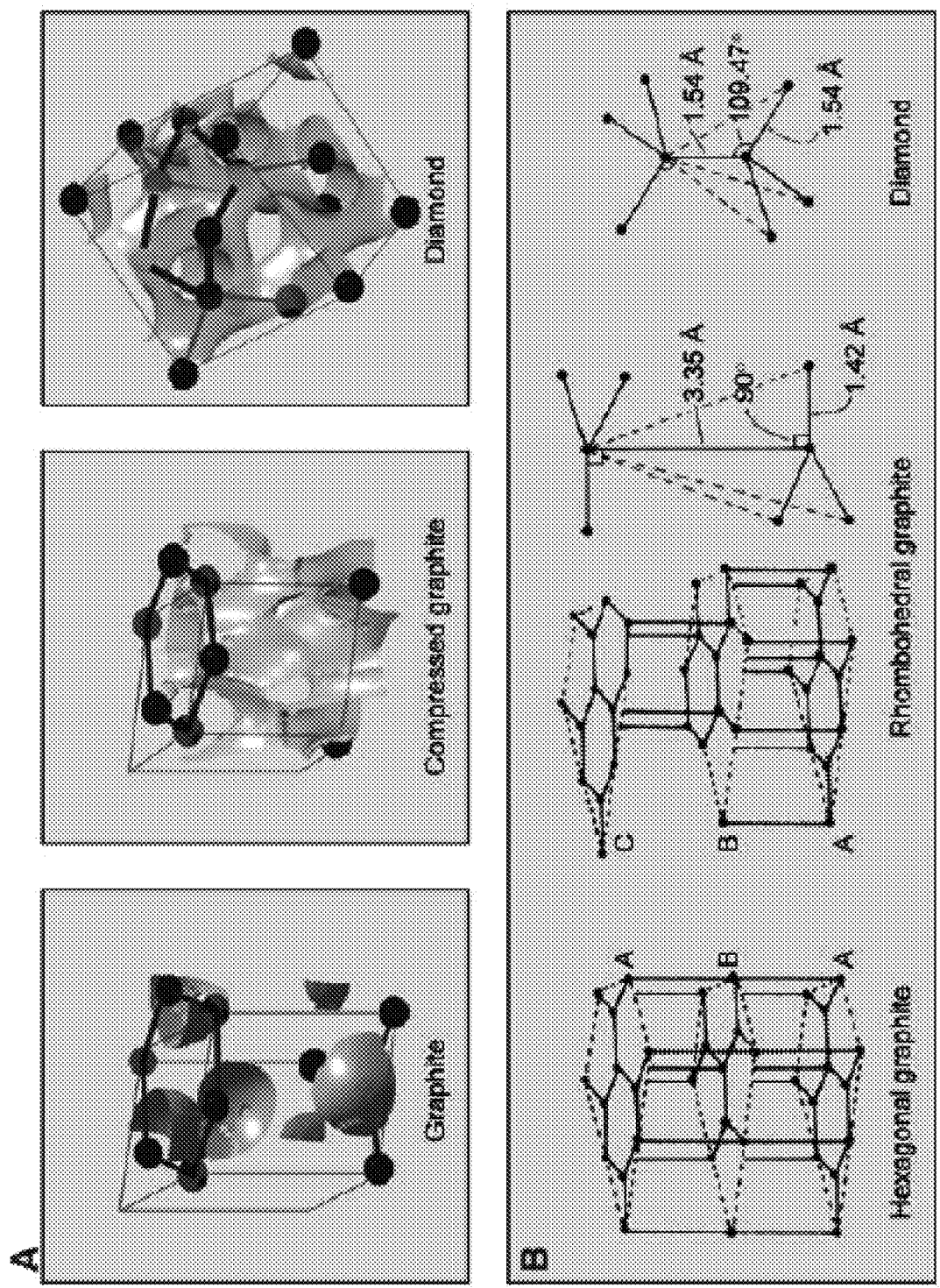
FIG. 40 illustrates charge density distributions and crystal structures according to an embodiment of the present invention.

We have calculated the charge density distribution for the three relevant structures. The self-consistent density functional theory calculations were made using the linear muffin-tin orbital approximation, and the results are displayed in FIG. 40. To emphasize the nature of the changes observed in FEELS, and their connection to the dynamics of chemical bonding, we pictorially display the evolution of the charge distribution in a natural graphite crystal, a highly compressed one, and the extreme case of diamond. Once can see the transition from a 2D to a 3D electronic structure. The compressed and expanded graphite can pictorially be visualized to deduce the change in electron density as interlayer separations change.

With image, energy, and time resolution in 4D UEM, it is possible to visualize dynamical changes of structure and electronic distribution. Such stroboscopic observations require time and energy resolutions of fs and meV, respectively, as evidenced in the case study (graphite) reported here, and for which the dynamics manifest compression/expansion of atomic planes and electronic $sp^2$/$sp^3$-type hybridization change. The application demonstrates the potential for examining the nature of charge density and chemical bonding in the course of physical/chemical or materials phase change. It would be of interest to extend the scale of energy from ~1 eV, with 100 meV resolution, to the hundreds of eV for exploring other dynamical processes of bonding.

The following articles are hereby incorporated by reference for all purposes:

4D imaging of transient structures and morphologies in ultrafast electron microscopy, Brett Barwick, et al., Science, Vol. 322, Nov. 21, 2008, p. 1227.

Temporal lenses for attosecond and femtosecond electron pulses, Shawn A. Hibert, et al., PNAS, Vol. 106, No. 26, Jun. 30, 2009, p. 10558.

Nanoscale mechanical drumming visualized by 4D electron microscopy, Oh-Hoon Kwon, et al., Nanoletters, Vol. 8, No. 11, November 2008, p. 3557.

Nanomechanical motions of cantilevers: direct imaging in real space and time with 4D electron microscopy, David J. Flannigan, et al., Nanoletters, Vol. 9, No. 2 (2009), p. 875.

EELS femtosecond resolved in 4D ultrafast electron microscopy, Fabrizio Carbone, et al., Chemical Physics Letters, 468 (2009), p. 107.

Dynamics of chemical bonding mapped by energy-resolved 4D electron microscopy, Fabrizio Carbone, et al., Science, Vol. 325, Jul. 10, 2009, p. 181.

Atomic-scale imaging in real and energy space developed in ultrafast electron microscopy, Hyun Soon Park, et al., Nanoletters, Vol. 7, No. 9, September 2007, p. 2545.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of constructing a 4D tilt series of images of a moving object, the method comprising:
   (a) irradiating the moving object with an optical pulse;
   (b) directing an electron pulse to impinge on the moving object;
   (c) detecting the electron pulse;
   (d) processing the detected electron pulse to form an image of the moving object;
   (e) capturing the image of the moving object associated with a time step; and
   (f) repeating (a)-(e) to construct the 4D tilt series of images of the moving object.

2. The method of claim 1 wherein the time step is on a scale of nanoseconds.

3. The method of claim 1 wherein the electron pulse consists of a single electron.

4. The method of claim 1 wherein the electron pulse comprises a plurality of electrons.

5. The method of claim 1 wherein the moving object comprises a nanomechanical cantilever.

6. The method of claim 1 wherein the moving object comprises a biological entity selected from at least one of a cell, a protein, a nucleic acid, a virus, or a complex thereof.

7. The method of claim 1 wherein the 4D tilt series of images is a tomographic tilt series of images capturing a portion of the moving object.

8. The method of claim 1 further comprising measuring a difference between each image in the 4D tilt series of images at a microscale level.

9. The method of claim 1, further comprising measuring a difference between each image in the 4D tilt series of images at a nanoscale level.

* * * * *

UNITED STATES PATENT AND TRADEMARK OFFICE
CERTIFICATE OF CORRECTION

PATENT NO. : 8,686,359 B2  
APPLICATION NO. : 13/864113  
DATED : April 1, 2014  
INVENTOR(S) : Ahmed H. Zewail It is certified that error appears in the above-identified patent and that said Letters Patent is hereby corrected as shown below:

In the Specification

Column 1, beginning at Line 28 cancel the text beginning with "The U.S. Government has certain rights" to and ending "by the National Science Foundation" in Column 1, Line 32, and insert the following:

--This invention was made with government support under Grant No. GM081520 awarded by the National Institutes of Health, under Grant No. FA9550-07-1-0484 awarded by the Air Force, and under Grant No. CHE0549936 and Grant No. DMR0504854 awarded by the National Science Foundation. The government has certain rights in the invention.--

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*